United States Patent [19]

Alexander et al.

[11] Patent Number: 5,586,248
[45] Date of Patent: Dec. 17, 1996

[54] DISK DRIVE CONTROLLER WITH A POSTED WRITE CACHE MEMORY

[75] Inventors: Dennis J. Alexander; Ryan A. Callison, both of Spring; Ralph S. Perry, Houston, all of Tex.

[73] Assignee: Compaq Computer Corporation, Houston, Tex.

[21] Appl. No.: 402,731

[22] Filed: Mar. 13, 1995

Related U.S. Application Data

[63] Continuation of Ser. No. 894,734, Jun. 5, 1992, abandoned.

[51] Int. Cl.$^6$ .................................................... G06F 11/00
[52] U.S. Cl. ................................. 395/182.2; 395/182.07
[58] Field of Search ............................. 395/575, 182.20, 395/182.21, 182.22, 185.03, 182.04, 182.05, 185.07, 750, 182.2, 182.07, 185.01, 441; 371/10.1, 10.2, 14

[56] References Cited

U.S. PATENT DOCUMENTS

| | | | |
|---|---|---|---|
| 4,604,699 | 8/1986 | Borcherdt et al. | 395/750 |
| 4,697,266 | 9/1987 | Finley | 371/12 |
| 4,775,978 | 10/1988 | Hartness | 371/38 |
| 4,993,030 | 2/1991 | Krakauer et al. | 371/40.1 |
| 5,014,237 | 5/1991 | Masters et al. | 364/900 |
| 5,088,081 | 2/1992 | Farr | 369/54 |
| 5,109,505 | 4/1992 | Kihara | 395/575 |
| 5,124,987 | 6/1992 | Milligan et al. | 371/10.1 |
| 5,155,845 | 10/1992 | Beal et al. | 395/575 |
| 5,195,100 | 3/1993 | Katz et al. | 371/66 |
| 5,206,943 | 4/1993 | Callison et al. | 395/425 |
| 5,223,748 | 6/1993 | Mumper | 307/69 |
| 5,276,889 | 1/1994 | Shiraishi et al. | 395/750 |
| 5,283,792 | 2/1994 | Daviis, Jr, et al. | 371/66 |
| 5,283,879 | 2/1994 | Carteau et al. | 395/425 |

FOREIGN PATENT DOCUMENTS

| | | |
|---|---|---|
| 0294287A2 | 12/1988 | European Pat. Off. . |
| 63269244 | 2/1989 | Japan . |
| 91/16711 | 10/1991 | WIPO . |

OTHER PUBLICATIONS

Self–Correcting Duplex Memory, C. V. McNeil, IBM Technical Disclosure Bulletin, vol. 6, No. 7 Dec. 1963, pp. 90–91.

Method For Scheduling Writes In A Duplexed DASD Subsystem, IBM Technical Disclosure Bulletin, vol. 29, No. 5, Oct. 1986, pp. 2102–2107.

Using Dual Actuator Shared Data Direct Access Storage Devices Drives In A Redundant Array, IBM Technical Disclosure Bulletin, vol. 33, No. 8, Jan. 1991, pp. 270–272.

Ciprico, Inc., Rimfire 6600 Parallel Disk Array Controller Data Sheets, Sep. 8, 1989.

Patterson, D. A., Gibson, G., Katz, R. H. "A Case For Redundant Arrays Of Inexpensive Disks (RAID)," Dec, 1987, pp. 1–24.

Storage Computer Corp., "RAID Aid: A Taxonomic Extension Of The Berkeley Disk Array Schema," Submitted At Data Storage Interface And Technology Conference IX, Disk Array Workshop, Technology Forums, Ltd., Sep. 1991 pp. 1–18.

Meador, W. E., Disk Array Systems, IEEE 1989, pp. 143–146.

Ng, S., Some Design Issues Of Disk Arrays, 1989 pp. 137–142.

Primary Examiner—Robert W. Beausoliel, Jr.
Assistant Examiner—Joseph E. Palys
Attorney, Agent, or Firm—Pravel, Hewitt, Kimball & Krieger

[57] ABSTRACT

A disk array controller includes a local microprocessor, a bus master interface, a compatible interface, buffer memory and a disk interface. The controller includes a DMA controller between the microprocessor, the bus master interface, the compatibility interface and the buffer memory. DMA controllers are also provided between the disk interface and the buffer memory. One of these DMA channels includes an XOR engine used to develop parity information used with the disk array. The various DMA controllers are cycled to allow access to the buffer memory and the disk interface. A posted write memory system is connected as a selectable disk drive to the disk interface. The posted write memory system includes mirrored, parity checked and battery backed semiconductor memory to allow posted write data to be retained during power down conditions with only a very small change of data loss.

7 Claims, 45 Drawing Sheets

```
                    ┌─ 72
                    │
            ┌───────┴──────────┐
            │       DCYC       │
UDI<15..0>  │ UDI<15..0>   CS<2..0>  │ CS<2..0>
LDDINT*   ──┤ LDDINT         DIOR  ├── DIOR*
LDDCTR*   ──┤ LDDCTR         DIOW  ├── DIOW*
LDDACTR*  ──┤ LDDACTR        ENCS  ├── ENCS*
LDMASK*   ──┤ LDMASK        DD0ACK ├── DD0ACK
D0REQ     ──┤ D0REQ         DD1ACK ├── DD1ACK
D1REQ     ──┤ D1REQ         DD2ACK ├── DD2ACK
D2REQ     ──┤ D2REQ         DD3ACK ├── DD3ACK
D3REQ     ──┤ D3REQ         UDDACK ├── UDDACK
UREQ      ──┤ UREQ          UDHIGH ├── UDHIGH
RST4      ──┤ RST              DEN ├── DEN*
CLK       ──┤ CLK            UDDIR ├── UDDIR*
DBUSY     ──┤ DBUSY          UDDIR ├── UDDIR
DRINT<7..0>─┤ DRINT<7..0>    D3DIR ├── D3DIR
            │                D2DIR ├── D2DIR
            │                D1DIR ├── D1DIR
            │                D0DIR ├── D0DIR
UTD<15..0> ─┤ UTD<15..0>  DINT<3..0>├── DINT<3..0>
RTD0<15..0>─┤ RTD0<15..0> DMASK<3..0>├── DMASK<3..0>
RTD1<15..0>─┤ RTD1<15..0> DD0<15..0>├── DD0<15..0>
RTD2<15..0>─┤ RTD2<15..0>  DRA<3..0>├── DRA<3..0>
RTD3<15..0>─┤ RTD3<15..0>    CHCLK ├── CHCLK
            │             UDEV<2..0>├── UDEV<2..0>
            │             D3DEV<2..0>├── D3DEV<2..0>
            │             D2DEV<2..0>├── D2DEV<2..0>
            │             D1DEV<2..0>├── D1DEV<2..0>
            │             D0DEV<2..0>├── D0DEV<2..0>
            │               DIE<7..0>├── DIE<7..0>
            │              DREG<2..0>├── DREG<2..0>
            │                DRLPINT ├── DRLPINT
            │                  UDINC ├── UDINC
            │                 SETCRY ├── SETCRY
            │              DDGNT<3..0>├── DDGNT<3..0>
            │                   UDGNT├── UDGNT
            └──────────────────┘
```

FIG. 5B

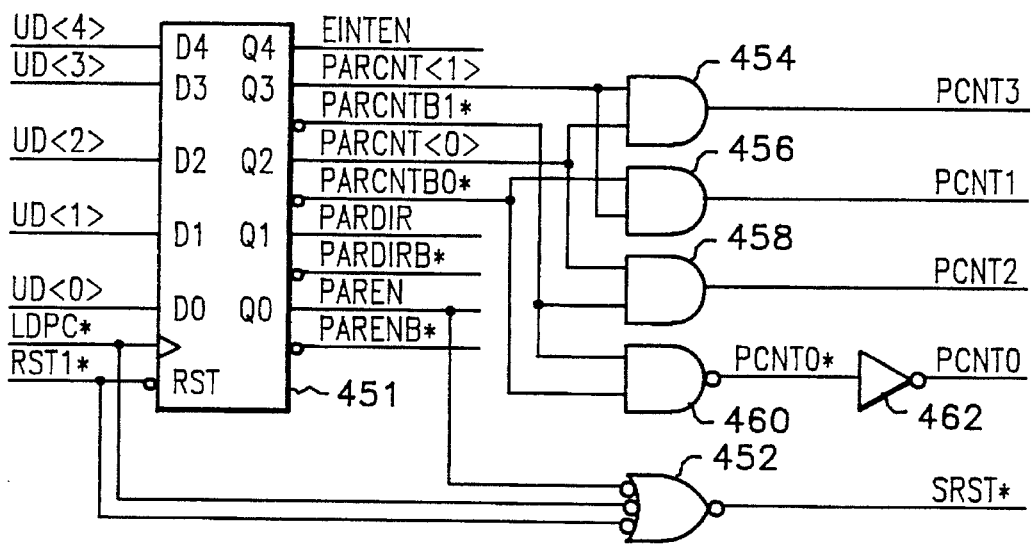
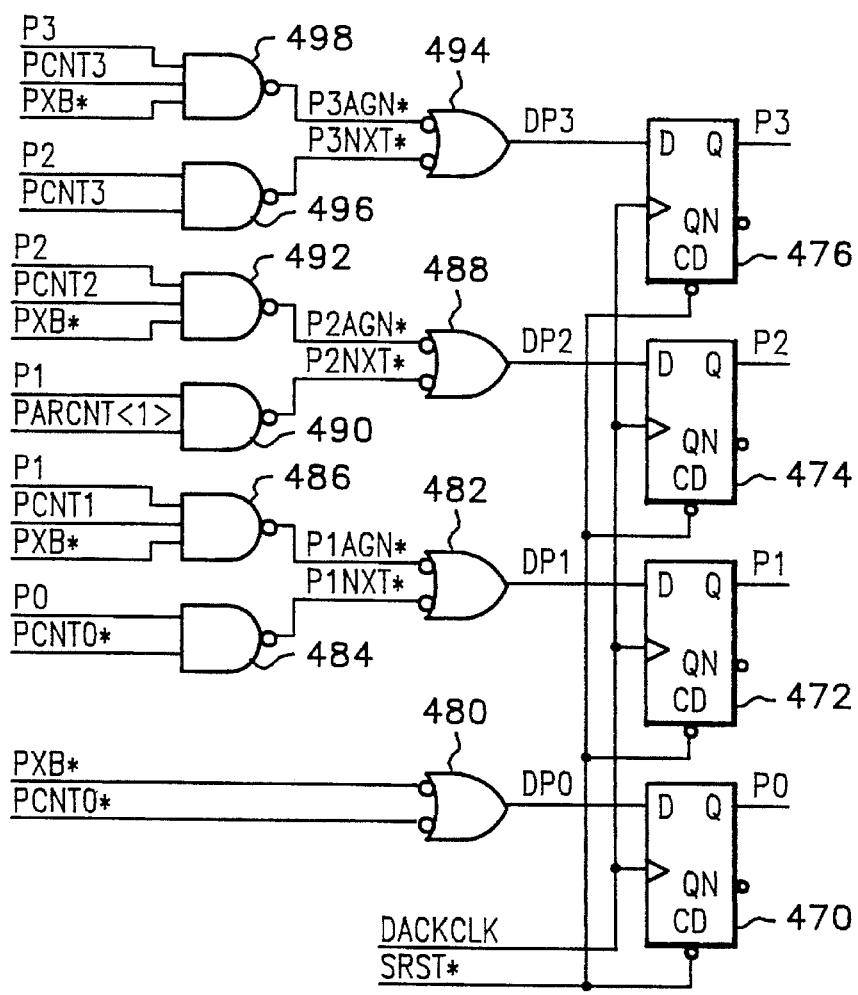
FIG. 15A

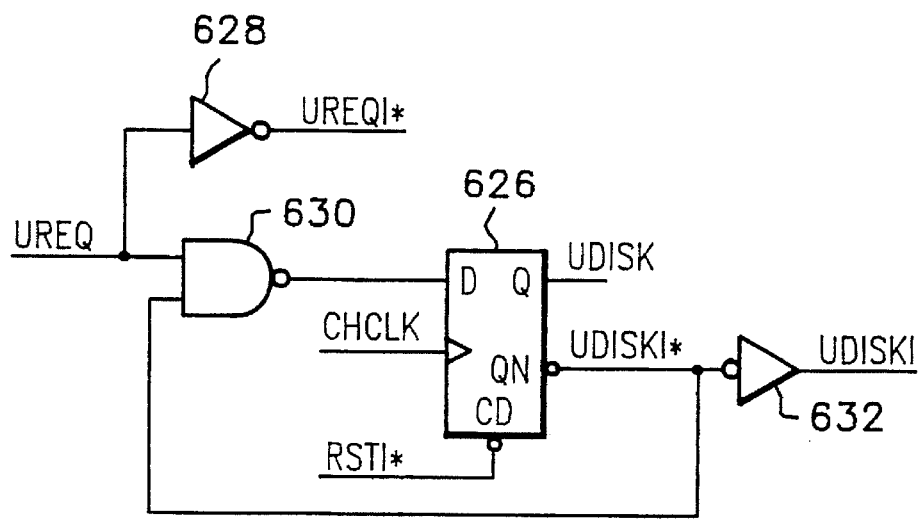
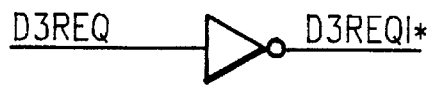
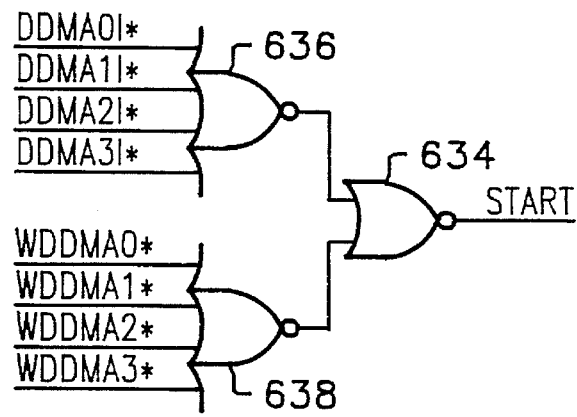
FIG. 17B

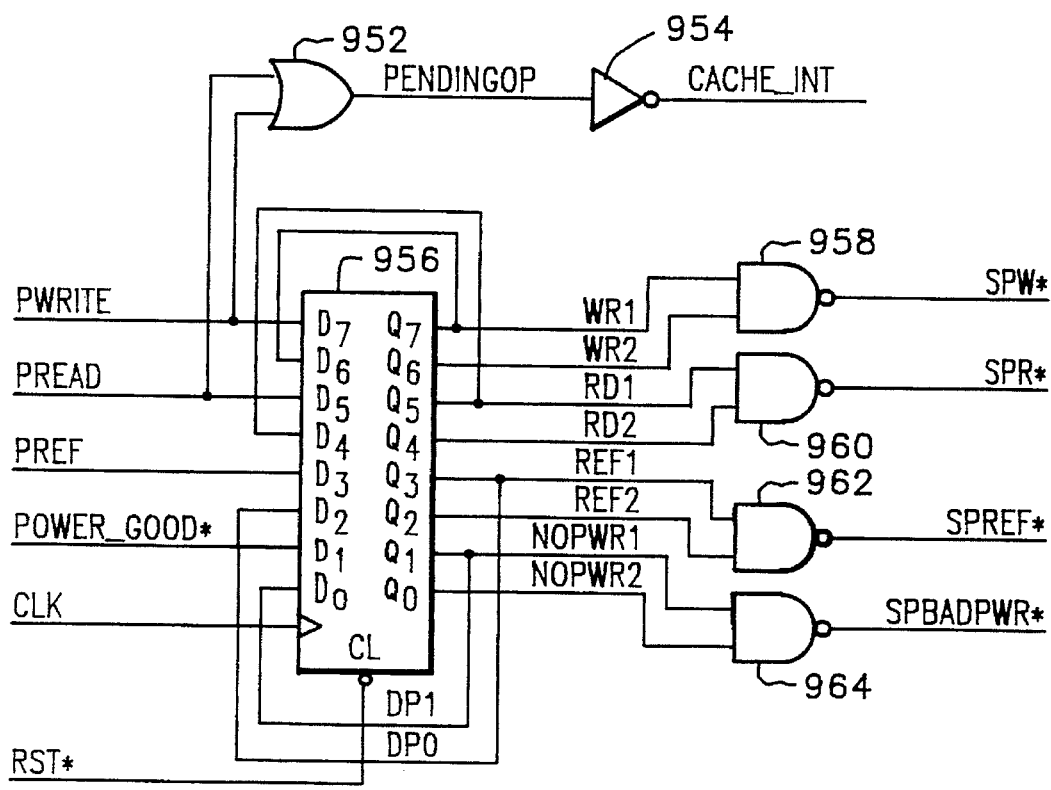
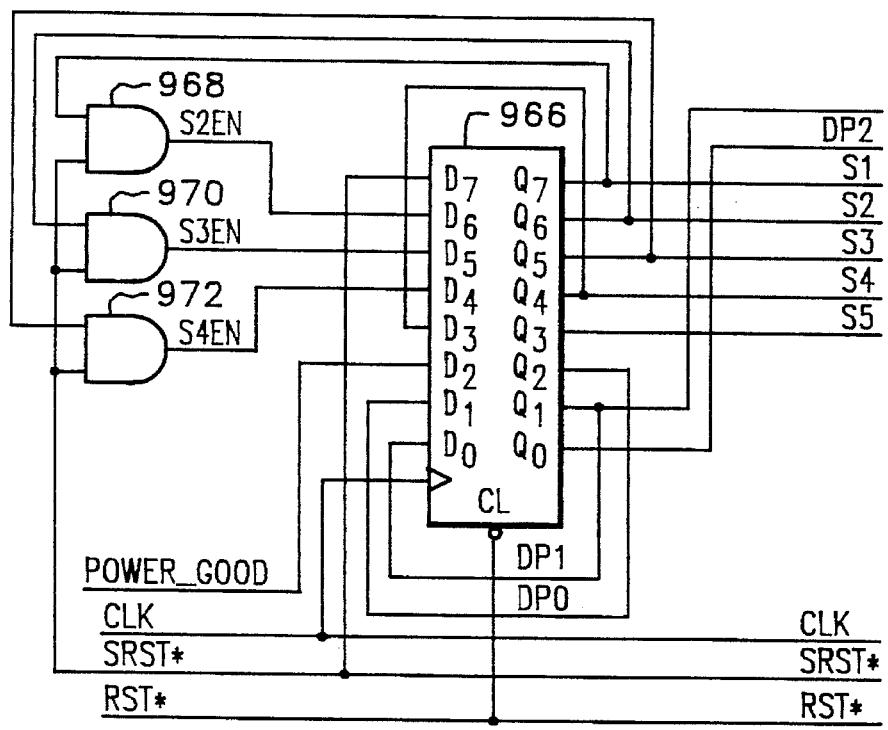
FIG. 27A

DATA RECOVERY PROCESS

DISK DRIVE CONTROLLER WITH A POSTED WRITE CACHE MEMORY

This is a continuation of application Ser. No. 07/894,734 filed on Jun. 5, 1992, now abandoned.

BACKGROUND OF THE INVENTION

1. Field of the Invention

The present invention relates to controllers used with hard disk drive systems used with computers, and more particularly to posted write operations of the controller.

2. Description of the Related Art

Personal computers have been getting ever faster and more powerful at a rapid rate. Significant portions of this advance are due to the increased speeds and data widths of the microprocessors currently available. Microprocessors have gone from 8 bit data widths and operating frequencies of 1 MHz to 32 bit data widths and basic clock rates of 33 MHz. Memory techniques have been developed to, in the greatest part, allow memory system speeds to keep up with the speed of the microprocessor. However, the same speed increases are not true for the various input/output and mass storage systems. The various peripheral devices are often now seen as limitations to the actual speed of a given computer system. If for instance, the personal computer is utilized primarily for word processing applications, then higher disk performance is more important then processor speed in most cases and relative increase in the disk subsystem performance will be much more directly perceived then a given increase in the microprocessor capabilities.

In the past few years, a new type of mass data storage subsystem has emerged for improving the data transfer performance. This subsystem is generally known as a disk array subsystem. One reason for wanting to build a disk array subsystem is to create a logical device that has a very high data transfer rate. This may be accomplished by ganging multiple standard disk drives together and transferring data to or from these drives to the system memory. If n drives are ganged together, then the effective data transferred rate is increased in an amount slightly less than n times. This technique, called "striping," originated in the supercomputing environment where a transfer of large amounts of data to and from secondary storage is a frequent requirement. With this approach, the n physical drives become a single logical devices and may be implemented either through software or hardware.

A number of reference articles on the design of disk arrays have been published in recent years. These include "Some Design Issues of Disk Arrays" by Spencer Ng April, 1989 IEEE; "Disk Array Systems" by Wes E. Meador, April, 1989 IEEE; and "A Case for Redundant Arrays of Inexpensive Disks (RAD)" by D. Patterson, G. Gibson and R. Catts, Report No. UCB/CSD 87/391, December, 1987, Computer Science Division, University of California, Berkeley, Calif.

In general these previous techniques have used several controller boards which could access multiple drives over a small computer system interface (SCSI). Multiple SCSI controller boards were used, with multiple drives connected to each controller board. Software resident in the host computer itself performed the operation of data distribution and control of the various controller boards and of the specific drives on a given controller board. The host computer was also required to do various parity operations required as preferred in the techniques to reduce the amount of space related to error correction versus actual data storage. Thus, while high disk transfer rates could be developed, the host computer was still tied up performing various control functions.

Recent personal computers have developed bus architectures which are capable of sustaining devices which are called "bus masters." A bus master may take control of the computer system at certain times and transfer data between the bus master and the system memory without requiring the service of the main or host processor. The bus master can then release the bus back to the host processor when the transfers are not necessary. In this manner coprocessing tasks can be developed. Especially suitable for such coprocessing tasks are graphical displays, network interfacing and hard disk subsystem control. The various buses or architectures are exemplified by the Micro Channel Architecture (MCA) developed by International Business Machines Corporation (IBM) or the Extended Industry Standard Architecture (EISA). A copy of the EISA specification, provided as Appendix 1 to U.S. Pat. No. 5,101,492, which is hereby incorporated by reference, explains the requirements of an EISA system. Thus it became obvious to place a local processor on a separate board which could be inserted into these busses for disk coprocessing functions. However, it then became critical, particularly when combined with the disk arrays, to allow optimal data transfer capabilities without otherwise slowing down the various devices and capabilities.

To this end Compaq Computer Corporation developed a disk array controller with improved parity development. The disk array controller was incorporated in a product referred to as the Intelligent Drive Array or IDA, which was sold in or about December, 1989 and thereafter. The system operated as a bus master in a personal computer. To this end there was a local processor to handle and control operations in the disk array controller. The local processor interfaced with a bus master controller and with a data transfer controller. The data transfer controller also interfaced with the bus master controller. The bus master controller was used to provide disk subsystem access to the host computer system for transferring disk commands and data.

A second avenue of obtaining and returning data and commands to the host system was through a compatibility controller. The compatibility controller was also linked to the transfer controller. Additionally, up to 8 individual hard disk drives, which have integrated device controllers, were linked to the transfer controller. Finally, an amount of transfer buffer memory was coupled to the transfer controller.

The transfer controller operated as a direct memory access (DMA) controller having four main channels. The main channels were connected to the bus master controller the local processor, the compatibility controller and a disk interface controller. The disk channel was broken down into four subchannels. One of the disk subchannels included an XOR subsystem to allow efficient development of the parity information preferably used for data protection. The data which was transferred between the host system and the disk array was contained in the buffer RAM and was shuttled to and from the buffer RAM by the transfer controller under control of the local processor and the bus master controller. By properly organizing the transfers parity data could be rapidly obtained.

Eventually the need for even higher throughputs then that provided by the IDA was needed as applications grew larger and local area networks (LANs) became larger, the IDA being primarily used in a file server on the LAN.

One technique for improving system performance was the use of disk caching programs. An amount of main memory was utilized as a cache for disk data. Because the main memory was significantly faster than the disk drive, if the desired data was present in the cache, greatly improved performance resulted. In fact, this is a major feature used on the file server when running network operating systems. While disk caching can be readily applied to read operations, it is significantly more difficult to utilize with write operations. A technique known as write posting saves the write data in a cache and returns an operation complete indicator before the data is written to the disks. Then, during a less active time the data is actually written to the disk. However, this technique has one major danger, namely the loss of data which the user believes has been written to the disk drive. If the data was in the posted write cache and power was lost, the data was not actually written, even though the user had been informed of a completion. This data loss may not be noticed for a long period and may cause numerous undetected errors.

Therefore this technique, while providing major benefits, is generally considered unacceptable for many uses, such as on the file servers in LANs, where the data loss could be critical. Therefore the technique is not generally used and potential performance increases are lost in an area where even incremental increases were desirable.

SUMMARY OF THE PRESENT INVENTION

The present invention provides secure write posting capability to a disk controller to allow the write posting performance increase to be used in critical situations such as file servers. A cache of mirrored, parity-checked, battery-backed semiconductor memory is provided to serve as a write posting cache. Write data is provided to the cache and a complete indication is returned. Should the power be lost, the battery-backup feature retains the data in the memory for a certain period. The parity checking allows determination of errors prior to actual storage of the data on the disk drive. When an error is obtained, the mirroring feature allows access to an exact copy of the data so that valid data is still available for storage by the disk drive. The combination of battery backup, mirroring and parity checking provides a cache having sufficient data security to allow use in even very critical environments.

In the preferred embodiment the posted write cache is utilized on a development of the controller in the IDA. The cache includes an interface which allows it to emulate a conventional integrated drive electronics (IDE) disk drive. This allows a simple connection to the drive channel support of the IDA. The controller software then has control of data transfer with the posted write cache by its normal, high speed operations.

BRIEF DESCRIPTION OF THE FIGURES

A better understanding of the present invention can be obtained when the following detailed description of the preferred embodiment is considered with the following drawings, in which.

DETAILED DESCRIPTION OF THE PREFERRED EMBODIMENT

Figure 1:
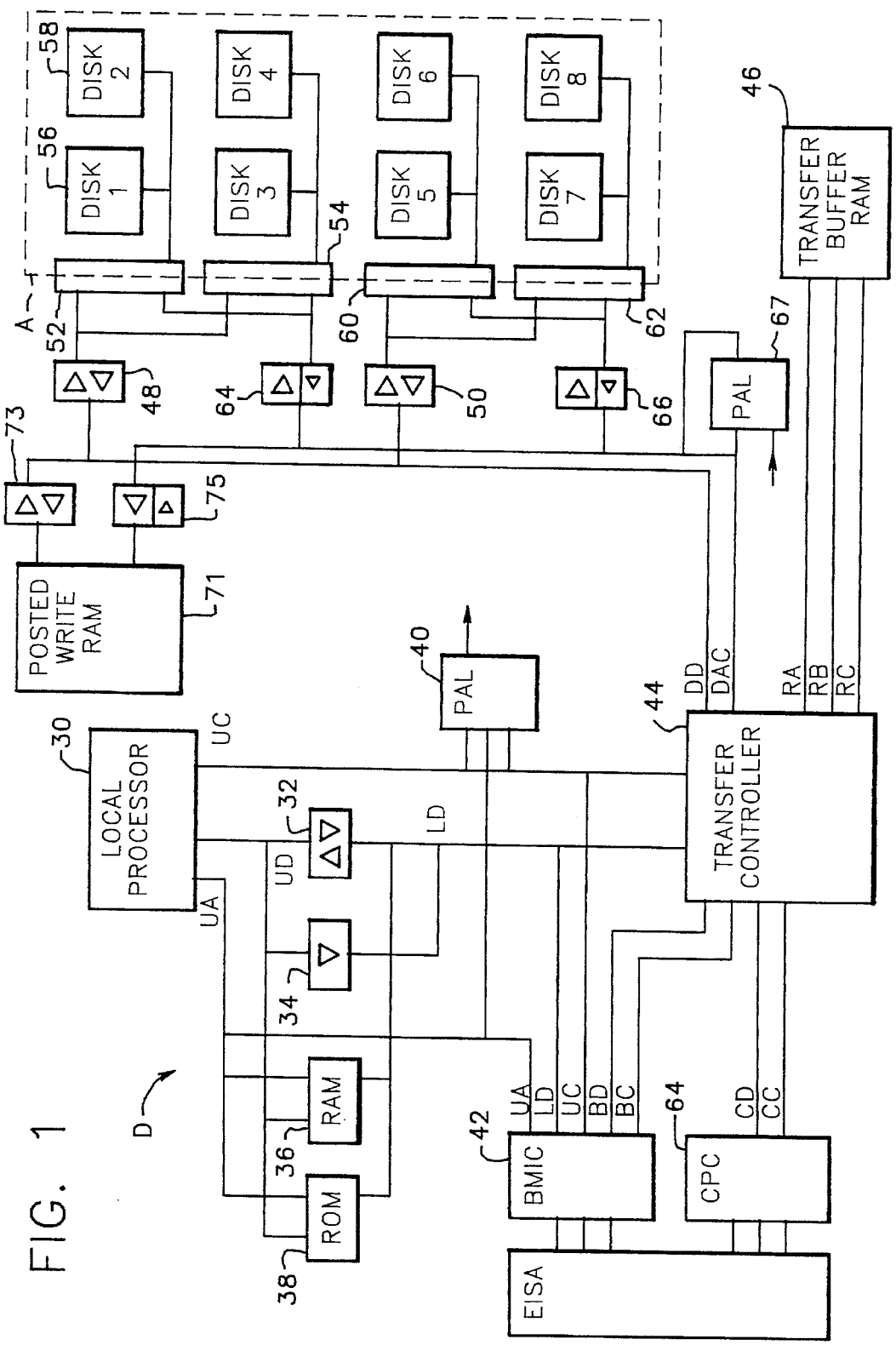
FIG. 1 is block diagram of a disk array controller incorporating the present invention.

Referring now to FIG. 1, the letter D general represents a disk array controller incorporating the present invention. The disk array controller D has a local processor 30, preferably a V53 manufactured by NEC. The local processor 30 has address bus UD, data bus UD and control bus UC outputs. The data bus UD is connected to a transceiver 32 whose output is the local data bus LD. The address bus UA is connected to the inputs of a buffer 34 whose outputs are connected to the local data bus LD. The local processor 30 has associated with it random access memory (RAM) 36 coupled via the data bus UD and the address bus UA. The RAM 36 is connected to the processor control bus UC to develop proper timing signals. Similarly, read only memory (ROM) 38 is connected to the data bus UD, the processor address bus UA and the processor control bus UC. Thus the local processor 30 has its own resident memory to control its operation and for its data storage. A programmable array logic (PAL) device 40 is connected to the local processor control bus UC and to the processor address bus UA to develop additional control signals utilized in the disk array controller D.

The local processor address bus UA, the local data bus LD and the local processor control bus UC are also connected to a bus master integrated controller (BMIC) 42. The BMIC 42 serves the function of interfacing the disk array controller D with a standard bus, such as the EISA or MCA bus and acting as a bus master. In the preferred embodiment the BMIC 42 is interfaced with the EISA bus and is the 82355 provided by Intel. Thus by this connection with the local processor address bus UA, the local data bus LD and the control bus UC the BMIC 42 can interface with the local processor 30 to allow data and control information to be passed between the host system and the local processor 30.

Additionally, the local data bus LD and local processor control bus UC are connected to a transfer controller 44. The transfer controller 44 will be explained in more detail, but is generally a specialized, multichannel direct memory access (DMA) controller used to transfer data between the transfer buffer RAM 46 and the various other devices present in the disk array controller D. For example, the transfer controller 44 is connected to the BMIC 42 by the BMIC data lines BD and the BMIC control lines BC. Thus over this interface the transfer controller 44 can transfer data from the transfer buffer RAM 46 through the transfer controller 44 to the BMIC 42 if a read operation is requested. If a write operation is requested data can be transferred from the BMIC 42 through the transfer controller 44 to the transfer buffer RAM 46. The transfer controller 44 can then pass this information from the transfer buffer RAM 46 to disk array A.

The transfer controller 44 includes a disk data bus DD and a disk address and control bus DAC. The disk data bus DD is connected to transceivers 48 and 50. The disk address and control bus DAC is connected to two buffers 64 and 66 which are used for control signals between the transfer controller 44 and the disk array A. The outputs of the transceiver 48 and the buffer 64 are connected to two disk drive port connectors 52 and 54. These port connectors 52 and 54 are preferably developed according to the integrated device interface utilized for hard disk units a copy of which is attached as Appendix A. Two hard disks 56 and 58 can be connected to each connector 52 or 54. In a similar fashion, two connectors 60 and 62 are connected to the outputs of the transceiver 50 and the buffer 66. Thus in the preferred embodiment 8 disk drives can be connected or coupled to the transfer controller 44. In this way the various data, address and control signal can pass between the transfer controller 44 and the particular disk drives 56 and 58, for example.

Figure 23:
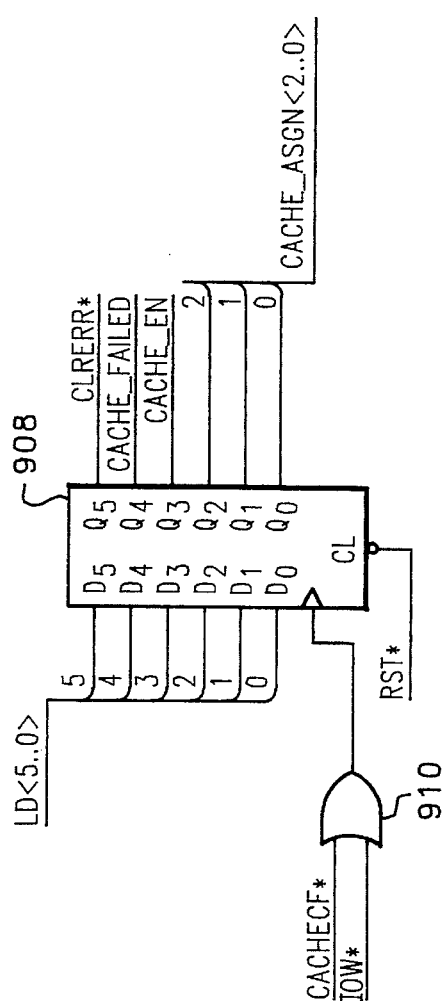
FIGS. 22–24 are schematic illustrations of diagrams of portions of the interface to the posted write memory of FIG. 1.

A programmable array logic (PAL) device block 67 is connected to the disk address and control bus DAC and receives inputs from a control latch 908 (FIG. 23). The PAL block 67 is used to map in a posted write cache memory 71 as a disk drive as indicated by the control latch 908 and map out the actual disk drive. A transceiver 73 and a buffer 75 are connected to the disk data bus DD and the disk address and control bus DAC, respectively, to allow data and control information to be passed with the transfer controller 44.

In the preferred embodiment a compatibility port controller 64 is also connected to the EISA bus. The compatibility port controller 64 is connected to the transfer controller 44 over the compatibility data lines CD and the compatibility control lines CC. The compatibility port controller 64 is provided so that software which was written for previous computer systems which do not have a disk array controller D and its BMIC 42, which is addressed over a EISA specific space and allows very high throughputs, can operate without requiring rewriting of the software. Thus the compatibility port controller 64 emulates the various control ports previously utilized in interfacing with hard disks.

Figure 2:
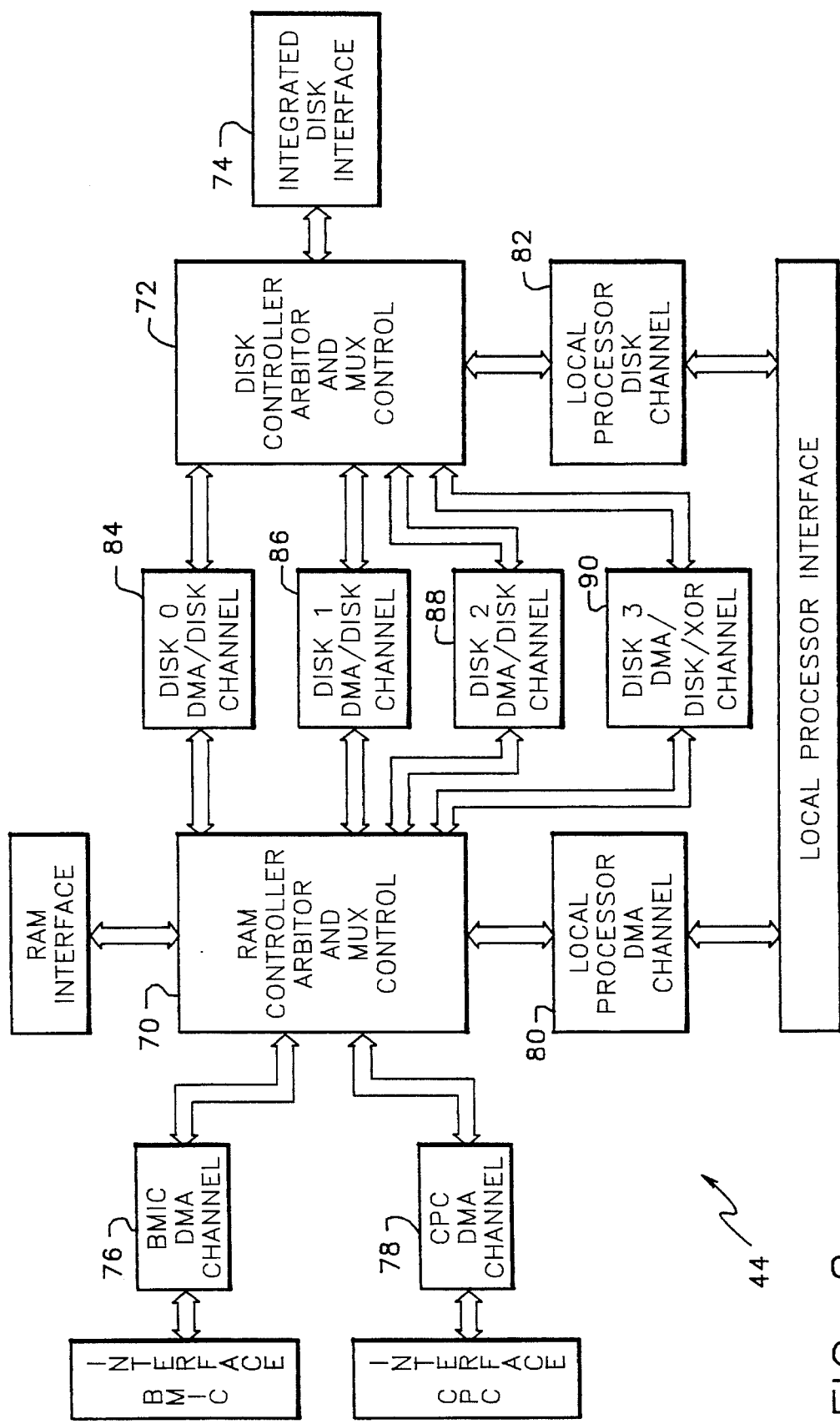
FIG. 2 is a block diagram of the transfer controller of FIG. 1.

The transfer controller 44 is itself comprised of a series of separate circuitry blocks as shown in FIG. 2. There are two main units in the transfer controller 44 and these are the RAM controller 70 and the disk controller 72. The RAM controller 70 has an arbiter to control which of the various interface devices have access to the RAM 46 and a multiplexer so that data can be passed to and from the buffer RAM 46. Likewise, the disk controller 72 includes an arbiter to determine which of the various devices has access to the integrated disk interface 74 and includes multiplexing capability to allow data to be properly transferred back and forth through the integrated disk interface 74.

There are basically seven DMA channels present in the transfer controller 44. One DMA channel 76 is assigned to cooperate with the BMIC 42. A second DMA channel 78 is designed to cooperate with the compatibility port controller 64. These two devices, the BMIC 42 and the compatibility port controller 64, are coupled only to the RAM 46 through their appropriate DMA channels 76 and 78 and the RAM controller 70. The BMIC 42 and the compatibility port controller 64 do not have direct access to the integrated disk interface 74 and the disk array A. The local processor 30 is connected to the RAM controller 70 through a local processor RAM channel 80 and connected to the disk controller 72 through a local processor disk channel 82. Thus the local processor 30 connects as both the buffer RAM 46 and the disk array A as desired.

Additionally, there are four DMA disk channels 84, 86, 88 and 90. These four channels 84–90 allow information to be independently and simultaneously passed between the disk array A and the RAM 46. It is noted that the fourth DMA/disk channel 90 also includes XOR capability so that parity operations can be readily performed in the transfer controller 44 without requiring computations by the local processor 30.

Figure 3:
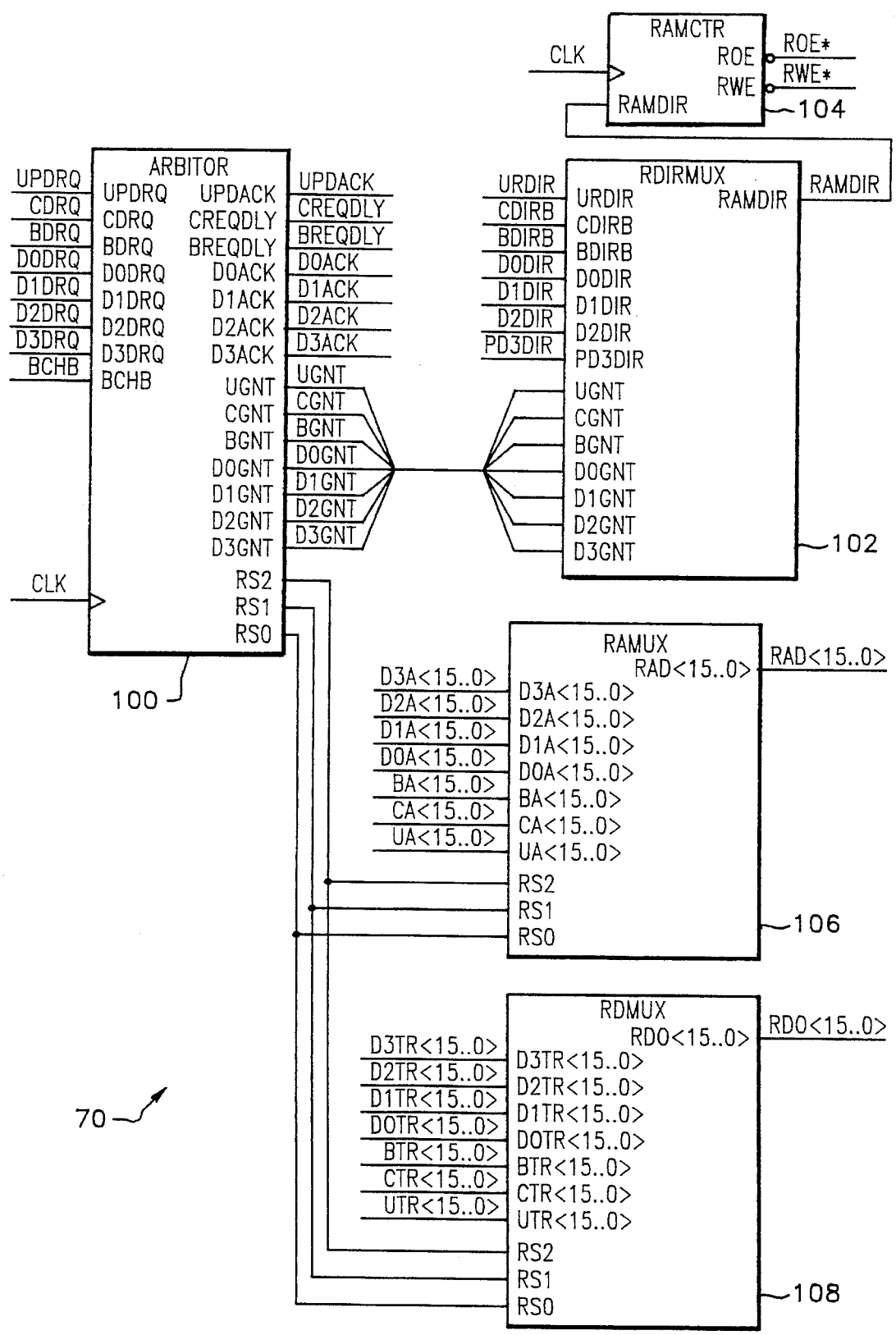
FIGS. 3, 4 and 5 are more detailed block diagrams of portions of the transfer controller of FIG. 1.

FIG. 3 is a block diagram of the RAM controller 70 showing the various blocks in the RAM controller 70 and the signals related to each of the blocks. An arbiter 100 receives inputs relating to the various DMA channels which can request data from the transfer buffer memory 46. With this information, as well as basic clocking signal CLK, the arbiter 100 produces acknowledged signals to the various DMA channels to indicate that they are active and can access the buffer RAM 46. The arbiter 100 also produces grant signals which are connected to a RAM direction multiplexer 102, which has an output connected to a RAM control block 104. The RAM direction multiplexer 102 receives inputs which indicate the direction of data transfer for each appropriate DMA channel. Preferably the direction bits is high or 1 for a write to the transfer buffer RAM 46 and low or 0 for a read. Thus based on the active devices as indicated by the arbiter 100, the RAM direction multiplexer 102 provides the RAMDIR signal to the RAM controller 104. With this signal and the CLK signal the RAM controller 104 produces ROE* and RWE*, respectively the RAM output enable and RAM write enable, signals which are applied to the transfer buffer RAM 46 to allow its proper operation.

Additionally, the arbiter 100 produces an encoded 3 bit multiplexer signal which is supplied to a RAM address multiplexer 106 and a RAM data multiplexer 108. These multiplexers 106 and 108 respectively multiplex the addresses provided by the particular DMA channel to the transfer buffer RAM 46 and the data being supplied from the DMA channel to the transfer buffer RAM 46. Data being read from the transfer buffer RAM 46 to a particular DMA channel is routed in a bus (not shown) within the transfer controller 44, with the particular DMA channel latching the data at the appropriate time. Details of the arbiter 100 and the RAM controller 104 will be provided.

Figure 4:
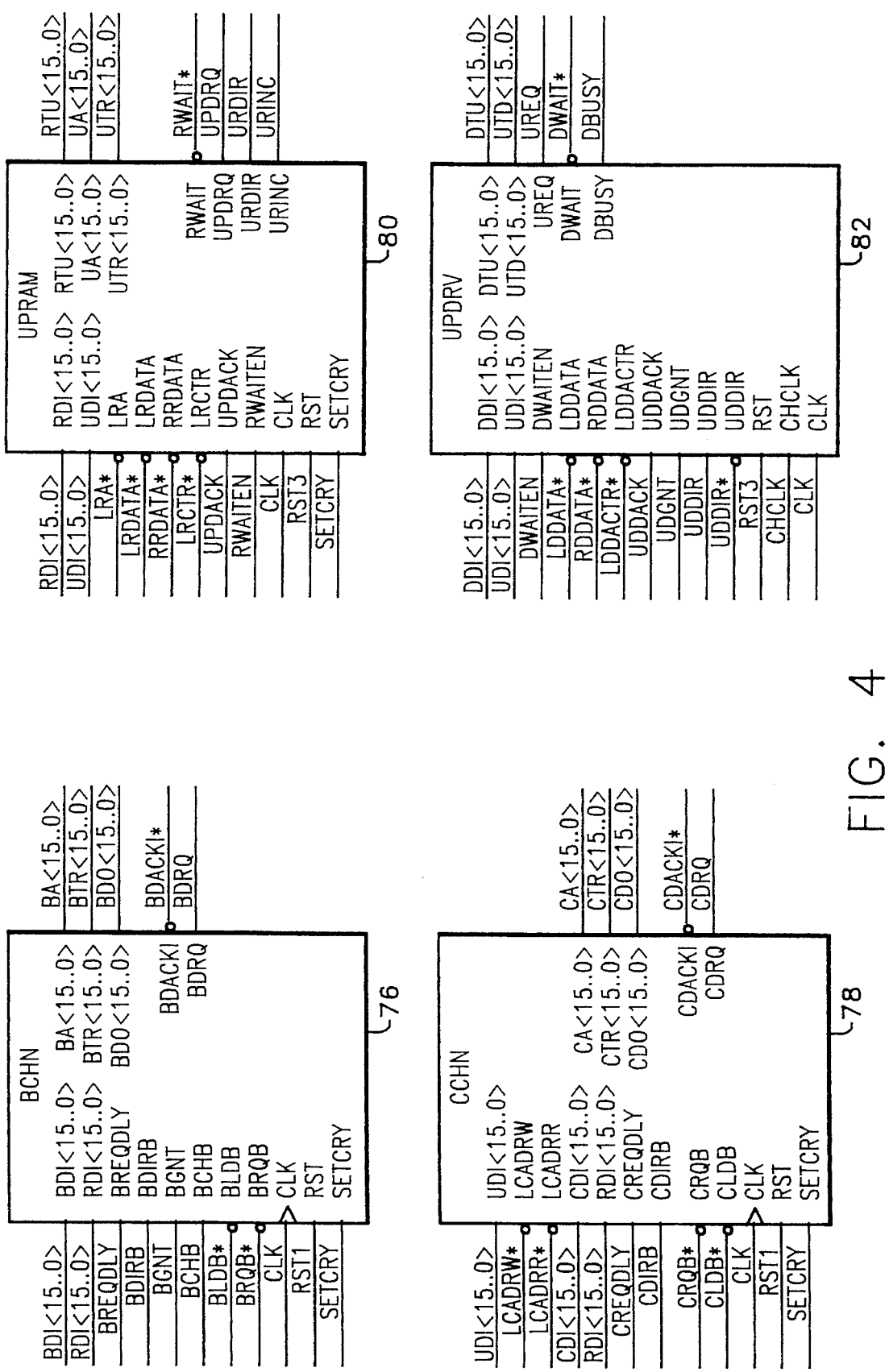
Figure 5A:
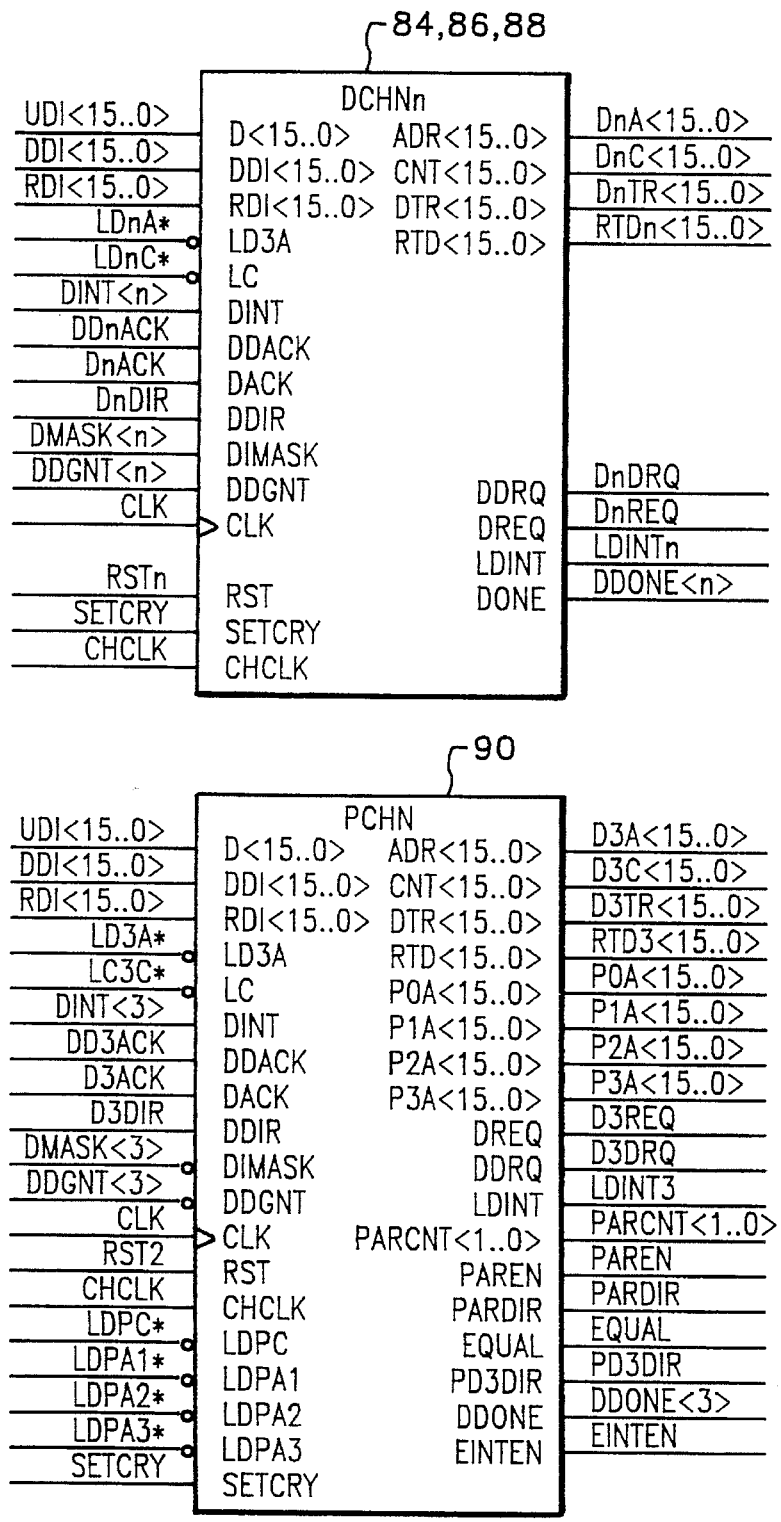

Shown in FIGS. 4 and 5 are more detailed views of the BMIC DMA channel 76, the CPC DMA channel 78, the local processor RAM channel 80, the local processor disk channel 82, the disk DMA channels 84, 86 and 88, the parity or disk 3 DMA channel 90 and the disk controller 72. These blocks indicate the various signals which are provided to and from the particular block and are provided to develop and indicate the interconnection between the various blocks and the appropriate signals. The n is used for the DMA channels 84, 86 and 88 with the value n having the value of 0, 1 or 2 depending upon the particular disk channel desired. These three disk channels 84, 86 and 88 are identical in construction and operation.

Figure 6:
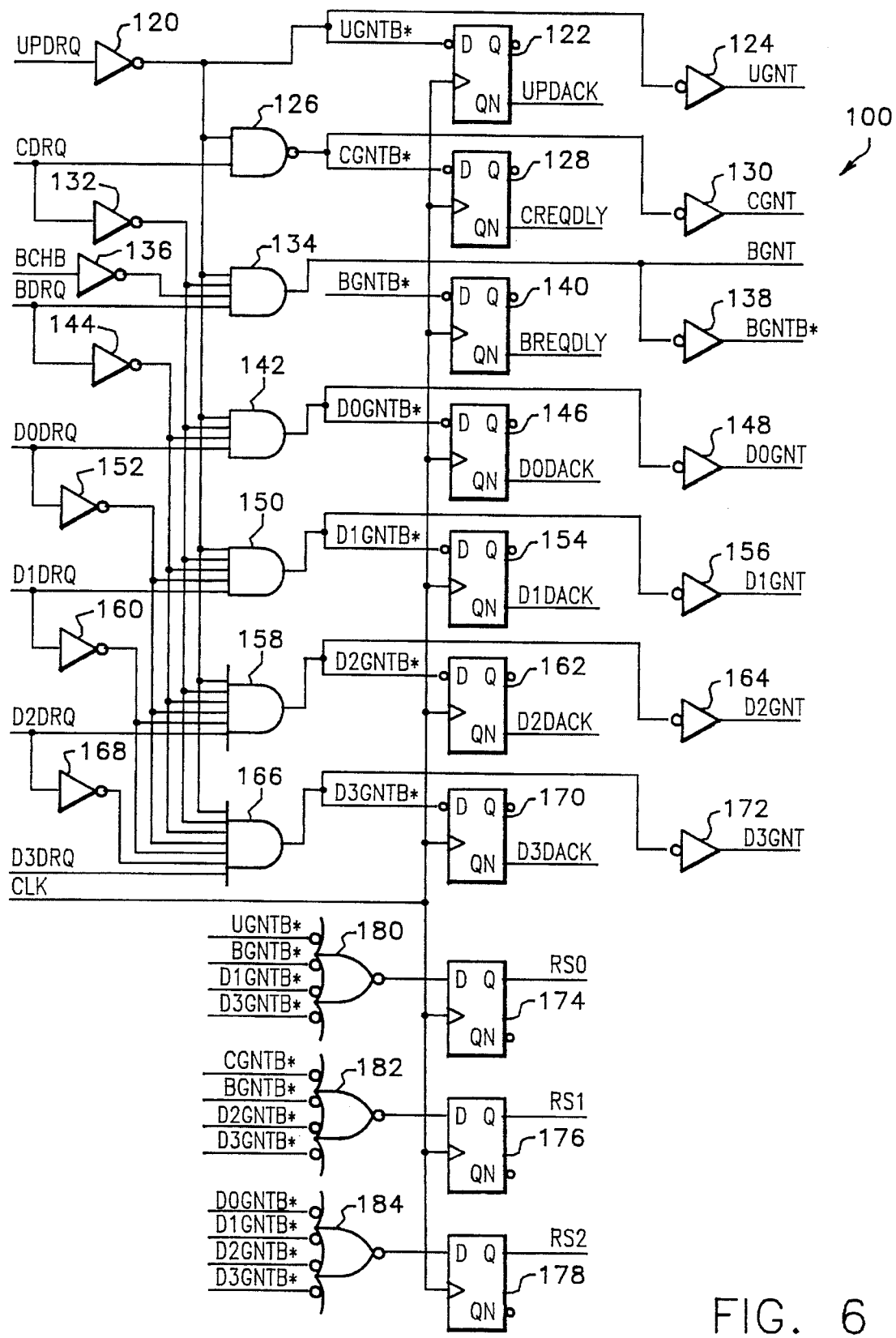
FIGS. 6 and 8–21 are schematic diagrams of portions of the transfer controller of FIG. 1, including XOR circuitry.

The arbiter 100 is shown in more detail in FIG. 6. The local processor 30 has the highest priority in the arbitration scheme. To this end, a signal referred to as UPDRQ or local processor DMA request is provided to the input of an inverter 120. The output of the inverter 120 is referred to as the UGNTB* signal and is provided to the inverting input of a D-type flip-flop 122. The clocking signal for the flip-flop 122 is provided by the CLK signal, which in the preferred embodiment is a 20 MHz signal. The noninverted output of the flip-flop 122 is the UPDACK signal or local processor DMA acknowledge. The UGNTB* signal is also connected to the input of an inverter 124, whose output is the UGNT signal to indicate that the local processor 30 has been granted access.

The compatibility port controller 64 has the second highest priority. The CDRQ signal to indicate its data request is connected to one input of a 2 input NAND gate 126, whose other input is the UGNTB* signal. The output of the NAND gate 126 is the CGNTB* signal, which is provided to the inverted D input of a D-type flip-flop 128 and to the input of an inverter 130. The output of the inverter is the CGNT signal. The noninverted output of the flip-flop 128 is the CREQDLY signal, which indicates that the request has been acknowledged. The flip-flop 128 is clocked by the CLK signal.

The CDRQ signal is also supplied to the input of an inverter 132 whose output is connected to one input of a 4 input AND gate 134. The AND gate 134 is associated with the BMIC 42, which has third priority. One of the inputs to the AND gate 134 is the BDRQ signal to indicate a data request from the BMIC 42. A second input is the output of an inverter 136 whose input receives the BCHB signal, which indicates that the appropriate channel in the BMIC 42 is requesting the data transfer. The fourth input of the AND gate 134 is connected to the output of the inverter 120 so that if the local processor issues a request it can override the request of the BMIC 42. The output of the AND gate 134 is the BGNT signal or BMIC grant signal and is connected to the input of an inverter 138. The output of the inverter 138 is connected to the inverted D input of a D-type flip-flop 140 whose clocking input is connected to the CLK signal. The noninverted output of the flip-flop 140 is the BREQDLY signal which is used to indicate that the BMIC 42 request has been acknowledged.

The DODRQ signal which indicates that the disk 0 DMA channel is requesting a data transfer is connected to one input of a 4 input NAND gate 142. One of the inputs to the NAND gate 142 is connected to the output of inverter 144, whose input is the BDRQ signal. The other two inputs to the NAND gate 142 are the output of the inverters 120 and 132. The output of the NAND gate 142 is the DOGNTB, signal which is provided to the inverted D input of a flip-flop 146 and to the input of an inverter 148. The output of the inverter 148 is DOGNT signal. The clocking signal for the flip-flop 142 is provided by the CLK signal and the noninverted output of the flip-flop 146 produces the DODACK signal.

The D1DRQ signal, indicating a request for data transfer from the disk DMA channel 1 is provided as one input to a 5 input NAND gate 150. One of the inputs to the NAND gate 150 is the output of an inverter 152 whose input is the DODRQ signal. The remaining three inputs to the NAND gate 150 are connected to the outputs of the inverters 120, 132 and 144. The output of the NAND gate 150 is the D1GNTB* signal, which is provided to the inverted D input of a D-type flip-flop 154 and to the input of an inverter 156. The output of the inverter 156 is the D1GNT signal. The clocking signal of the flip-flop 154 is provided by the CLK signal, while the noninverted output produces the D1DACK signal.

The D2DRQ signal, which indicates a DMA request by the third channel of the DMA to disk transfer unit is connected to one input of a 6 input NAND gate 158. One input to a NAND gate 158 is connected to the output of a inverter 160 whose input is the D1DRQ signal. The remaining four inputs to the NAND gate 158 are connected to the output of the inverters 120, 132, 144 and 152. The output of the NAND gate 158 is the D2GNTB, signal which is provided to the inverted D input of a D-type flip-flop 162 and to the input of an inverter 164. The output of the inverter 164 is the D2GNT signal to indicate a grant request to the third channel. The clocking signal for the flip-flop 162 is provided by the CLK signal and the noninverted output produces the D2DACK signal.

The D3DRQ signal which indicates that the final DMA/disk channel is requesting information supplied as one input to a 7 input NAND gate 166. One of the inputs to the NAND gate 166 is provided by the output of an inverter 168 whose input is connected to the D2DRQ signal. The remaining five inputs to the NAND gate 166 are provided by the outputs of the inverters 120, 132, 144, 152 and 160. Thus the fourth channel of the DMA to disk transfer system has the lowest priority. The output of the NAND gate 166 is the D3GNTB* signal which is provided to the inverted D input of a D-type flip-flop 170 and to the input of an inverter 172. The output of the inverter 172 is a D3GNT signal, with clocking signal provided to the flip-flop 170 being the CLK signal. The noninverted output of the flip-flop 170 produces the D3DACK signal.

The arbiter 100 also produces a 3 bit binary code which is supplied to various multiplexers for properly multiplexing RAM write data and transfer buffer RAM addresses. This multiplexer encoding is developed by the outputs of three D-type flip-flops 174, 176 and 178. The D-type input of the flip-flop 174 is connected to the output of a 4 input NAND gate 180 whose four inputs receive the UGNTB* signal, the BGNTB* signal, D1GNTB* signal and the D3GNTB* signal. The D input of the second flip-flop 176 is connected to the output of a 4 input NAND gate 182. The four signals provided to the inputs of the NAND gate 182 are the CGNTB* signal, the BGNTB* signal, the D2GNTB* signal and the D3GNTB* signal. The D input to the third flip-flop 178 is connected to the output of a four input NAND gate 184. The four signals provided to the NAND gate 184 are the DOGNTB* signal, the D1GNTB* signal, the D2GNTB* signal and the D3GNTB* signal. The three flip-flops 174, 176 and 178 are clocked by the CLK signal.

Figure 8:
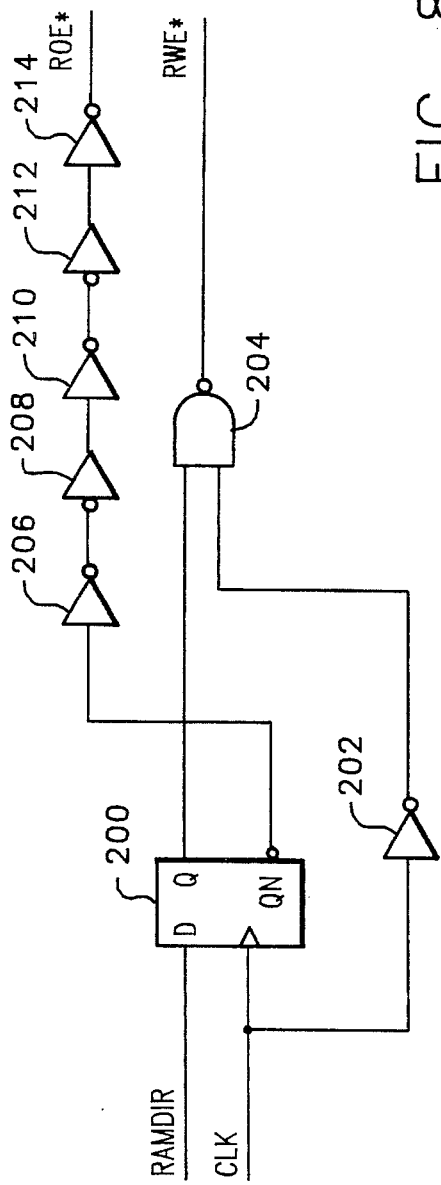

Because the DMA transfers can be both read and write transfers to the transfer buffer memory 46 it is necessary to know which direction the transfer is to go, is it to be a read or is it to be a write. There is a bit in a register associated with each particular DMA channel which indicates the direction of the transfer and the RAM direction multiplexer 102 multiplexes the proper direction bit to form the RAMDIR signal. The RAMDIR signal is provided to the D input of a D-type flip-flop 200 (FIG. 8). The clocking input to the flip-flop 200 is provided by the CLK signal, which is also provided to the input of an inverter 202. The output of the inverter 202 is connected to one input of a 2 input NAND gate 204 whose other input is connected to the noninverted output of the flip-flop 200. The output of the inverter 204 is the RWE* signal, which is supplied to the write enable input of the memory devices forming the transfer buffer RAM 46. The inverted output of the flip-flop 200 is connected to a five series inverters 206, 208, 210, 212 and 214. The output of the final inverter 214 in the string is the ROE* signal which is provided to the output enable inputs of the memory devices forming the transfer buffer RAM 46.

Figure 9A:
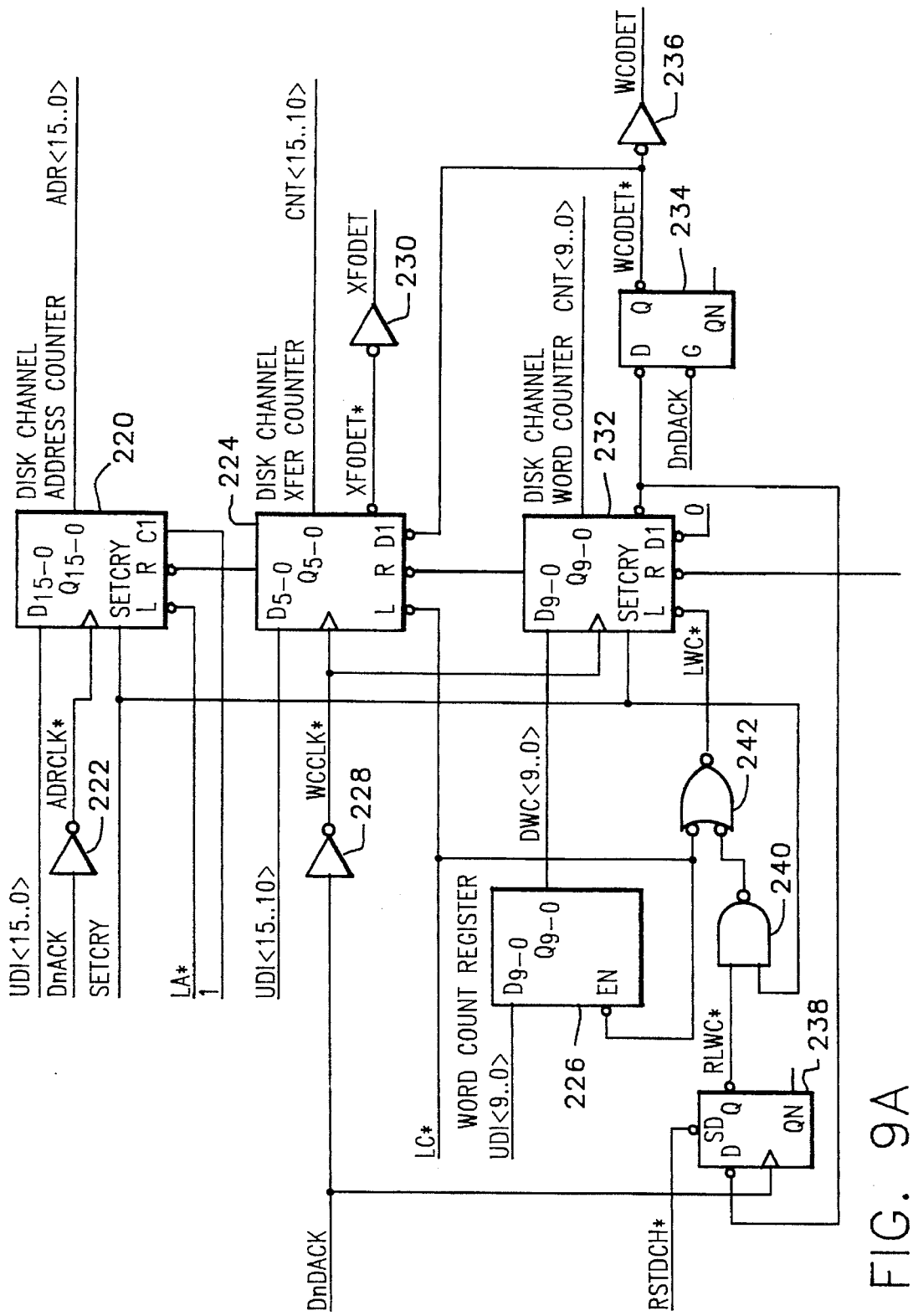
Figure 9B:
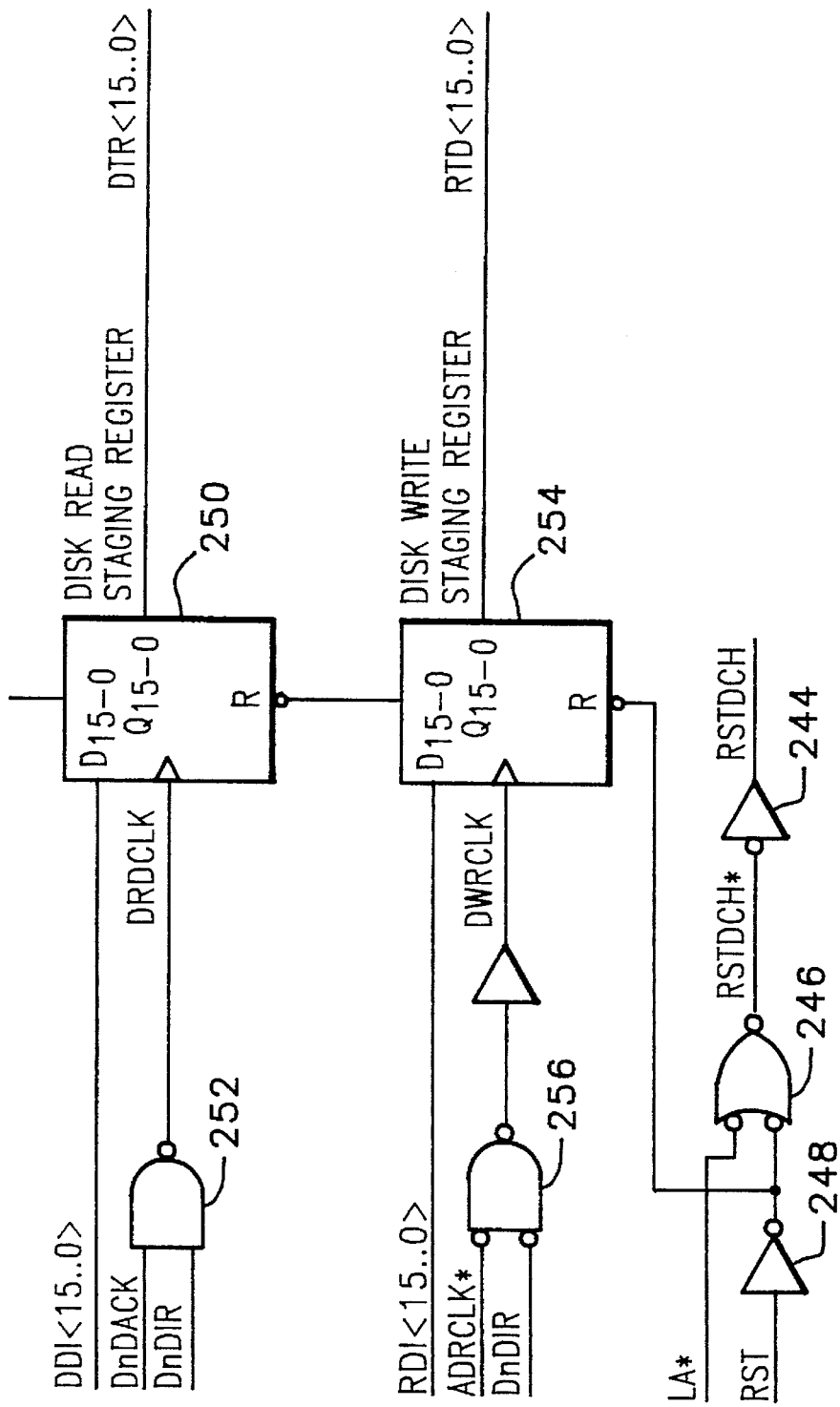
Figure 10A:
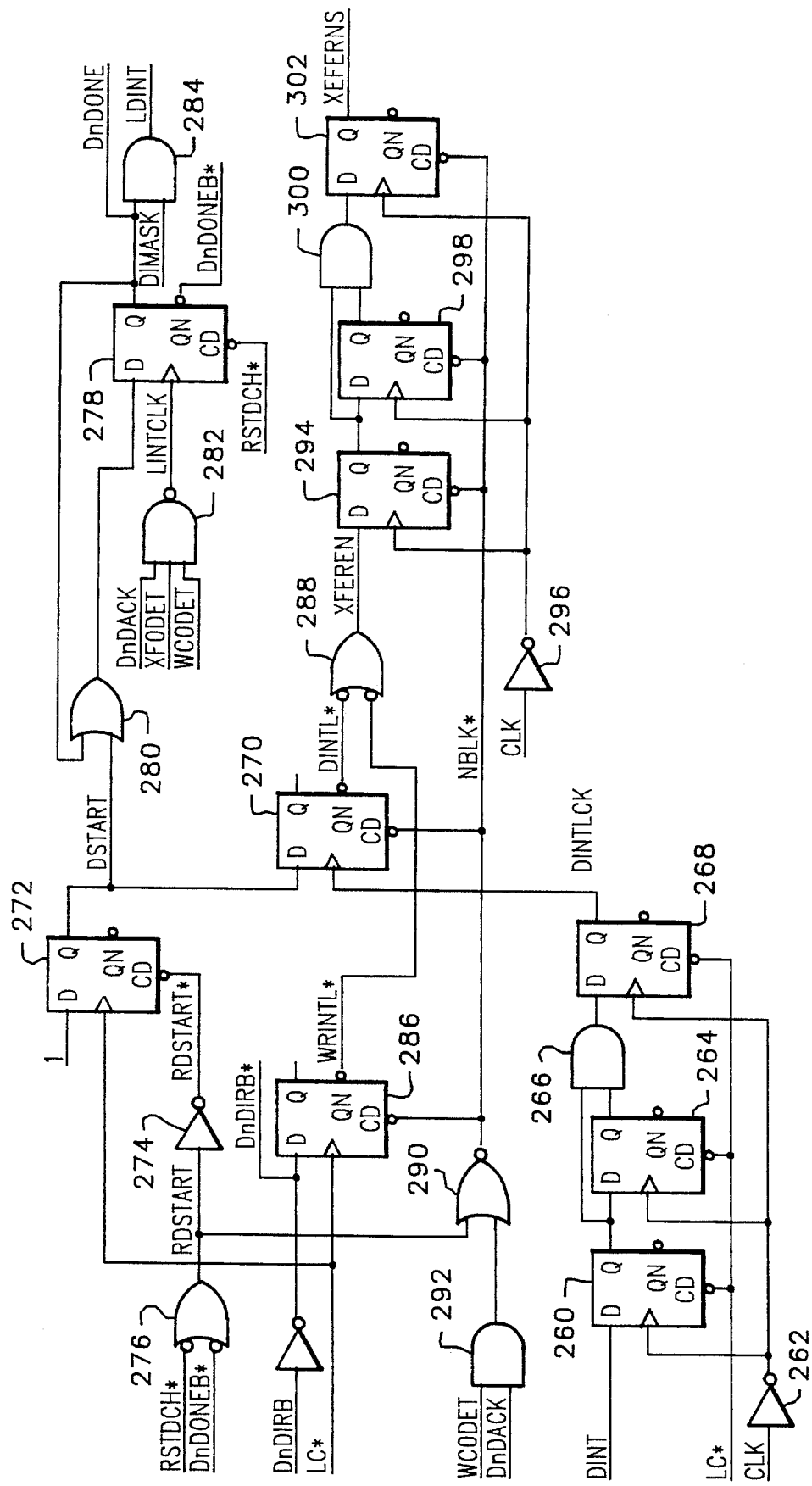
Figure 10B:
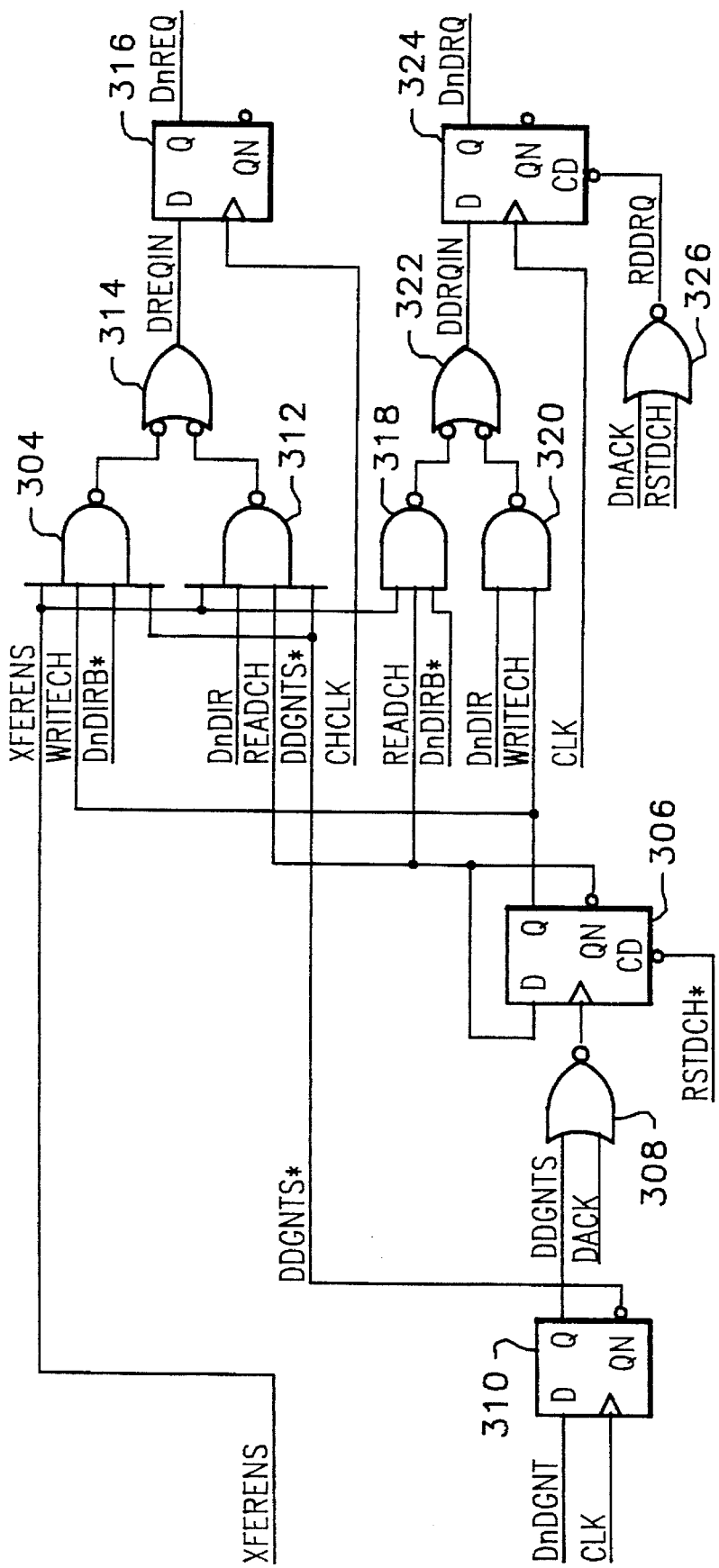

The circuitry of the DMA channels 84, 86 and 88, which are the disk DMA channels 0, 1 and 2, is shown in FIGS. 9 and 10. A 16 bit loadable up counter 220 is used to store and develop the transfer buffer RAM 46 address for the DMA transfer from the transfer buffer 46 to the disk array A. The parallel inputs to the counter 220 are provided from the UDI<15..0> signals, which are the input form of the local data bus LD. In this description a bidirectional bus, particularly a data bus, developed internally in the transfer controller 46 has input and output directions, and are referred to using suffixes of the letters I and O appropriately. These values are loaded when a low level signal appears on the LA* signal, which is based on an address decode of the address provided by the local processor 30. A particular register in the transfer controller 44 is addressed by the local processor 30 by means of the local data lines LD and the local processor control bus UC. Because the local data lines LD are developed through a transceiver 32 from the data lines UD and the address lines UA, 8 bits of address information is still present on these lines during portions of the cycle. This address information, combined with a control signal in the local processor control bus UC, is used to develop an address for a selection of a register in the transfer controller 44. One of these registers is the particular disk DMA channel address counter 220. The carry input to the counter 220 is connected to a SETCRY signal which is provided by a register writable by the local processor 30 to indicate whether a carry is to be utilized for various counters. The clocking signal for the address counter 220 is provided by the output of an inverter 222 whose input is the DNACK signal. Thus each time the disk channel is granted control of the transfer buffer RAM 46 the address counter increments.

It is also necessary to know the number sectors to be transferred and the number of words in a particular sector for the disk. To this end a disk channel transfer down counter 224 is connected to the local processor data bus UDI<15 .. 10> lines so that 6 bits are provided to this transfer counter 224. Additionally, the lower 10 bits UDI<9 . . 0> are provided to the inputs of a 10 bit latch 226. The inverted load input of the down counter 224 and the inverted enable input of the latch 226 are connected to the LC, signal, which is an indication that the number of transfers and words to be transferred has been provided to the disk channel. The clocking signal for the transfer counter 224 is provided by the output of an inverter 228 whose input is the DnDACK signal. This signal indicates that a word has been transferred to the disk array A. The down counter 224 has a 0 detection inverted output which is connected to the input of an inverter 230, whose output is the XFODET signal which is used for developing an interrupt to the local processor 30 to indicate that the requested operation has been completed. It is noted that the transfer down counter 224 is enabled for down counting only during certain intervals based on a down count disable input provided by the WCODET, signal, which is an indication that the sector size or word count has decremented to 0 and thus it is appropriate to decrease the number sectors or word blocks being transferred.

A specific word counter is developed using the latch 226, whose outputs are connected to the inputs of a loadable down counter 232, which is the disk channel word counter, preferably the number of words to be transferred in a given sector. The clocking input to this counter 232 is the WCCLK, signal produced by the inverter 228. Additionally, the SETCRY signal is provided to the counter 232 for carry purposes. The counter 232 also has a 0 detection output so that when this output is connected to the inverted input of a latch 234, the latch 234 having the DnDACK signal provided to the inverted gating input, the output signal is a latched version of the 0 detection of the counter 232. The inverted output of the latch 234 produces the WCODET, signal which is used to enable the transfer counter 224 to be decremented. The WCODET* signal is also provided to the input of an inverter 236 whose output is the WCODET signal.

The inverted 0 detector output is also connected to the inverted D input of a D-type flip-flop 238, whose clocking input is the DnDACK signal. The inverted output of the flip-flop 238 is provided to one input of a 2 input OR gate 240, the other input being connected to the SETCRY signal. The output of the OR gate 240 is connected to one input of a 2 input AND gate 242, whose other input is connected to the LC* signal. The output of the AND gate 242 is connected to the inverted load input of the counter 232. In this case, whenever the transfer count values are loaded by the local processor 30 or count down to 0, the counter 232 is reloaded on the next transfer in a disk cycle. The inverted set input of the flip-flop 238 is connected to the RSTDCH* signal, the RESET disk channel signal.

The RSTDCH signal is produced as the output of an inverter 244 whose input receives the RSTDCH, signal. The RSTDCH* signal is produced by the output of a 2 input AND gate 246, one of whose inputs receives the LA* signal and the other of whose inputs is connected to the output of a inverter 248. The input of the inverter 248 is the RST signal which indicates that the host computer system is being reset. Thus whenever new address values are provided to the disk channel or the system is reset the RSTDCH, signal goes low to clear the channel.

Each disk channel 84, 86 and 88 includes staging registers for disk reads and disk writes to allow for the asynchronous operations between the transfer buffer RAM 46 and the disk array A. In this manner the transfer buffer RAM 46 can be multiplexed between the numerous channels to allow more simultaneous operation of the various channels. For information being read from the disk array, the disk data input lines DDI<15 . . 0> are provided to the D input of a 16 bit flip-flop 250. The clocking input to the flip-flop 250 is provided by the output of a 2 input NAND gate 252 whose inputs are the DnDACK and the DnDIR signals. Thus if the disk array A is responding and a disk read operation is requested, data is strobed into the disk read register 250. The data outputs of the flip-flop 250 are provided to the transfer buffer RAM multiplexer 108 for presentation to the transfer buffer RAM 46. Similarly, a disk write register is developed using a 16 bit flip-flop 254. The D inputs to the flip-flop 254 are connected to the RAM data inputs RDI<15 . . 0>. The clocking signal of the flip-flop 254 is provided by a delayed version of the output of a 2 input OR gate 256. One input to the OR gate 256 is the DnDIR signal to indicate transfer direction, while the other input is the ADRCLK, signal which is provided as the output of the inverter 222. The output of the flip-flop 254 is provided to the disk controller and multiplexer 72 for presentation to the disk data lines DD when appropriate.

Control logic is also associated with each disk DMA channel and is shown in FIG. 10. This logic provides the various request signals necessary to institute a transfer from the RAM 46 to the transfer controller 44 and between the disk array A and the transfer controller 44. Also the logic develops the interrupt provided to the local processor to indicate transfer operation completion.

Prior to commencing operation it is appropriate to first understand how the hard disk unit and the disk array A function. Various controls and commands are sent to the particular hard disk which performs the indicated command or operation and then returns an interrupt signal to indicate that the command has been processed and completed or that the hard disk unit is ready to transfer data. This is particularly true in read operations where data is being obtained from the hard disk unit. Write operations, where data is being written to the hard disk unit, can commence without this interrupt because data is initially just provided to the sector buffer RAM located on the hard disk unit. Interrupts are developed in that case only after the first of the requested sectors is available from the disk drive's buffer memory. Thus to perform a read operation the local processor 30 issues a command to the particular hard disk through the local processor disk channel 82. The hard disk drive performs the operation and then indicates to the transfer controller 44 by means of an interrupt that a data block is ready. The local processor 30 will have previously programmed the particular DMA channel for operation by first supplying the proper address in the transfer buffer RAM 46 and providing the transfer and word count information. Once the transfer and word count information has been provided, the channel is enabled for operation pending receipt of the interrupt from the hard disk.

In a write operation the local processor 30 provides the commands through the local processor disk channel 82 to set up the hard disk for the receipt of data. The local processor 30 then sets up the address value in the disk channel and then provides the count information. Because the direction bit will have been set to indicate a write to disk, upon receiving the count information the transfer will automatically commence to the hard disk unit.

The interrupt from the disk array A, the DINT signal, is provided to the D input of a D-type flip-flop 260. The clocking input to the flip-flop 260 is provided by the output of an inverter 262, whose input is connected to the CLK signal. The noninverted output of the flip-flop 260 is provided to the D input of a second D-type flip-flop 264, whose clocking input is also connected to the output of the inverter 262. The noninverted output of the inverter 264 and 260 are provided as the two inputs to a 2 input AND gate 266, whose input is provided to the D input of a D-type flip-flop 268. The flip-flop 268 is clocked by the output of the inverter 262. The low true or inverted clear inputs to the three flip-flops 260, 264 and 266 are connected to the LC* signal so that they are cleared when a count value is obtained, thus readying the control logic for operation upon the receipt of the interrupt or to detect an interrupt if one is already present.

The noninverted output of the flip-flop 268 is provided to the clocking input of a D-type flip-flop 270. The D input of the flip-flop 270 is provided by the noninverted output of a D-type flip-flop 272. The D input to the flip-flop 272 is connected to a 1 or high logic level, while the clocking input is provided by the LC, signal. The inverted clear input of the flip-flop 272 is connected to the output of an inverter 274, whose input is connected to the output of a 2 input NAND gate 276. One input to the NAND gate 276 is the RSTDCH, signal, which indicates that the channel is being reset. The second input to the NAND gate 276 is the DnDONEB, signal which indicates that the desired transfer has been completed. The DnDONEB* signal is provided by the inverted output of a D-type flip-flop 278.

The D input to the flip-flop 278 is connected to the output of a 2 input OR gate 280. One input to the OR gate 280 is connected to the noninverted output of the flip-flop 272 while the other input is connected to the noninverted output of the flip-flop 278. The clocking signal for the flip-flop 278 is provided by the output of a three input NAND gate 282. The inputs to the NAND gate are the DnDACK signal, the XFODET signal and the WCODET signal. Thus, whenever both counters 224 and 232 have counted down to 0 and the disk acknowledge signal is received, then this is an indication that the transfer is done and the DnDONE signal is developed at the noninverted output of the flip-flop 278. This signal is also provided as one input to a 2 input AND gate 284. The second input to the AND gate 284 is the DIMASK signal, that is the disk interrupt mask signal, which is the output of a register accessible to the local processor 30. The output of the AND gate 284 is the LDINT interrupt which is provided to the local processor 30 to indicate that the transfer has been completed.

The DnDIRB* signal is provided to the D input of a D-type flip-flop 286. The clocking input to the flip-flop 286 is the LC* signal. The inverted output of the flip-flop 286 is provided as one input to a 2 input NAND gate 288. The second input to the NAND gate 288 is the inverted output of the flip-flop 270. The output of the NAND gate 288 is the XFEREN or transfer enable signal. Thus it can be seen that when data is being written to the disk array A, the transfer is enabled immediately upon writing the counter value, whereas in a read operation the transfer is not enabled until the interrupt is received back from the hard disk. The flip-flops 286 and 270 have their inverted clear inputs connected to the output of a 2 input NOR gate 290. One input to the NOR gate 290 is connected to the output of a 2 input AND gate 292. The inputs of the AND gate 292 receives the WCODET signal and the DnDACK signal, so that the transfer is halted at each zeroing of the word counter 232. The transfer of the next block in either the read or write case is initiated when the next interrupt is received from the disk array A. This triggering assumes that the local processor 30 has cleared the disk array interrupt from the previous interrupt or, in the preferred case, that the disk drive has cleared the interrupt itself.

The output of the NAND gate 288, the XFEREN signal, is connected to the D input of a D-type flip-flop 294. The clocking input of the flip-flop 294 is provided by the output of an inverter 296, whose input receives the CLK signal. The noninverted output of the flip-flop 294 is connected to the D input D-type flip-flop 298, whose clocking signal is provided by the output of the inverter 296. The noninverted output of the flip-flop 298 and the noninverted output of the flip-flop 294 are provided to the inputs of a two input AND gate 300, whose output is connected to the D input of a D-type flip-flop 302. The clocking input of the flip-flop 302 is provided by the output of the inverter 296. The inverted clear inputs to the three flip-flops 294, 298 and 302 are provided by the output by the NOR gate 290. Thus the output of the AND gate 300, when transfer operation is enabled, is latched by the flip-flop 302 until the word count is completed, the transfer is done or the channel is reset.

The noninverted output of the flip-flop 302 is provided as one input to a four input NAND gate 304. One input to the NAND gate 304 is the DnDIRB* signal that is the inverted direction signal. A third input to the NAND gate 304 provided by the noninverted output of a D-type flip-flop 306. The D input of the flip-flop 306 is connected to the inverted output of the flip-flop 306 with the inverted clear input being connected to the RSTDCH* signal. The clocking input of the flip-flop 306 is connected to the output of a two input NOR gate 308. One input to the NOR gate 308 is the DnACK signal, while the other input is the noninverted output of a D-type flip-flop 310. The D input of the flip-flop 310 is the DnDGNT signal which is an indication that the particular DMA channel has access to the disk array A. The clocking input of the flip-flop 310 is connected to the CLK signal. The fourth input to the NAND gate 304 is connected to the inverting output of the flip-flop 310.

The noninverted output of the flip-flop 302 is also one input to a second four input NAND gate 312. The DnDIR signal is one input to the NAND gate 312 while the inverted output of the flip-flop 310 is a third input to the NAND gate 312. The fourth input to the NAND gate 312 is provided by the inverted output of the flip-flop 306, which indicates that the reading channel is active. The outputs of the NAND gates 304 and 312 are connected to the inputs of a two input NAND gate 314 whose output is the DREQIN signal. This output is connected to the D input of a D-type flip-flop 316. The clocking signal for the flip-flop 316 is CHCLK signal which is the clocking signal used to advance the particular DMA disk channel having access to the disk array A. The output of the flip-flop 316 is the DnREQ signal which is an indication that the particular disk channel is requesting a transfer of data with the disk array A.

The noninverted output of flip-flop 302 is also provided as one input to a 3 input NAND gate 318. The second input to the NAND gate 318 is the inverted output of the flip-flop 306, while the third input is the DnDIRB* signal. The noninverted output of the flip-flop 306 and DnDIR signals are the two inputs to a 2 input NAND gate 320. The outputs of the NAND gates 318 and 320 are provided as the two inputs to a 2 input NAND gate 322 whose output is provided to the D input of a D-type flip-flop 324. The clocking signal for the flip-flop 324 is provided by the CLK signal and the noninverted output is the DnDRQ signal which indicates that a RAM data transfer request is pending. The DnACK signal is provided as one input to a 2 input NOR gate 326, whose other input is the RSTDCH signal. The output of the NOR gate 326 is provided to the inverted clear input of the flip-flop 324 so that when a word has been transferred or the channel is reset the transfer request is cleared until the next CLK cycle.

Thus requests alternate between the flip-flops 316 and 324 based on the toggling of the flip-flop 306. In this manner the data is properly provided in the data staging registers before being transferred to the transfer buffer RAM 46 or the disk array A.

The parity channel 90 is configured slightly differently then the other three disk channels 84, 86 and 88 because of the need to include the parity generation circuitry. Like devices are numbered the same between the two sets of circuitry, with a prime indicating parity channel device. Transfer counter 224' (FIG. 11) and word register 226' and counter 232' circuitries are generally the same except that the clocking signals are slightly different. The clocking signal provided to the counter 224 and counter 232 are provided by the output of an inverter 330. The input to the inverter 330 is provided by the output of a 2 input NAND gate 332. One input to the NAND gate 332 is provided by the output of a 2 input NAND gate 334. The inputs to the NAND gate 334 are the D3DACK signal and the PARWRR, signal. The PARWRR, signal is active low when the parity data is to be written into the transfer buffer RAM 46. The second input to the NAND gate 332 is provided by the output of a 2 input NAND gate 336. The two inputs to the NAND gate 336 are the PX signal and the PARWRR signal. The PX signal is described later.

As a further difference the second input to the two input OR gate 244 is received from the inverted output of a D-type flip-flop 338. The inverted D input of the flip-flop 338 is connected to the inverted 0 detection output of the counter 232', while the inverted set input of the flip-flop 338 is connected to the RSTPCH, signal. The clocking input to the flip-flop 338 is connected to the output of the NAND gate 332, which is different from the flip-flop 238 which receives its clocking input from the DnDACK signal.

The data handling portion of the parity channel 90 is also different. Data is received from the disk data channel lines DDI<15 . . 0> to the inputs of a 16 bit flip-flop 340. The clocking signal for the flip-flop 340 is provided by the output of an inverter 342 whose input receives the D3DACK signal. The inverted reset inputs of the counters 224' and 232' and the flip-flop 340 are provided by the output of an inverter 344, whose input is the RST signal. The output of the inverter 344 is also connected to one input of a 2 input AND gate 346 whose other input receives the LD3A* signal, which indicates that the transfer buffer RAM address for this parity channel 90 is being loaded. The output of the AND gate 346 is the RSPCH, signal and is provided to the input of an inverter 348, whose output is the RSTPCH signal. The output of the flip-flop 340 is provided to one input of a 16 bit 2 to 1 multiplexer 350. The output of the multiplexer 350 is provided to the multiplexer which multiplexes data to the transfer buffer RAM 46. The select input of the multiplexer 350 is provided by the output of a 2 input NAND gate 352, whose inputs are the PAREN signal and the PARDIR signal. The PAREN signal indicates when high that the parity mode operation is enabled, while the PARDIR signal indicates whether the parity information is to be written to the transfer buffer RAM 46 or to the disk array A. The output of the NAND gate 352 is also provided to the input of an inverter 354 which has the PARWRR signal as its output.

The second channel input of the multiplexer 350 is provided by the output on a 16 bit flip-flop 356 whose inputs are connected to the output of a second 16 bit 2 to 1 multiplexer 358. The clocking signal for the flip-flop 356 is provided by a delayed version of the DACKCLK signal. The delay is provided so that the read data provided from the RAM has sufficient time to pass through various devices before appearing at the flip-flop 356. The DACKCLK signal is produced at the output of a buffer 391. The input of the buffer 391 is connected to a two input OR gate 390. One input of the OR gate 390 receives the CLK signal, while the second input is connected to the output of an inverter 389. The inverter 389 receives the D3ACK signal. The multiplexer 358 has the A channel or first inputs connected to the transfer buffer RAM data bus RDI<15 . . 0>, while the channel B inputs are connected to the output of 16 parallel XOR gates 360. The 16 bits of the transfer buffer RAM data bus RDI<15 . . 0> are provided to one input of the XOR gates 360, while the 16 bits output by the flip-flop 356 are provided to the second input of the XOR gates 360. The select input for the multiplexer 358 is provided by the PAREN signal. Thus in this manner the data which was developed on the previous access is combined with the presently received information from the transfer buffer RAM 46 by the XOR gates 360 and provided back to the flip-flop 356 for storage when parity operation is enabled. Thus by successively bringing data from each of the desired channels for which parity information is developed into the parity channel, the parity data is cumulatively developed in the flip-flop 356. When all of the desired channels have been read and parity information developed, then this information can be written to the transfer buffer RAM 46 or the disk array A as desired. The outputs of the flip-flop 356 are also provided to the multiplexer which supplies data to the disk array data bus DD. Finally, the outputs of the flip-flop 356 are provided to a 16 bit equal to zero comparator or detector 362. The clocking signal for the zero detector 362 is provided by the output of an inverter 364 whose input is connected to the PX signal. The inverted reset input of the comparison detector 362 is connected to the RSTPCH, signal. The comparison detector has two outputs, the EQUAL output and the EQUALB* signal which indicates that the value provided from the flip-flop 356 is not equal to 0. The equal value is supplied to a register which can be read by the local processor 30 to determine if a valid parity operation has developed or errors have occurred. The 0 value is an indication that no error had developed because when parity data is XOR'd with identical parity data a 0 value results.

The inverted reset input of the flip-flop 356 is provided by the output of a three input AND gate 366. One input to the AND gate 366 is the RSTPCH* signal. A second input is received from the inverted output of a D-type flip-flop 368. The inverted D input of the flip-flop 368 is connected to the output of a two input NAND gate 370. The inputs to the NAND gate 370 are the PARWRR signal and the PXCB signal provided as the noninverted output of a D-type flip-flop 388. The clocking signal for the flip-flop 368 is the PRCLK signal which is provided as the clock signal for the flip-flop 356. The third input to the AND gate 366 is provided by the inverted output of a D-type flip-flop 372. The inverted D input of the flip-flop 372 is provided by the output of a two input NAND gate 374 whose inputs are the PARDIRB, signal and the PAREN signal. The clocking input to the flip-flop 372 is provided by the output of an inverter 376 whose input receives the D3DGNT signal.

The inverted set inputs of the flip-flops 360 and 372 are provided by the output of a two input AND gate 378. One input to the AND gate 378 is the RSTPCH* signal. The other input is connected to the inverting output of a D-type flip-flop 380. The inverted clear input of the flip-flop 380 is connected to the RSTI* signal output by the inverter 344, while the clocking input is received from the output of an inverter 382, whose input is connected to the PRCLK signal. The D input of the flip-flop 380 is connected to the noninverting output of a D-type flip-flop 384. The D input of the flip-flop 384 receives the P0 signal which indicates that first transfer buffer block is being accessed. The clocking input to the flip-flop 384 is produced by the output of an inverter 386 whose input receives the DACKCLK signal. This output of the inverter 386 is also provided by the clocking input of a second flip-flop 388 whose D input receives the PX signal and whose noninverted output develops the PXCB signal. The inverted clear inputs of both flip-flops 384 and 388 are connected to the RSTPCH, signal. In this way the flip-flop 356 is cleared prior to receiving the data from the first block during parity operation. If this clearing operation were not performed erroneous parity data could be developed.

Addressing information is stored differently in the parity channel 90 because four separate blocks can be combined by the parity channel 90 for determining parity operation. As a result four separate addresses must be capable of being stored. The local processor data inputs UDI<15 . . 0> are provided to the inputs of four separate 16 bit up counters 400, 402, 404 and 406. These up counters 400, 402, 404 and 406 represent, respectively, parity blocks 3, 2, 1 and 0 in parity channel operation. The clocking input for all four up counters 400–406 is provided by the DACKCLK signal while the SETCRY signal is provided to the carry input of all four counters 400–406. The inverted load input to the counter 406 receives the LD3A, signal which indicates that the address values for conventional disk DMA channel operation of the parity channel 90 is being loaded into the parity channel 90. The inverted load input for the counter 404 receives the LDPA1* signal which is indication that the first additional parity channel address is being provided. The inverted load input of the counter 402 receives the LDPA2* signal, which is an indication that the addressing for the second additional parity channel is being provided. The inverted load input signal for the counter 400 is provided by the LDPA3* signal which is an indication that the final parity address location is being provided. The inverted reset input for all four counters 400–406 receives the RSTI* signal indicating a parity channel reset.

The count input of the counter 406 is connected to the output of a two input AND gate 408. The inputs to the AND gate 408 are the P0 and PL, signal. The P0 signal indicates that this particular P0 counter is being indicated by the XOR state machine which tracks through the four counters 400–406 as appropriate for parity operations. The PL* signal is an indication, where high, that the state machine will be advancing and this is the next to the last parity address. The last address is repeated to allow the parity data to be written to the transfer buffer RAM 46 if desired. The count input for the counter 404 is provided by the output of a two input AND gate 410. The two inputs to the AND gate 410 are the PL* signal and the P1 signal which indicates that counter 1 is selected. The count input to the counter 402 is provided by the output of a two input AND gate 412 whose inputs are the P2 and PL* signals. Similarly, the count input for the counter 400 is provided by the output of a two input AND gate 414 whose inputs are the PL* and P3 signals. The outputs of the four counters are provided as the four inputs to a 16 bit 4 to 1 multiplexer 416 whose selection inputs are the SP1 and SP0 signals, which are a binary encoded version of the selected parity address counter. The output of the counter multiplexer 416 is the address signal for the parity DMA channel 90 and is provided to the multiplexer which supplies addresses to the transfer buffer RAM address bus RA.

Figure 13:
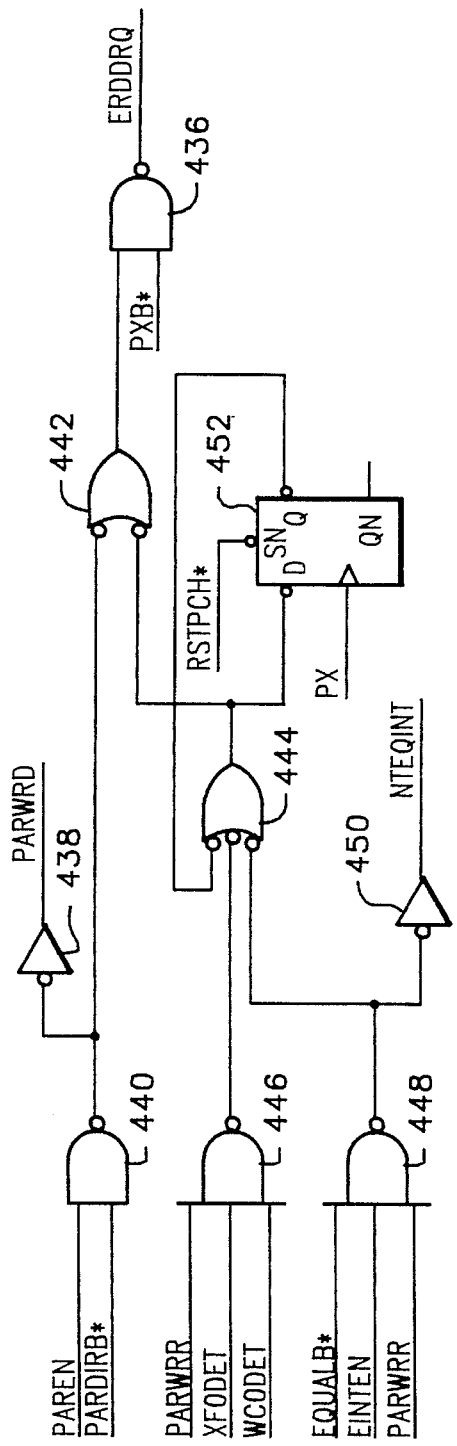
Figure 11A:
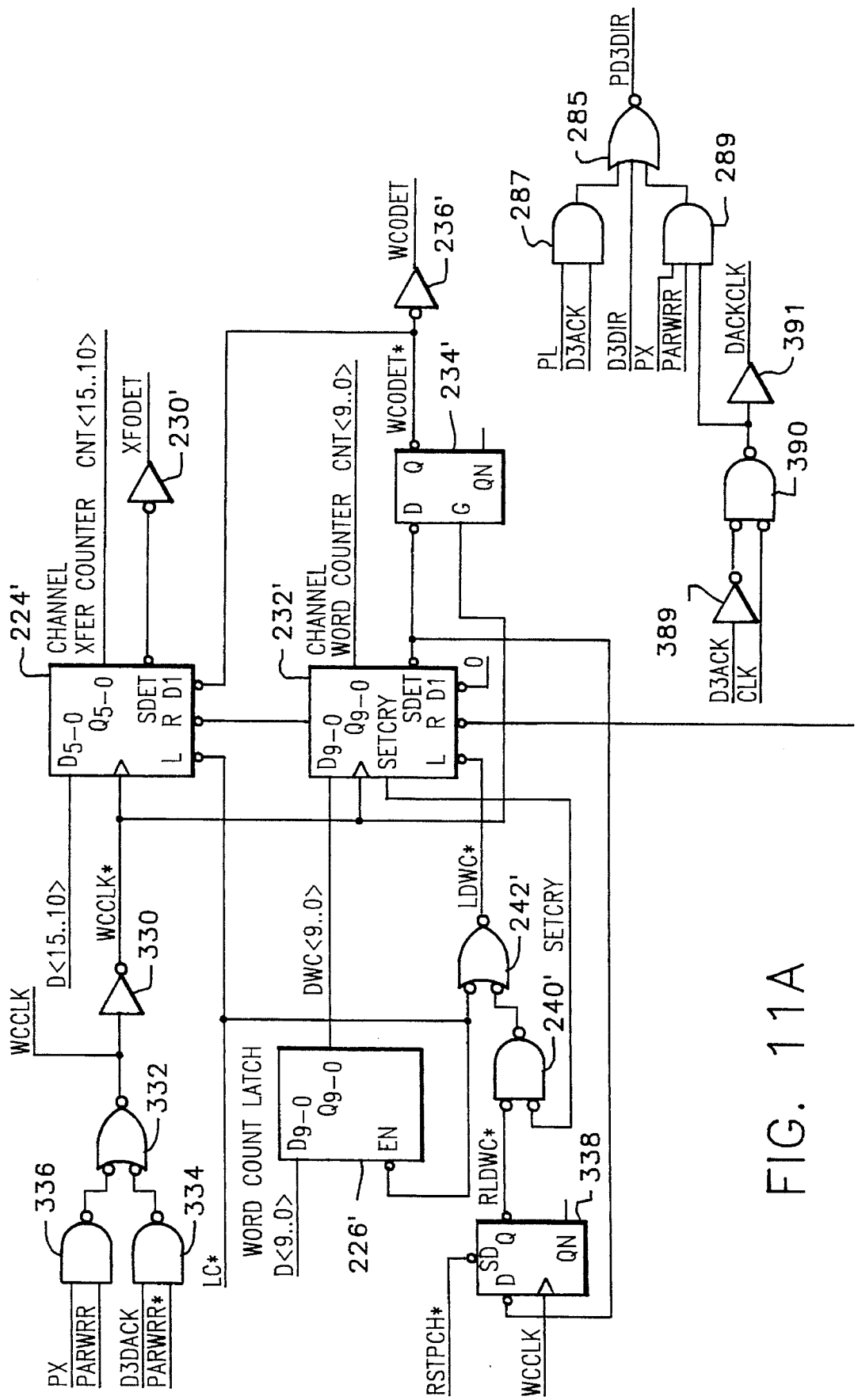
Figure 11B:
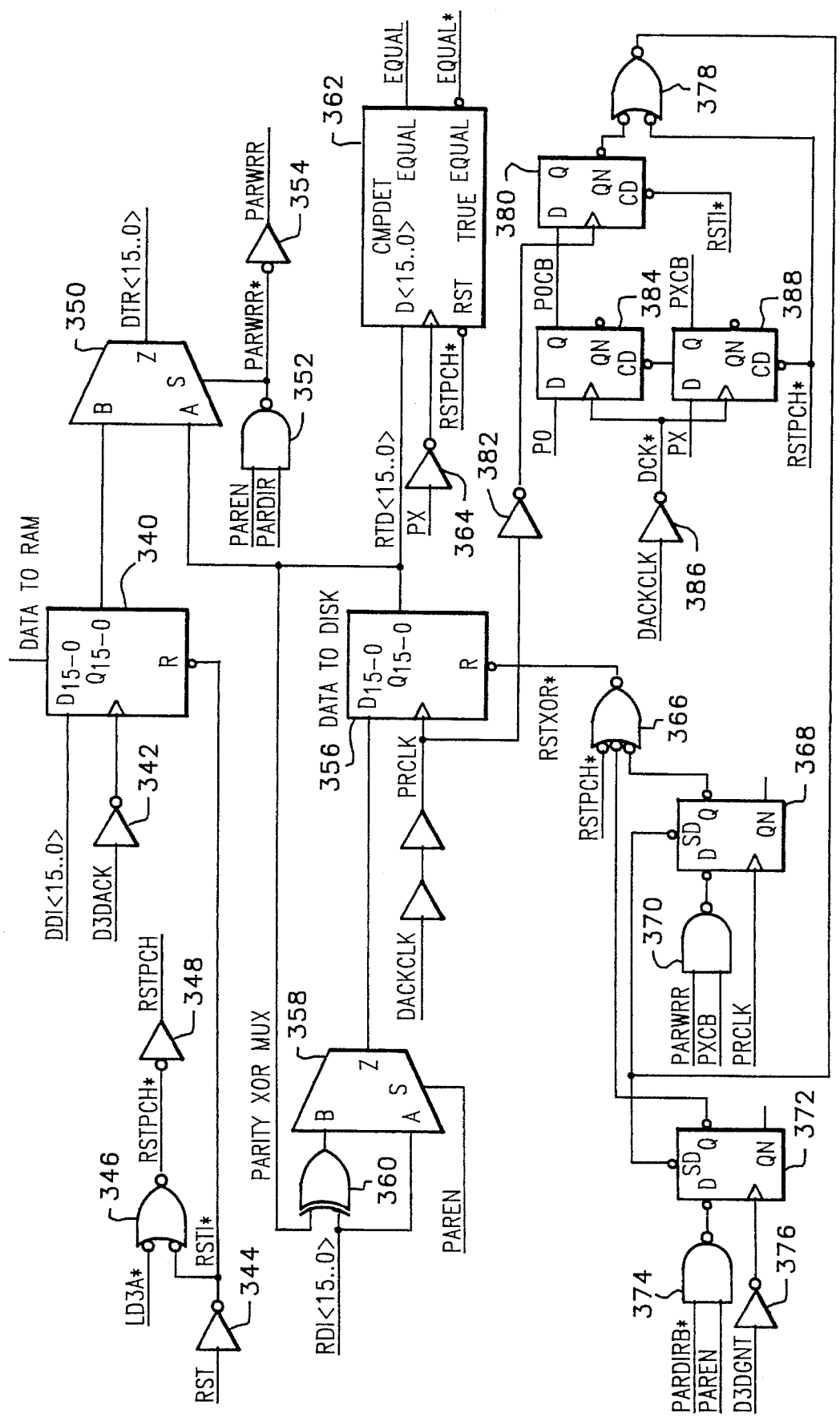
Figure 12A:
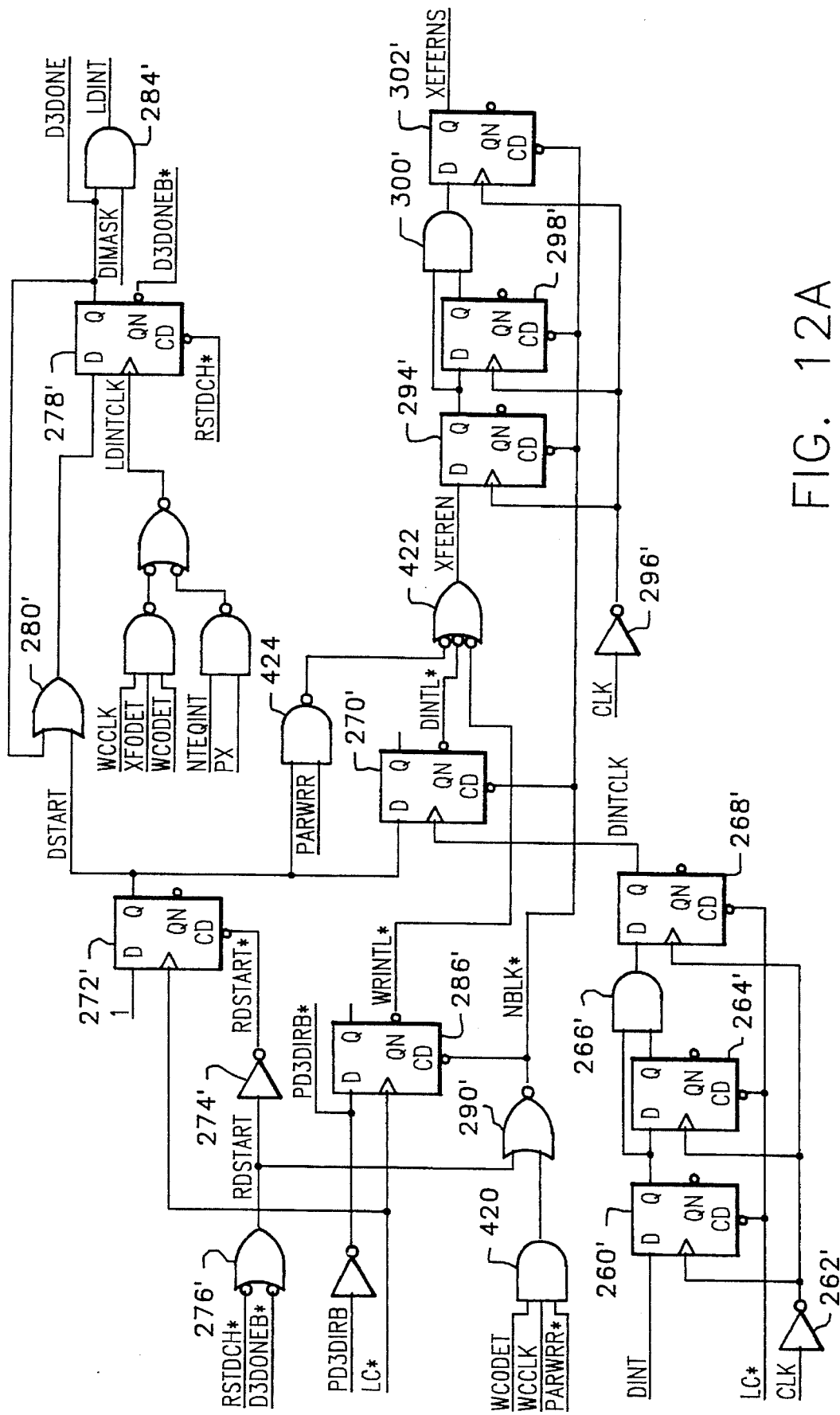
Figure 12B:
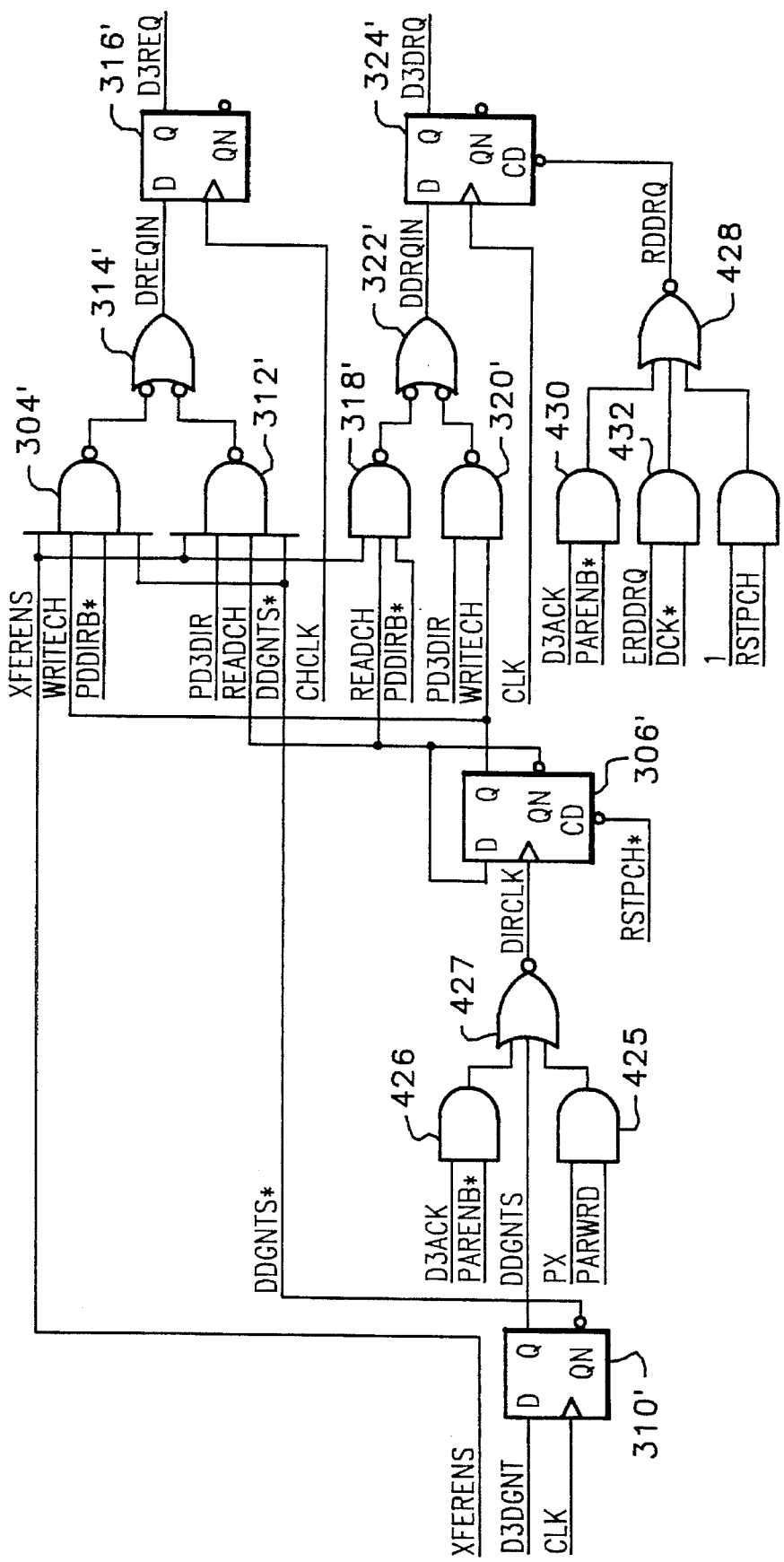
Figure 14:
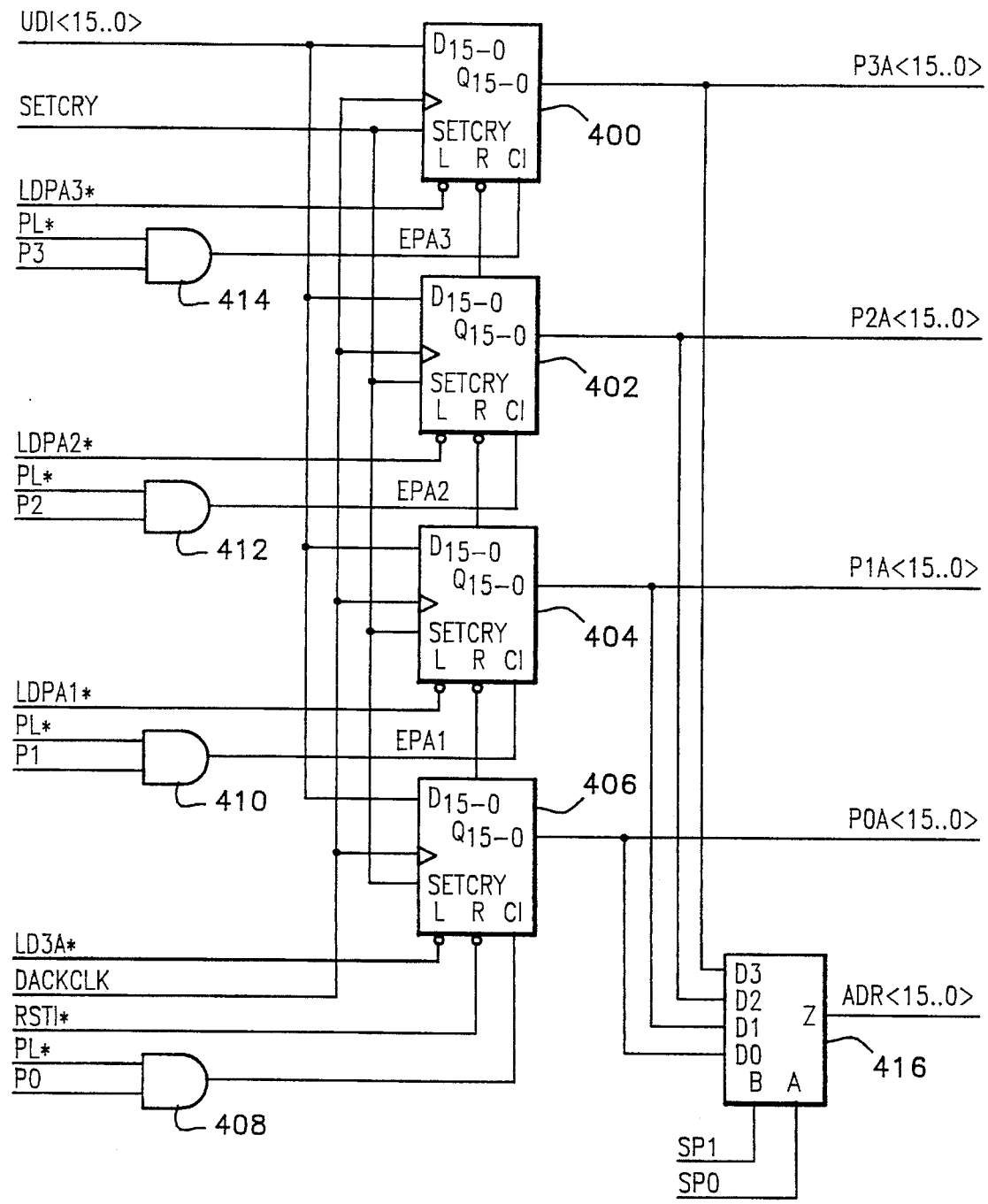

The control logic for the parity channel is similar to the control logic for the conventional DMA channel 84, 86 and 88 except that necessary parity related signals and gates have been added. There are a few differences relating to the addition of the parity circuitry. The two input NOR gate 290' (FIG. 12) which is providing the clear signal for the flip-flops 270', 286', 294', 298' and 302' receives inputs of the output of the two input NAND gate 276' and the output of a three input AND gate 420. The three inputs to the AND gate 420 are the WCODET signal, the WCCLK signal and the PARWRR, signal. The input to the first of the transfer enable flip-flops 294' is connected to the output of a three input NAND gate 422 comparison to the two input NAND gate 288 used in the disk DMA channels 84, 86 and 88. Two of the inputs are connected to the inverted output of the flip-flops 270' and 286' with the third input being connected to the output of a two input NAND gate 424 which receives as an input the noninverted output of the flip-flop 272' and the PARWRR signal. A third difference is that instead of the NOR gate 308, a three input NOR gate 427 is used to provide the clocking signal to the flip-flop 306'. The inputs to the NOR gate 427 are the output of a two input AND gate 426, whose inputs are the B3ACK and PARENB* signal; the noninverted output of the flip-flop 310 and the output of a two input AND gate 425, whose inputs are the PX and PARWRD signals. Additionally, the control circuitry is different in that the clear signal provided to the D3DRQ flip-flop 324' is provided by the output of a three input NOR gate 428. One input of the NOR gate 428 is effectively the RSTPCH signal while a second input is provided by the output of a two input AND gate 430. The two signals provided to the AND gate 430 are the D3ACK signal and the PARENB* signal. The third input to the NOR gate 428 is provided by the output of a two input AND gate 432 which receives the ERDDRQ signal and the DCK, signal, the output of the inverter 386. Further, the flip-flop 286' has its D input connected to the PD3DIRB* signal, while the PD3DIR and PD3DIRB* signals replace the DnDIR and DnDIRB* signals to NAND gates 304', 312', 318' and 320'. The PD3DIR signal is produced as the output of a three input OR gate 285 (FIG. 11). The three inputs to the OR gate 285 are the D3DIR signal and the outputs of two AND gates 287 and 289. The two inputs to the AND gate 287 are the PL and D2ACK signals, while the three inputs to the AND gate 289 are the PX and PARWRR signals and the output of the OR gate 390. Thus the PD3DIR signal allows the parity channel to change direction so that the parity result may be written to the transfer buffer RAM 46. The PARWRD signal is the output of an inverter 438 (FIG. 13). The input of the inverter 438 is connected to the output of a two input NAND gate 440 whose inputs are the PAREN and PARDIRB* signal.

The output of the NAND gate 440 is also connected as one input to a two input NAND gate 442 the output of which is connected to one input of a two input AND gate 436. The second input of the AND gate 436 is inverted and receives the PXB, signal. The output of the AND gate 436 is the ERDDRQ signal. The second input to the NAND gate 442 is produced as the output of a three input AND gate 444. One input to the AND gate 444 is provided by the output of a three input NAND gate 446 whose inputs are the PARWRR signal, the XFODET signal and the WCODET signal. A second input to the AND gate 444 is provided by the output of a three input NAND gate 448 whose input signals are the EQUALB* signal which indicates that the comparison detector did not determine an equality, the EINTEN signal which indicates that the equal determination interrupt is enabled and based on the result of the equal comparison, and the PARWRR signal. The output of the NAND gate 448 is also provided to the input of an inverter 450 whose output is the NTEQINT signal, the not equal interrupt signal, which is provided to the local processor 30 if desired and not masked. The third input to the AND gate 444 is connected to the inverted output of a D-type flip-flop 452. The output of the AND gate 444 is connected to the inverted D input of the flip-flop 452 and the PX signal provides the clocking input to the flip-flop 452. The flip-flop 452 has its inverted set input connected to the RSTPCH* signal.

Figure 15B:
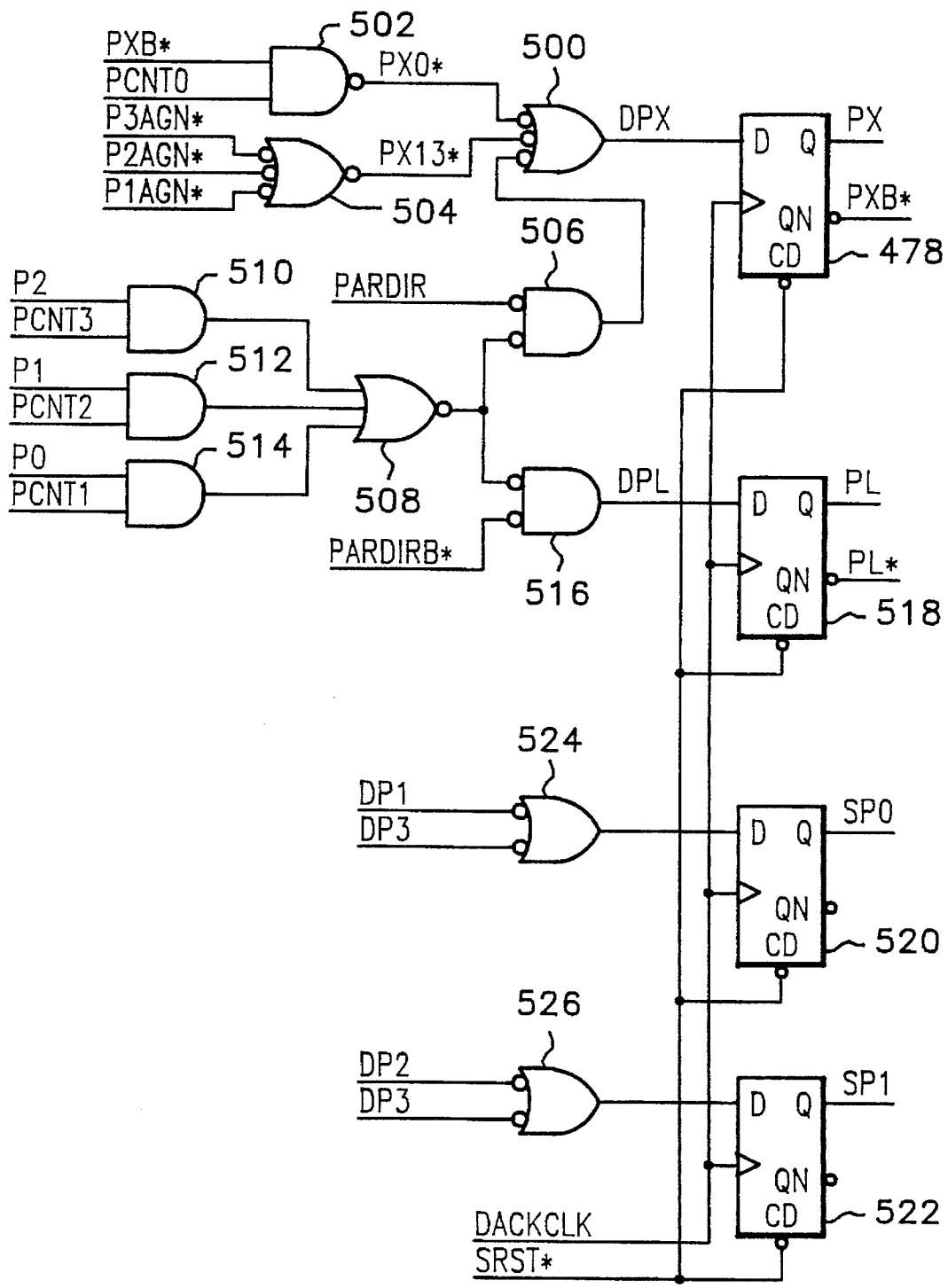

As previously indicated the parity channel 90 can cooperate with up to four separate transfer buffer segments for performing parity operations. The desired number of parity channels to be utilized is stored in a flip-flop 451 (FIG. 15) whose inputs are connected to local data bus LD and whose clocking input receives the LDPC* signal, which is an indication of the local processor 30 accessing the parity channel register. Bits 2 and 3 of the data bus provide the PARCNT<1> and PARCNT<0> signals which are binary representation of the number of parity blocks or channels to be utilized in operation. The PARCNTB1* and PARCNTB0* signals are, respectively, the inverses of the two signals. The flip-flop 451 also contains the PARDIR, PAREN and EINTEN values which are provided as outputs of the flip-flop 451. The RST1, signal, the PAREN signal and the LDPC* signal are provided as three inputs to a three input AND gate 452 whose output is the SRST* signal. This signal is used to reset the state machine used in the parity channel 90 so that should this register be rewritten then the state machine automatically begins operation according to the new values.

The PARCNT<1> and PARCNT<0> signals are connected to the inputs of a two input AND gate 454 whose output is the PCNT3 signal which indicates that four buffers are to be utilized in parity operation. The PARCNT<0> signal and the PARCNTB1, signal are provided as the input to a two input AND gate 456 whose output is the PCNT1 signal which indicates that two buffers are to be used for parity operations. The PARCNT<1> and PARCNTB0* signal are provided as the inputs of a two input AND gate 458 whose output is the PCNT2 signal, which indicates that three buffers are to be used. The PARCNTB1* and PARCNTB0* signals are provided as the inputs to a two input NAND gate 460 whose output is the PCNT* signal and is connected to the input of an inverter 462 whose output is the PCNT0 signal which indicates that only a single buffer is to be used. Thus if the parity operation is not enabled, the SRST* signal is always low and therefore the state machine never advances. The parity channel 90 works in such a way that the last of the buffers being utilized receives the parity information if the parity information is being written to the transfer buffer memory 46. Thus in some cases when parity operations are being performed the last buffer must receive two successive accesses during transfers to the buffer RAM 46 and thus the state machine should not advance under those conditions.

The state machine is developed using four D-type flip-flops 470, 472, 474 and 476. Additionally, a fifth D-type flip-flop 478 indicates that a redrive to the previous channel is required. The set input to the P0 flip-flop 470 and the clear input to the remaining four flip-flops are inverted and receive the SRST* signal to reset operation to the first buffer. The clock for all five flip-flops 470–478 is provided by the DACKCLK signal. The D input of the P0 flip-flop 470 is connected to the output of a two input NAND gate 480 whose inputs are the PXB* signal and the PCNT0* signal. Thus if parity operation is enabled and only one buffer is being utilized then the state machine stays at P0. The output of the P0 flip-flop 470 is the P0 signal.

The D input of the P1 flip-flop 472 is connected to the output of a two input NAND gate 482. One input to the NAND gate 482 is provided by the output of a two input NAND gate 484 whose inputs are the P0 signal and the PCNT0, signal. This NAND gate 484 is used to advance the state machine from pointing to buffer 0 to point to buffer 1. The second input to the NAND gate 482 is provided by the output of a three input NAND gate 486 whose inputs are the P1 signal, the PCNT1 signal and the PXB, signal. This NAND gate 486 is used to keep the state machine at the state indicating that P1 buffer is being accessed in case only two buffers are being used in the parity operation. The D input to the P2 flip-flop 474 is connected to the output of a two input NAND gate 488. The first input to the NAND gate 488 is provided by the output of a two input NAND gate 490 whose inputs are the P1 and PARCNT<1> signal. This NAND gate is used to transfer from state P1 to state P2. The second input to NAND gate 488 is provided by the output of a three input NAND gate 492 whose inputs are the P2 signal, PCNT2 signal and the PXB* signal. This NAND gate term is used to keep the state machine pointing to the P2 buffer for write to transfer buffer RAM 40 operations. The D input to the P3 flip-flop 476 is connected to the output of a two input NAND gate 494. One input to the NAND gate 494 is provided by the output of a two input NAND gate 496 whose inputs are the P2 signal and the PCNT3 signal. The second input to the NAND gate 494 is provided by the output of a three input NAND gate 498 whose inputs are the P3 signal, the PCNT3 signal and the PXB* signal. Thus the state machine successively counts through the number of buffers enabled and repeats the last buffer enable before recycling to the first buffer.

The PXB* signal is produced by the inverting output of the PX flip-flop 478, the noninverting output of which is the PX signal. The D input of the flip-flop 478 is connected to the output of a three input NAND gate 500. One input to the NAND gate 500 is connected to the output of a two input NAND gate 502 whose inputs are connected to PXB, signal and the PCNT0 signal. The second input to the NAND gate 500 is connected to a three input AND gate 504 whose inputs are the outputs of the NAND gates 486, 492 and 498. The third input to the NAND gate 500 is provided by the output of a two input OR gate 506. One input to the OR gate 506 is a PARDIR signal so that if data is to be written to the transfer buffer RAM 46 the output is high. The second input to the OR gate 506 is provided by the output of a three input NOR gate 508. One input to the NOR gate 508 is provided by the output of a two input AND gate 510. The inputs to the AND gate 510 are the P2 and PCNT3 signals. The second input to the NOR gate 508 is provided by the output of a two input AND gate 512. The inputs to the AND gate 512 are the P1 and PCNT2 signals. The third input to the NOR gate 502 is the output of a two input AND gate 514, whose inputs are P0 and PCNT1 signal. Thus the PX signal goes high when it is time to use the final buffer a second time for the write to transfer buffer RAM 46 operation.

The output of the three input NOR gate 508 is also connected to one input of a two input NOR gate 516. The second input to the NOR gate 516 is connected to the PARDIRB, signal, the inverted PARDIR signal. The output of the NOR gate 516 is provided to the D input of a D-type flip-flop 518 whose noninverted output is the PL signal, whose inverted output is the PL* signal and which is clocked by the DACKCLK signal. The inverted clear input of the flip-flop 518 is connected to the SRST* signal. The SP0 and SP1 signals used to control the address multiplexer 416 are produced by two D-type flip-flops 520 and 522. The clocking inputs to both flip-flops 520 and 522 receive the DACKCLK signal while the inverted clear inputs receive the SRST* signal. The D input to the SP0 flip-flop 520 receives the output of a two input OR gate 524 which has its inputs connected to the outputs of the NAND gates 482 and 494. The D input to the flip-flop 522 is connected to the output of a two input OR gate 526 whose inputs are connected to the outputs of the two input NAND gates 488 and 494.

FIGS. 22, 23, 24 and 25 illustrate the manner in which the disk DMA channels 84, 86, 88 and the parity channel 90 can be utilized in transferring data between the transfer buffer RAM 46 and the disk drive array A or parity data back to the transfer buffer RAM 46. The various transfers are developed by having the local processor 30 appropriately program the transfer controller 44, particularly the parity channel or XOR channel 90, to perform the operations. The timing of the parity channel 90 is such that parity operations from the buffer RAM occur at a very high rate, ultimately in successive cycles of the CLK signal if no other requestor or requesting access to the transfer buffer RAM 46. The RAM parity operations are done at high speed in a very short period of time without the need for the local processor 30 to perform operations other than simply setting up the parity channel 90 for operation and enabling its operation. This dramatically increases the speed of the parity operation used in the disk array controller D according to the present invention.

Figure 16A:
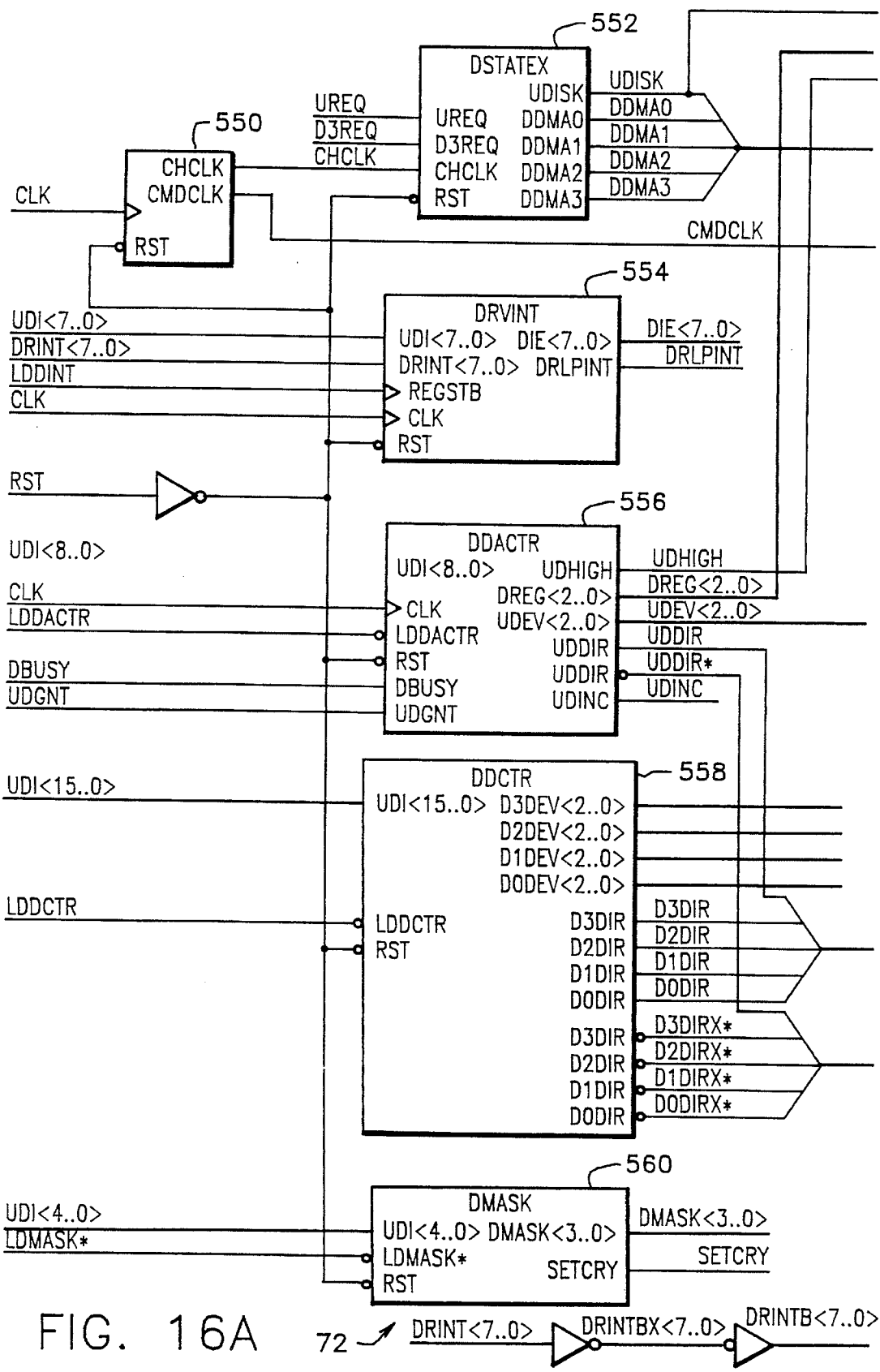
Figure 16B:
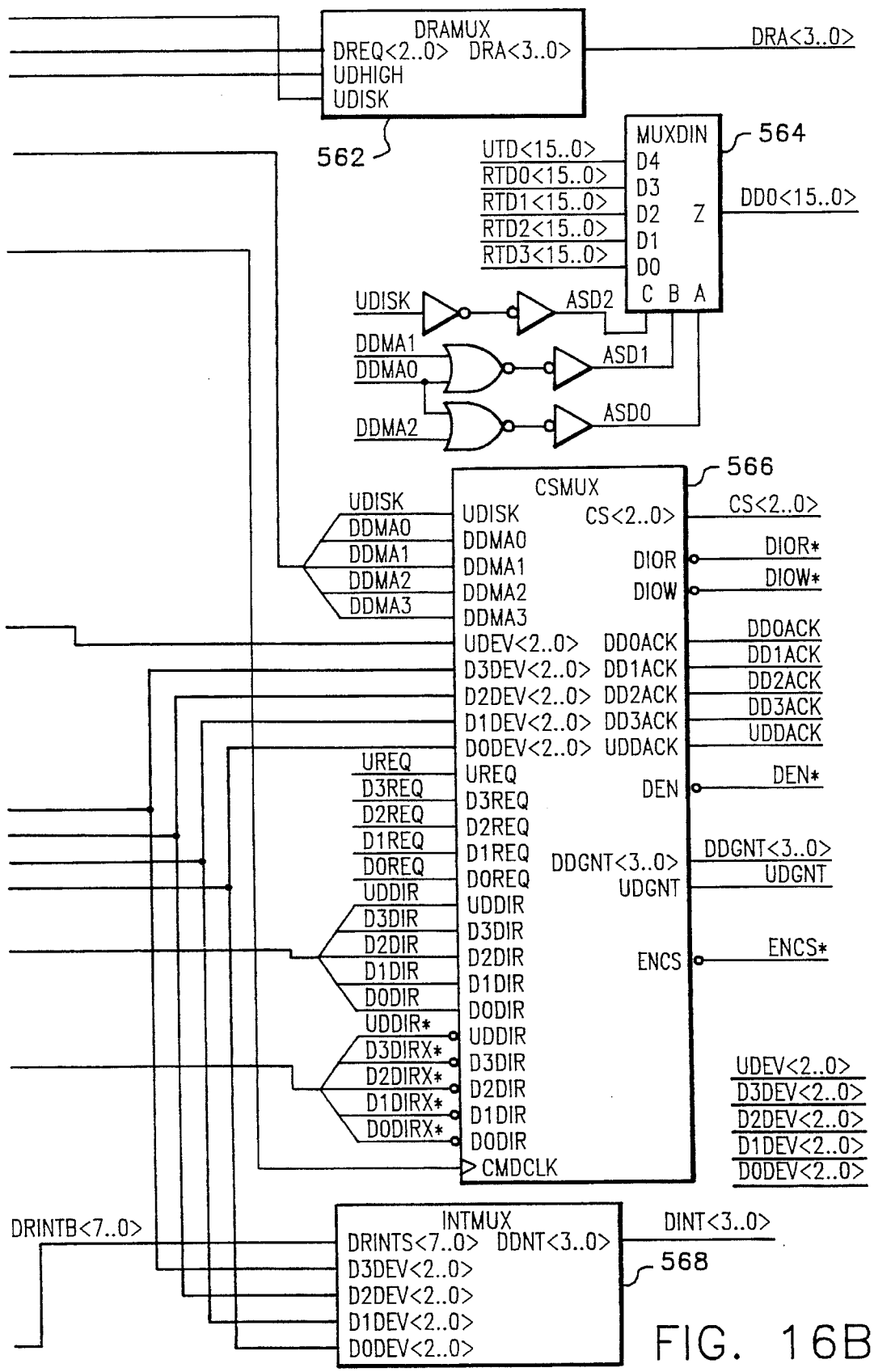

FIG. 16 illustrates in more detail the various blocks used in developing the disk controller 72. A disk clock block 550 receives the CLK signal and produces two clock signals, the CHCLK signal which advances the DMA channel having rights to access the disk array A and the CMDCLK signal which supplies the proper strobe pulse timing for use over the disk address and control bus DAC. The CHCLK signal is supplied to the disk state machine 552 which, with inputs of the local microprocessor request signal UREQ and the parity channel request signal D3REQ, cycles through the various disk channel requesters to determine which requester has access to the disk array A. The disk controller 72 also includes a register 554 for receiving data from the local processor data bus UDI for masking off interrupts received from the various disk drives in the drive array A. This interrupt block 554 receives the various interrupts and combines them with the masking signals to produce an interrupt signal referred to as DRPLINT, which combined is with the various interrupts produced by the disk channels 84, 86, 88 and 90 to form interrupt request signal presented to the local processor 30.

A register 556 is provided for the local processor 30 to communicate directly with the disk drive array so that command information and status information can be provided to and received from the particular disk. This register 556 includes the appropriate registers and latches to select a particular disk and provide a particular register address to the selected disk. This register block 556 contains the direction information of the transfer, that is, whether data is to be written to the disk drive or read from the disk drive as indicated by the UDDIR signal.

A register 558 is provided to store direction value and appropriate disk drive requested for each disk channel 84–90. Additionally, a register 560 is provided for masking the interrupts provided by the disk channels 84–90 having an output of the DMASK<3 .. 0> signals, which are provided to the appropriate disk channel to mask off interrupts from that channel. Additionally, this register 560 contains the SETCRY register bit for the developing of that signal. A disk register address multiplexer 562 is provided to address the data register, which has an address of 0, during disk channel operations and to allow the register indicated in the direct register to be accessed under local processor 30 control. A data multiplexer 564 is provided to multiplex the data signals from the various disk channels 84–90 and the local processor channel 82 to the disk array data bus DD. The multiplexer 564 is driven by the signals provided by the state machine 552 to select the appropriate input. A multiplexer 566 is provided, and will be described in more detail, for selecting the device select, command strobe, acknowledgement signal and other signals used in communicating with the disk array A. A disk interrupt multiplexer 568 is provided so that based on input received from the disk channel device register 558, the interrupts received from the disks can be routed to the appropriate disk channel 84–90 for receipt and for triggering operation of the transfer operations.

Figure 18:
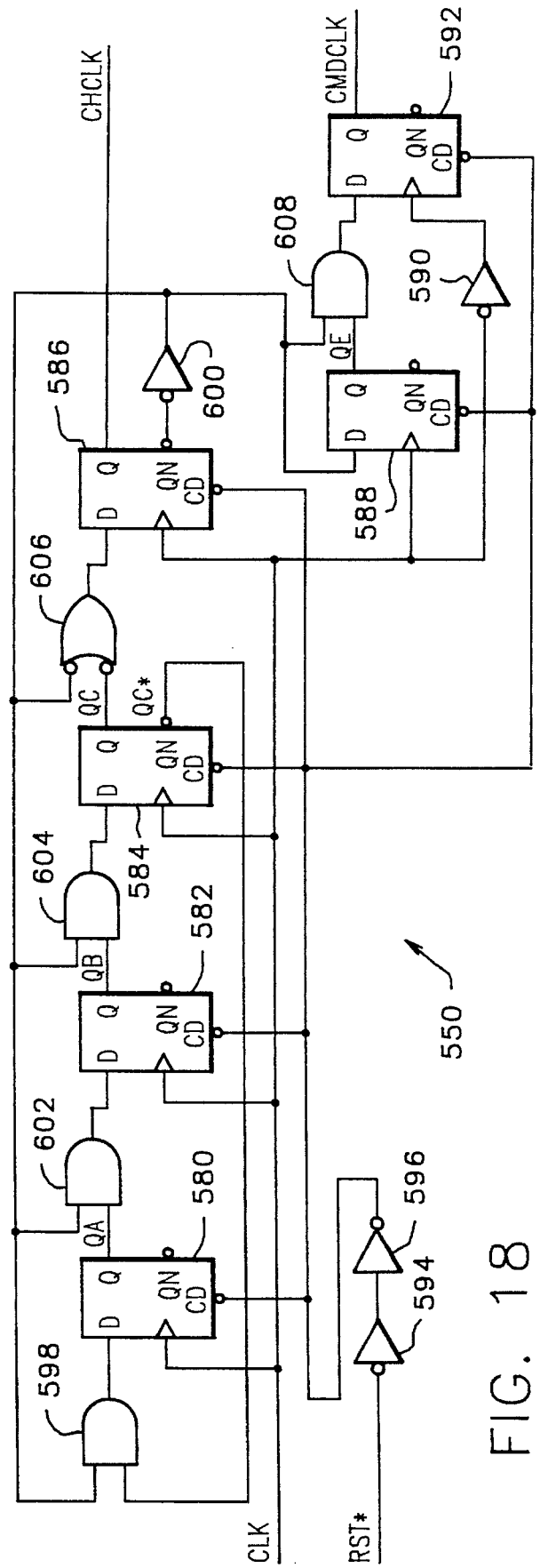

The clock circuitry 550 is shown in detail in FIG. 18. The CLK signal is used to clock a series of D-type flip-flops 580, 582, 584, 586 and 588. The CLK signal is also provided to an inverter 590 whose output is connected to the clocking input of a D-type flip-flop 592. The RSTI, signal is provided through two inverters 594 and 596 to the inverted clear inputs of the flip-flops 580–588 and 592. The D input to the flip-flop 580 is provided by the output of a two input AND gate 598. One input of the AND gate 598 is provided by the inverted output of the flip-flop 584 while the other input to the AND gate 598 is provided by the output of an inverter 600, whose input is connected to the inverted output of the flip-flop 586. The noninverted output of the flip-flop 580 is provided as one input to a 2 input AND gate 602 whose second input is the output of the inverter 600. The output of the AND gate 602 is provided to the D input of a the flip-flop 582, whose noninverted output is connected to the one input of a 2 input AND gate 604. The second input of the AND gate 604 is provided by the connected to the inverter 600. The output of the AND gate 604 is connected to the D input of the flip-flop 584. The noninverted output of the flip-flop 584 is connected to one input of a 2 input NAND gate 606.

The other input of the NAND gate 606 is connected to the output of the inverter 600. The output of the NAND gate 606 is provided to the D input of the flip-flop 586. The noninverted output of the flip-flop 586 is the CHCLK signal.

Figure 7:
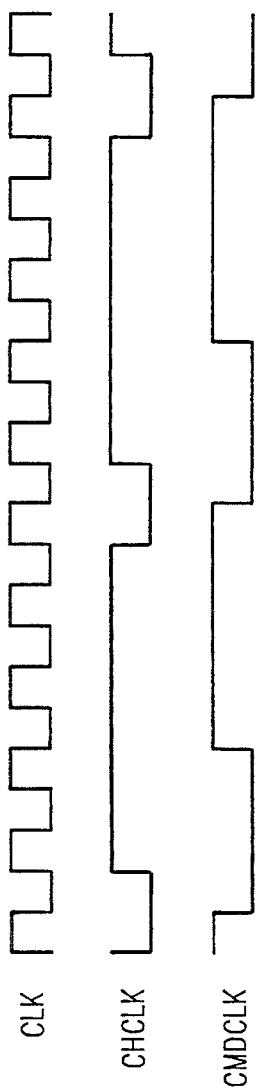
FIG. 7 is a timing diagram of portions of the circuitry of the transfer controller of FIG. 1.

The output of the inverter 600 is also provided to the D input of the flip-flop 588. The noninverted output of the flip-flop 588 is provided as one input to a 2 input AND gate 608, the other input of which receives the output of the inverter 600. The output of the AND gate 608 is provided to the D input of the flip-flop 592. The output of the flip-flop 592 is the CMDCLK signal. The various wave forms of the CLK, CHCLK and CMDCLK signals are shown in FIG. 7. Thus it can be seen that the CHCLK signal divides the CLK signal by 5, in the preferred embodiment to approximately a 4 MHz signal. The CMDCLK signal has a rising edge 1½ CLK signal cycles after the rising edge of the CHCLK signal and a falling edge ½ CLK signal cycle before the next rising edge of the CHCLK signal. In this way the CMDCLK signal is used to gate command strobes to the disk drives and insure that the command signal is present sufficiently after a settling time and is removed prior to the next requestor being given control of the disk channel.

Figure 17A:
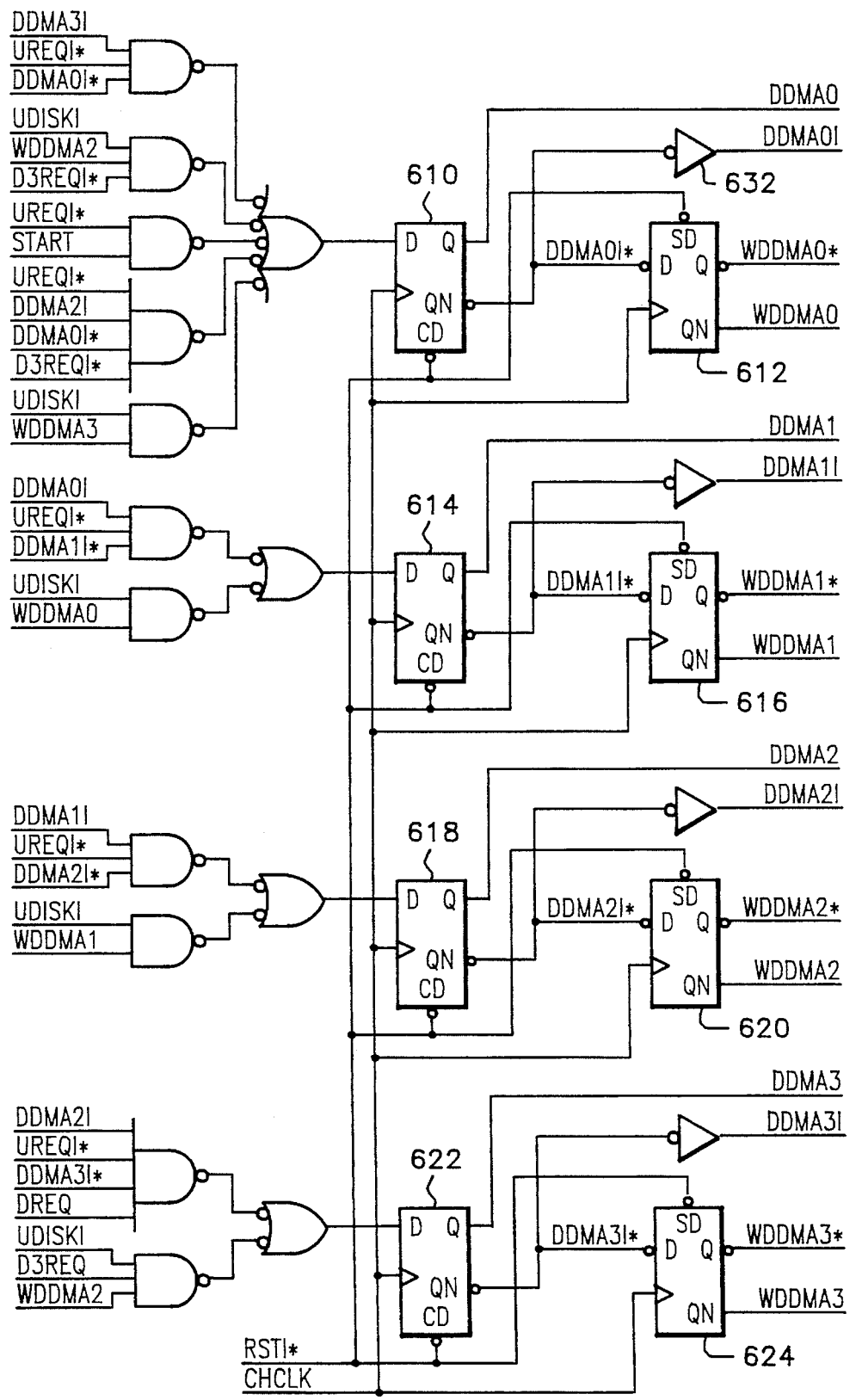

The disk controller state machine 552 is shown in detail in FIG. 17. The state machine 552 controls which of the disk channels 84–90 or local processor 30 has access to the disk array A. In general, the disk channel 0–3 or 84, 86 and 88 are rotated so that a different channel has access every 250 nsec in the preferred embodiment. This is because the cycle time of the particular disk drive is 750 nsec and thus by providing this rotation the drives can be accessed in an interleaved fashion without over stepping the response times or turnaround times of a single drive. If the parity channel 90 is also transferring information then a four way rotation is used. If the local processor 30 desires to transfer information with one of the disk drives in the array A, then the local processor 30 has priority and is inserted into the next available slot in the rotation and the rotation of the disk DMA channels 84–90 is delayed one slot. A series of four paired flip-flops 610 and 612, 614 and 616, 618 and 620 and 622 and 624 are used to determine the present and previous disk DMA channel 84–90 having access to the disk array A. A single flip-flop 626 is used to indicate that the local processor 30 is requesting access to the array A. The flip-flops 610–626 are all clocked by the CHCLK signal.

The UREQ signal is connected to an inverter 628 whose output is the UREQI, signal. Additionally, the UREQ signal is provided as one input to a 2 input AND gate 630 whose output is connected to the D input of the flip-flop 626. The inverted output of the flip-flop 626 is connected to the second input of the AND gate 630 so that the local processor 30 can only obtain 1 access to the disk array A in succession. The noninverting output of the flip-flop 626 is the UDISK signal, while the inverted output is also connected to the input of an inverter 632 whose output is the UDISKI signal. Various combinatorial logic is provided to the D inputs of the flip-flops 610, 614, 618 and 622 to advance the state machine to the appropriate DMA channel. The logic equations are as follows:

D_DDMA0 = DDMA3 · UREDI* · DDMA0I* +
UREQI* · DDMA2I · DDMA0I* · D3REQI* +
UDISKI · WDDMA3 +
UDISKI · WDDMA2 · D3REQI* +
UREQI* · START

-continued

D_DDMA1 = DDMA0I · UREQI* · DDMA1I* +
UDISKI · WDDMA0

D_DDMA2 = DDMA1I · UREQI* · DDMA2I* +
UDISKI · WDDMA1

D_DDMA3 = DDMA2I · UREQI* · DDMA3I* · D3REQ +
UDISKI · D3REQ · WDDMA2

The first term in the input equation for the flip-flop 610, the D_DDMA0 equation, is used in a normal rotation from the parity channel 90 to the disk channel 84. The second term is used to rotate from the third disk channel 88 to the first disk channel 84 if the parity channel 90 is not requesting a transfer. Both of these two terms are dependent upon the local processor 30 not requesting transfer. The third and fourth terms of the equation are used to rotate if the local processor 30 was the last user of the disk array A. The final term is used upon system reset to start the rotation.

The equations for the second and third DMA channels, the D_DDMA1 and D_DDMA2 equations, are less complex in that the first term relates to the rotation from the previous channel if the local processor 30 is not requesting the channel and the second term is used if the local processor 30 was the last user of the channel. The final equation is used for passing control to the parity channel 90 and is the D_DDMA3 equation. There are two additional qualifiers in each term and indicate that the parity channel 90 must actually be requesting a transfer otherwise it is not included in the rotation.

An exemplary transfer in flip-flop 610 and 612 pair will be illustrated and described, with the signal transfers for the other three channels being identical. The output of the flip-flop 610 is the DDMA0 channel indicating that disk channel 84 is the channel having control of the disk array A. The inverting output of the flip-flop 610 is provided an inverter 632 whose output is the DDMA0I signal. The inverting output of the flip-flop 610 is also connected to the inverting input of the flip-flop 612. The inverting output of the flip-flop 612 is the WDDMA0, signal while the noninverted output is the WDDMA0 signal. Thus it can be seen that there is a one channel slot delay between the flip-flops 610 and 612, so that the previous state is stored and a rotation can properly continue when the local processor 30 has interrupted the rotation. The RSTI* signal is provided to the clear input of the flip-flop 610 and the set input of the flip-flop 612.

The START signal is provided as the output of a 2 input NOR gate 634. One input of the NOR gate 634 is provided by the output of a 4 input NAND gate 636. The DDMA0I*, DDMA1I*, DDMA2I*, and DDMA3I* signals are the inputs to the NAND gate 636. The second input to the NOR gate 634 is provided by the output of a four input NAND gate 638. The four inputs to the NAND gate 638 are the WDDMA0*, WDDMA1*, WDDMA2* and WDDMA3* signals. Thus the start signal is active only when the system has just been reset.

Figure 19:
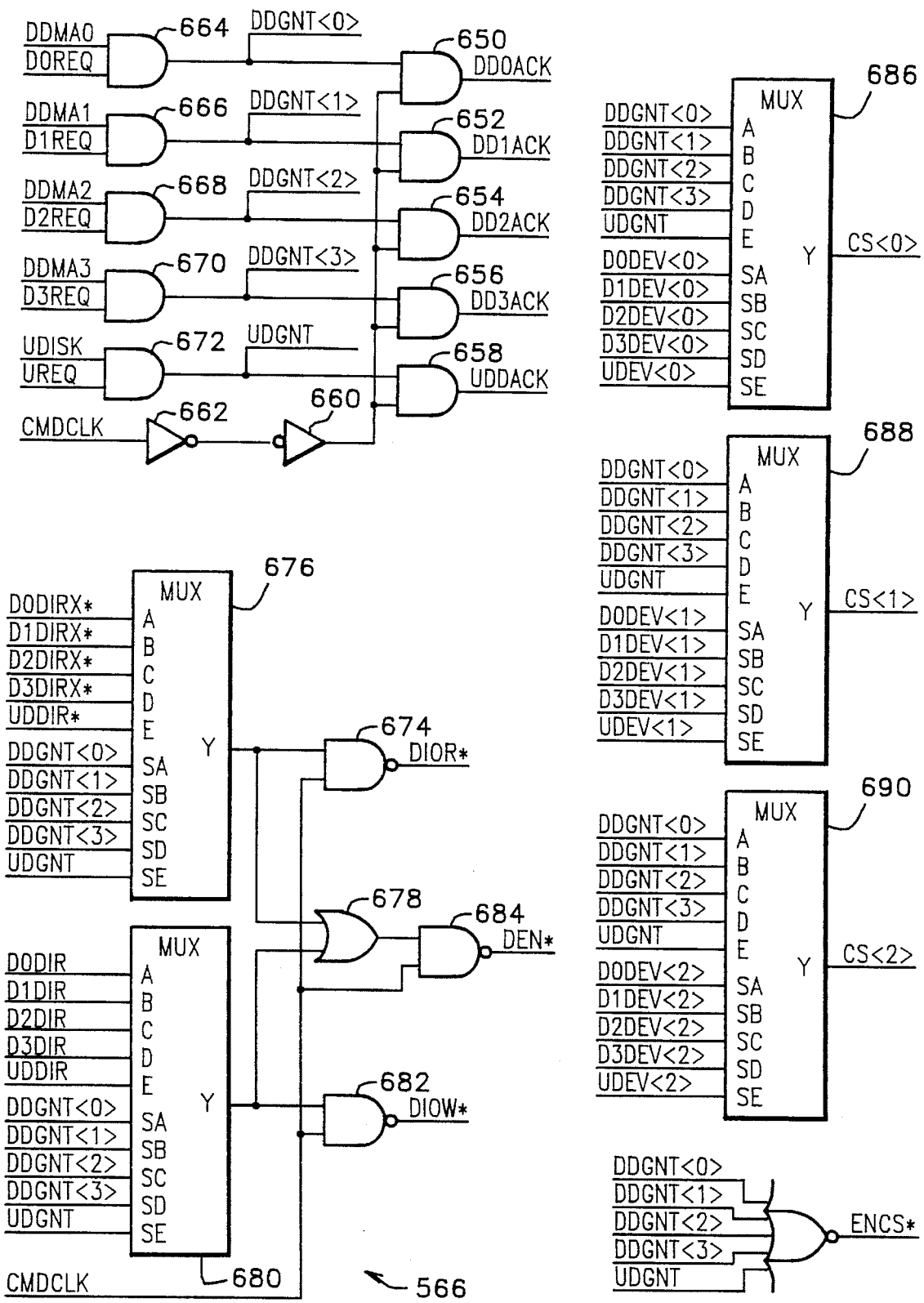

The multiplexer 566 is shown in detail in FIG. 19. The five disk requestor acknowledge signals are developed by the outputs of five AND gates 650, 652, 654, 656 and 658. One input to each of the AND gates 650–658 is provided by the output of an inverter 660, whose input is connected to the output of a previous inverter 662, whose input is connected to the CMDCLK signal. The second input to the AND gate 650, whose output is the DDOACK signal for DMA/disk channel 0 or 84, is connected to the output of a 2 input AND gate 664. The output of the AND gate 664 is the DDGNT<0> signal and the inputs are the DDMA0 and DOREQ signals. Thus when the state machine is in a state such that disk channel 84 is accessed and it is requesting data, then a grant signal is indicated and an acknowledgement is prepared.

The input to the AND gate 652, whose output is the DD1ACK signal is provided by the output of a 2 input AND gate 666 whose output is the DDGNT<1> signal and whose inputs are the DDMA1 and D1REQ signals. A two input AND gate 668 has inputs of the DDMA2 and D2REQ signals and has an output signal which is referred to as the DDGNT<2> signal and is connected to the second input of the AND gate 654 which produces the DD2ACK signal. A two input AND gate 670 has input signals of the DDMA3 and D3REQ signals, and an output of the DDGNT<3> signal, which is connected to the second input of the AND gate 656, whose output is referred to as the DD3ACK signal. A two input AND gate 672 has inputs of the UDISK and UREQ signals to indicate that the local processor 30 is requesting access and has received a slot. The output of the AND gate 672 is the UDGNT signal and is connected to the second input of the AND gate 658, whose output is referred to as the UDDACK signal to indicate that the local processor disk acknowledge has been granted.

Two signals DIOR* and DIOW*, the read and write strobes to the disk drives, and a signal referred to as DEN*, the enable signal for the disk drives are produced using the CMDCLK signal. The DIOR* signal is produced as the output of a 2 input NAND gate 674. One input to the NAND gate 674 is the CMDCLK signal and the other input is the output of a 5 to 1 multiplexer 676. The inputs to the multiplexer 676 are the direction signals for the various disk channels and local processor disk request channel, with the selection being based on which channel is granted access. The output of the multiplexer 676 is also provided as one input to a 2 input OR gate 678. The second input to the OR gate 678 is provided by the output of a second multiplexer 680 which has inputs of the inverses of the direction signals of the five particular disk requestors, with the multiplexer selection being based on the grant signals. The output of the multiplexer 680 is also provided as one input to a 2 input NAND gate 682. The other input to the NAND gate 682 is provided by the CMDCLK signal. The output of the NAND gate 682 is the DIOW* signal. The CMDCLK signal is provided as one input to a 2 input NAND gate 684 whose other input receives the output of the OR gate 678. The output of the NAND gate 684 is the DEN, signal.

Three 5 to 1 multiplexers 686, 688 and 690 are used to multiplex the desired device code for the particular disk channel requester. The five grant signals are provided as the select inputs to the multiplexers 686–690, with the three bit of the device codes as the data inputs. The outputs, the CS<2 . . 0> signals, are supplied to three to eight decoders (not shown) which provide a low true signal to allow accessing of the proper disk drive which has been selected by the particular channel during its phase.

Figure 20:
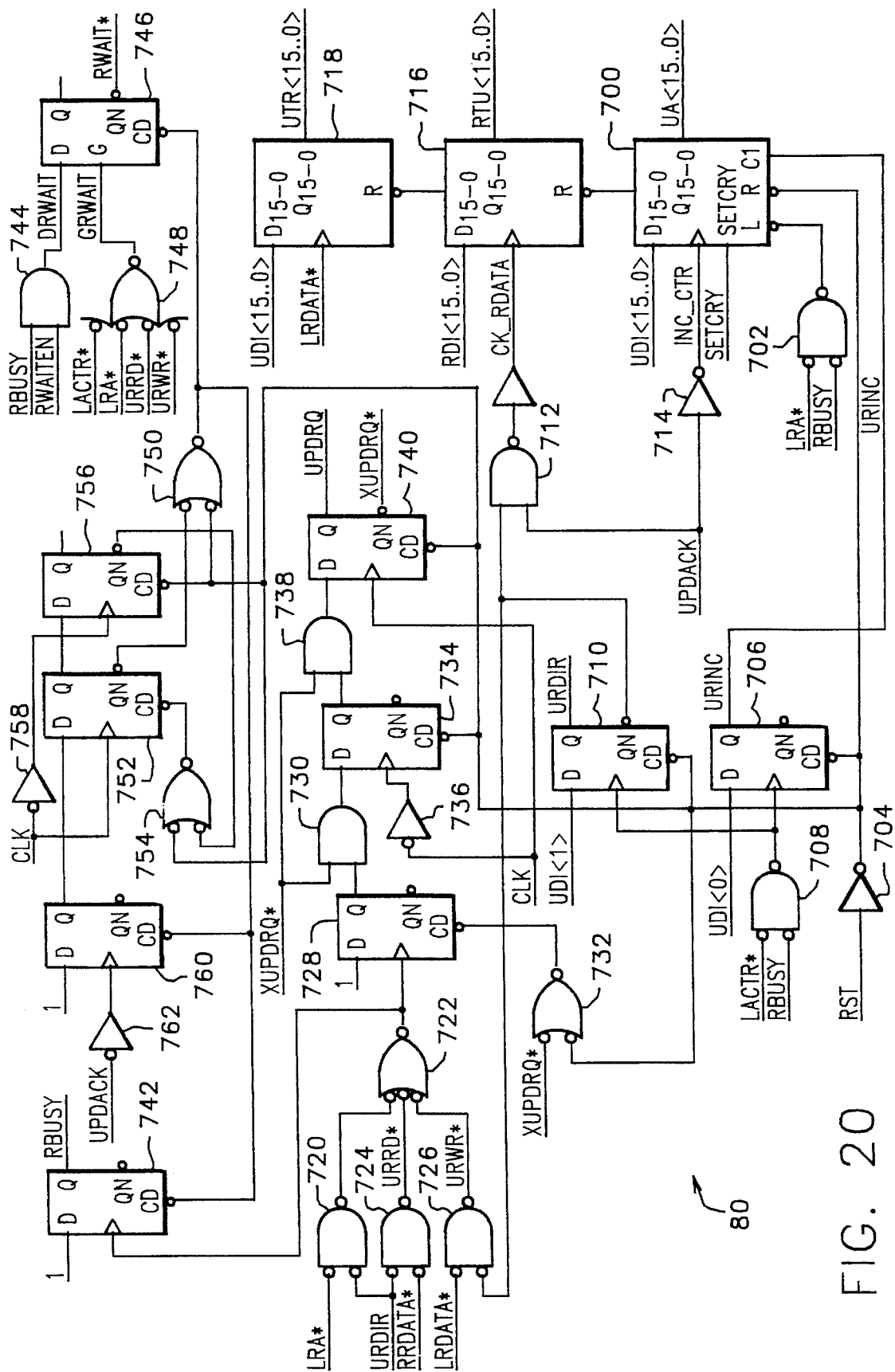

The local processor RAM DMA channel 80 is partially shown in FIG. 20. The RAM address for the data for which the local processor 30 is requesting a transfer is stored in a 16 bit up counter 700. The 16 bits of the local processor data line UDI<15 . . 0> are provided to the D inputs of the counter 700, with the inverted load input being connected to the output of a 2 input OR gate 702. One input to the OR gate 702 is the RBUSY signal. The second input is the LRA, signal which is provided based on the address decode and timing signals in the local processor control bus UC. The inverted reset input of the counter 700 is provided by the output of a inverter 704 whose input is connected to the RST signal. The count input of the counter 700 is connected to the output of a D-type flip-flop 706. The input of the D-type flip-flop 706 is connected to bit zero of the internal version of the local processor data bus UDI<0>. The clocking input to the flip-flop 706 is provided by the output of a 2 input OR gate 708. One input to the OR gate 708 is the RBUSY signal, while the other input is the LRCTR* signal. The LRCTR* signal is active low when the local processor 30 is accessing the direct to RAM control register. Thus the counter 700 can be set to repeatedly access the same address or can increment to provide a full transfer of information.

A D-type flip-flop 710 has its D input connected to the UDI<1> signal and its clock input connected to the output of the OR gate 708. The noninverted output of the flip-flop 710 is the URDIR signal, which is the direction signal for the transfer with the local processor 30. The inverted output of the flip-flop 710 is provided as one input to a 2 input NAND gate 712. The second input to the NAND gate 712 is the UPDACK signal, which is also provided to the input of an inverter 714. The output of the inverter 714 is connected to the clocking input of the counter 700 so that the counter 700 is clocked each time the local processor 30 receives a slot to access the transfer buffer memory 46. The output of the NAND gate 712 is buffered and provided to the clocking input of a 16 bit flip-flop 716. The flip-flop 716 is used to receive data from the transfer buffer RAM 46 and provide it to the local processor 30. To this end the D inputs of the flip-flop 716 are connected to the transfer buffer RAM data bus RDI<15 . . 0> and the outputs of the flip-flop 716 are connected to a multiplexer which provides data to the local data bus LD. The multiplexer is used to provide data to the local processor 30 because the local processor 30 can, in addition to receiving data through this from the transfer buffer RAM 46 or the disk array A, also read the registers contained in the transfer controller 44. As a result, a great number of data signals must be multiplexed to the local processor 30.

Data to be presented to the transfer buffer RAM 46 from the local processor 30 is stored in a 16 bit flip-flop 718. The clocking signal for the flip-flop 718 is the LRDATA* signal, which is an address decode based on the local processor 30 accessing this register. The D inputs to the flip-flop 718 are connected to the 16 bits of the local processor data bus UDI, while the 16 bits of output are connected to the multiplexer which provides data to the transfer buffer RAM 46.

The LRA, signal is provided as one input to a 2 input OR gate 720. The other input to the OR gate 720 is provided by the URDIR signal. The output of the OR gate 720 is provided as one input to a 3 input AND gate 722. The second input of the AND gate 722 is provided by the output of a 2 input OR gate 724. The two inputs to the OR gate 724 are the URDIR signal and the RRDATA* signal, which indicates that the local processor 30 is reading information provided from the transfer buffer RAM 46 and stored in the flip-flop 716. The third input to the AND gate 722 is provided by the output of a 2 input OR gate 726. One input to the OR gate 726 is the LRDATA* signal, while the second input is supplied by the inverted output of the flip-flop 710. When the local processor 30 writes an address, the LRA* signal is asserted and if the URDIR signal is configured for a read from the transfer buffer RAM 46, a pre-fetch request is generated.

The output of the AND gate 722 is connected to the clocking input of a D-type flip-flop 728. The D input of the flip-flop 728 is connected to a high signal level and the noninverted output is connected to one input of a 2 input AND gate 730. The second input to the AND gate 730 is the XUPDRQ* signal. The inverted clear input of the flip-flop 728 is provided by the output of a 2 input AND gate 732. One input to the AND gate 732 is the XUPDRQ, signal, while the other input is the output of the inverter 704 which indicates a system reset. The output of the AND gate 730 is provided to the D input of a D-type flip-flop 734. The clocking input of the flip-flop 734 is provided by the output of a inverter 736 whose input is connected to the CLK signal. The noninverted output of the flip-flop 734 is connected to one input of a 2 input AND gate 738, the other input of which receives the XUPDRQ* signal. The output of the AND gate 738 is connected to the D input of a D-type flip-flop 740 whose clocking input receives the CLK signal. The output of the flip-flop 740 is the UPDRQ signal, while the inverted output is the XUPDRQ, signal. The UPDRQ signal indicates that the local processor 30 has a pending request.

The output of the AND gate 722 is also provided to the clocking input of a D-type flip-flop 742. The D input of the flip-flop 742 is connected to a high logic level while the noninverting output is the RBUSY signal which is connected to one input of a 2 input AND gate 744. The second input of the AND gate 744 is the RWAITEN signal which indicates that this is one of the locations for which local processor 30 should be held if the operation is not ready for the actual operation of the local processor 30. The output of the AND gate 744 is provided to the D input of a latch 746. The gating input of the latch 746 is provided by the output of a 4 input AND gate 748. The four inputs to the AND gate 748 are the LRCTR, signal, the LRA, signal, the output of the OR gate 724 and the output of the OR gate 726. An inverted output of the latch 746 is the RWAIT* signal which places the local processor 30 in a not ready or wait state.

The inverted clear input of the latch 746 is provided by the output of a 2 input AND gate 750. The output of this AND gate 750 is also provided to the inverted clear input of the flip-flop 742. One input to the AND gate 750 is provided by the output of the inverter 704, while the other input is connected to the inverted output of a D-type flip-flop 752. The inverted clear input of the flip-flop 752 is connected to the output of a 2 input AND gate 754. One input to the AND gate 754 is connected to the output of the inverter 704 while the other input is connected to the inverted output of a D-type flip-flop 756. The clock input of the flip-flop 756 is connected to the output of an inverter 758 whose input is connected to the CLK signal. The clocking input of flip-flop 752 is connected to the CLK signal. The D input of the flip-flop 756 is connected to the noninverted output of the flip-flop 752, whose D input is connected to the noninverting output of a D-type flip-flop 760. The inverted clear input of the flip-flop 760 is connected to the output of the AND gate 750. The D input of the flip-flop 760 is connected to a high or logic level 1, while the clocking input is connected to the output of an inverter 762, whose input is connected to the UPDACK signal. The RWAIT* signal thus goes active when data is not yet available from the transfer buffer RAM 46 when reading or the previously written data has not yet been written and thus to prevent a overriding of data. Thus the local processor 30 has a direct access to the transfer buffer RAM 46.

Figure 21A:
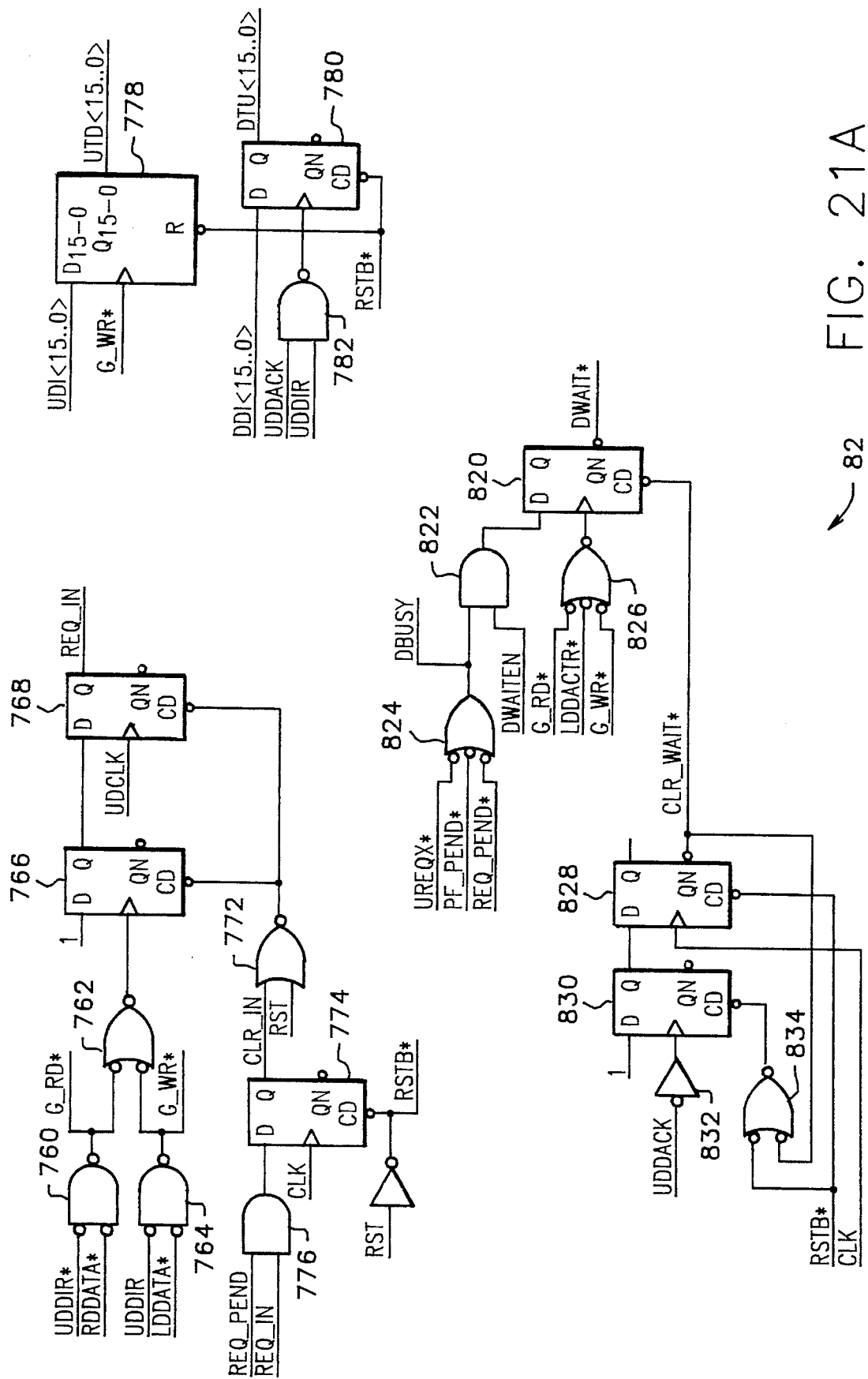
Figure 21B:
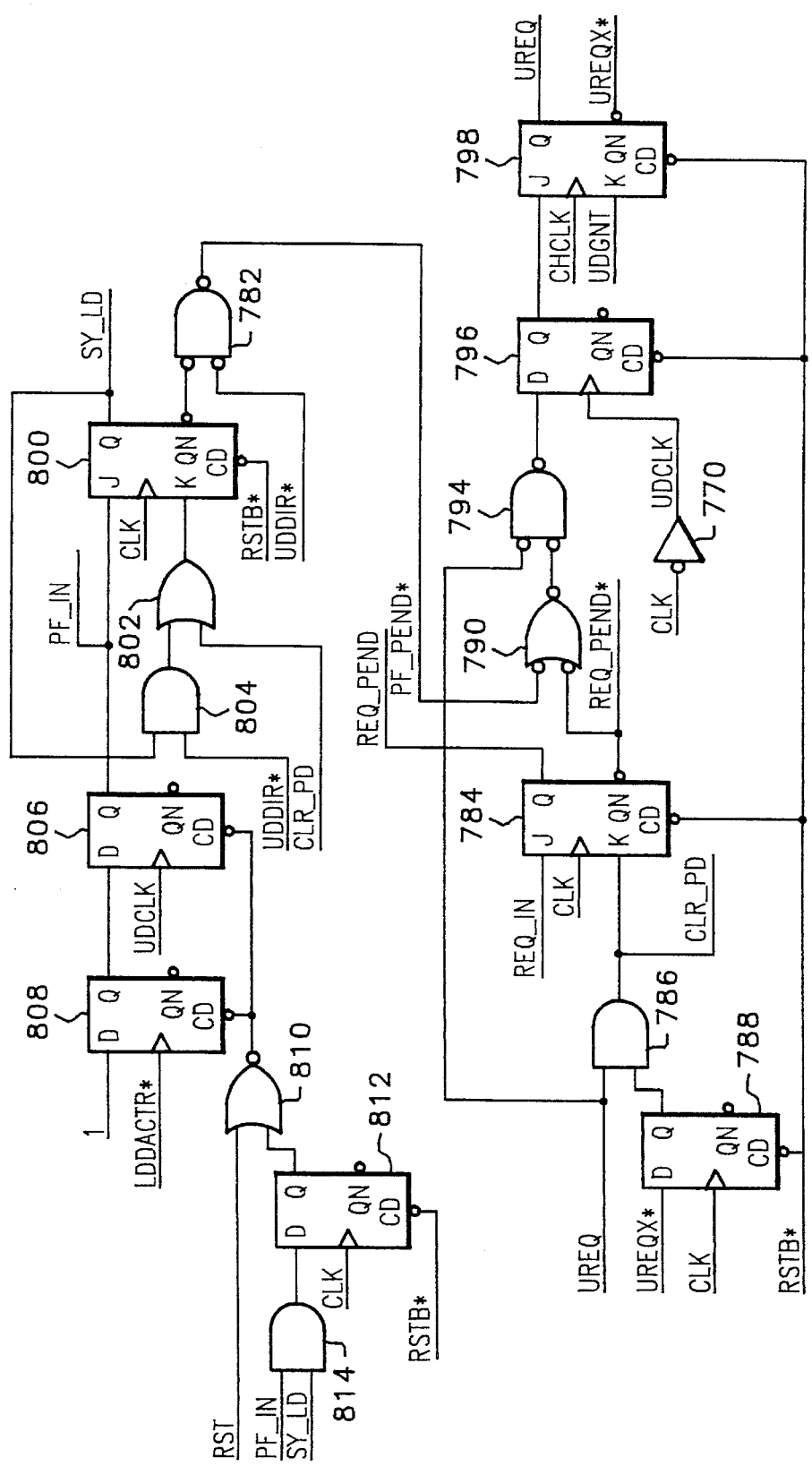

The local processor disk channel 82 is shown generally in FIG. 21. The local processor 30 can pass information directly to a register in the particular disk drive selected in the disk array A. The actual register to be selected and the disk drive to be selected is stored in a register located in the disk controller 72 as previously discussed. The UDDIR* signal, which indicates the inverse of the direction of the transfer, is provided to one input to a 2 input OR gate 760. The second input to the OR gate 760 is the RDDATA* signal, which indicates that a data read from the flip-flop 716 has been requested. The output of the OR gate 760 is the G_RD* signal which is provided to one input of a 2 input AND gate 762. The second input to the AND gate 762 is the G_WR, signal. The G_WR, signal is provided as the output of a 2 input OR gate 764. One input to the OR gate 764 is the UDDIR signal, while the other signal is the LDDATA* signal which indicates that data is being loaded into a flip-flop 778 for temporary storage before being be written to the disk array A. The output of the AND gate 762 is provided to the clocking input of a D-type flip-flop 766. The D input to the flip-flop 766 is connected to a high level while the noninverted output is connected to the D input of a D-type flip-flop 768. The clocking input to the flip-flop 768 is the UDCLK signal which is provided as the output of a inverter 770 whose input is the CLK signal. The inverted clear inputs of the flip-flop 766 and 768 are provided by the output of a 2 input NOR gate 772. One input to the NOR gate 772 is the RST signal while the other input is connected to the noninverting output of a D-type flip-flop 774. The inverted clear input to the flip-flop 774 is connected to the RSTB, signal which is low when the system is being reset. The clocking signal for the flip-flop 774 is the CLK signal, while the D input is connected to the output of a 2 input AND gate 776. One input to the AND gate 776 is the REQ_PEND signal which indicates that a request is pending, while the other input is the REQ_IN signal which indicates that request has been received. The REQ_IN signal is provided as the noninverting output of the flip-flop 768.

The 16 bit flip-flop 778 has as its input the 16 bits from the local process data bus UDI<15..0>. The clocking input to the flip-flop 778 is the G_WR, signal while the outputs are provided to the multiplexer which multiplexes data to the disk array A. Thus this is a register to which the local processor 30 writes data which is to be transferred to the disk array A.

A 16 bit flip-flop 780 is used to receive the data from the disk array A over the disk data bus DD, specifically the DDI<15..0> lines and to provide information from the noninverting outputs to the multiplexer which provides data to the local processor 30. The clocking input to the flip-flop 780 is connected to the output of a 2 input NAND gate 782. The inputs to the NAND gate 782 are the UDDACK signal and the UDDIR signal. Thus when a read request is pending and the local processor 30 receives its slot the data is stored in the register 784 pending reading by the local processor 30.

The REQ_IN signal is provided to the J input of the J-K flip-flop 784. The clocking signal for the flip-flop is provided by the CLK signal, while the K input receives the CLR_PD signal which is provided as the output of a 2 input AND gate 786. The inputs to the AND gate 786 are the UREQ signal, which indicates the local processor 30 request, and the noninverted output of a D-type flip-flop 788. The clocking signal for the flip-flop 788 is the CLK signal, while the D input receives the UREQX, signal. The noninverted output of the flip-flop 784 is the REQ_PEND signal which is provided to the input of the AND gate 776. The inverted output of the flip-flop 784 is the REQ_PEND, signal and is provided as one input of a 2 input AND gate 790. The second input is provided by the output of a 2 input OR gate 792 and is referred to as the PF_PEND, signal. The output of the AND gate 790 is provided to one input of a 2 input NOR gate 794. The second input to the NOR gate 794 is the UREQ signal. The output of the NOR gate 794 is connected to the D input of a D-type flip-flop 796. The output of the inverter 770 is connected to the clocking input of the flip-flop 796, whose inverted clear input is connected to the RSTB, signal. Additionally, the inverted clear inputs of the flip-flops 784 and 786 are also connected to the RSTB, signal. The noninverted output of the flip-flop 796 is provided to the J input of a J–K flip-flop 798. The clocking input to the flip-flop 798 is the CHCLK signal, so that requests are advanced based on a disk channel slot allocation. The K input to the flip-flop 798 is the UDGNT signal which indicates that access has been granted to the local processor 30. The inverted clear input to the flip-flop 798 receives the RSTB, signal. The noninverted output of the flip-flop 798 is the UREQ signal, while the inverted output is the REQX* signal.

The inputs to the 2 input OR gate 792 are the UDDIR* signal and the inverted output of a J–K flip-flop 800. The inverted clear input to the flip-flop 800 receives the RSTB, signal, while the clocking input receives the CLK signal. The K input to the flip-flop 800 is connected to the output of a 2 input OR gate 802. One input to the OR gate 802 is the CLR_PD signal, which is the output of the AND gate 786. The second input to the OR gate 802 is the output of a two input AND gate 804. One input to the AND gate 804 is the UDDIR* signal, while the other input is connected to the noninverting output of the flip-flop 800, which is referred to as the SY_LD signal. The J input to the flip-flop 800 receives the PF_IN signal which is provided by the noninverting output of a D-type flip-flop 806. The clocking signal for the flip-flop 806 is the UDCLK signal while the D input is connected to the noninverted output of a D-type flip-flop 808. The D input of the flip-flop 808 is connected to a logic level high signal while the clocking input is connected to the LDDACTR* signal which is an indication that the processor has loaded a device address into the register in the disk controller 72. The inverted clear inputs of the flip-flops 806 and 808 are provided by the output of a 2 input NOR gate 810. One input of the NOR gate 810 receives the RST signal while the other input is connected to the output of a D-type flip-flop 812. The inverted clear input to flip-flop 812 receives the RSTB* signal, while the clocking input is connected to the CLK signal. The D input of the flip-flop 812 is connected to the output of a 2 input AND gate 814. The inputs to the AND gate 814 are the PF_IN signal and the SY_LD signal.

A wait signal is also produced by the local processor disk channel 82 so that should the local processor 30 try to access the data ports 778 and 780 before the data has obtained or before it is written to the disk array A, the processor 30 is held until the previous operation is completed so that valid data is ready or valid data is not over written. The DWAIT* signal is produced at the inverting output of a latch 820. The D input to the latch 820 is connected to the output of a 2 input AND gate 822. One input to the AND gate 822 is the DWAITEN signal which indicates that the local processor 30 is trying to access one of the two data registers 780 or 778. The second input to the AND gate 822 is the DBUSY signal which is produced as the output of a three input NAND gate 824. The three inputs to the NA3D gate 824 are the UREQX* signal, the PF_PEND* signal, and the REQ_PEND* signal. The gating input of the latch 820 is connected to the output of a three input AND gate 826. The three inputs to the AND gate 826 are the G_RD* signal, the LDDACTR* signal and the G_WR, signal. Therefore the output of the latch 820 is active whenever an access is made to one of the registers associated with the disk channel 82.

The inverted clear input to the latch 820 is provided by the inverted output of a D-type flip-flop 828. The inverted clear input to the flip-flop 828 is connected to the RSTB, signal, while the clocking input receives the CLK signal. The D input of the flip-flop 828 is connected to the noninverted output of a D-type flip-flop 830. The D input of the flip-flop 830 is connected to a logic level high signal with a clocking input provided by the output of an inverter 832 whose input receives the UDDACK signal. The inverted clear input of the flip-flop 830 is provided by the output of a 2 input AND gate 834. One input to the AND gate 834 is the RSTB* signal, with the other input connected to the inverting output of the flip-flop 828, the signal being referred to as the CLR_WAIT* signal. Thus the wait state cleared whenever the disk array and disk controller have accessed the particular data port of interest.

The detailed schematics of the BMIC channel 76 and the compatibility port channel 78 have not been provided but based on the indicated and provided schematics and details relating to the particular bus master interfaces similar DMA controller channel and logic can be readily developed.

Figure 22:
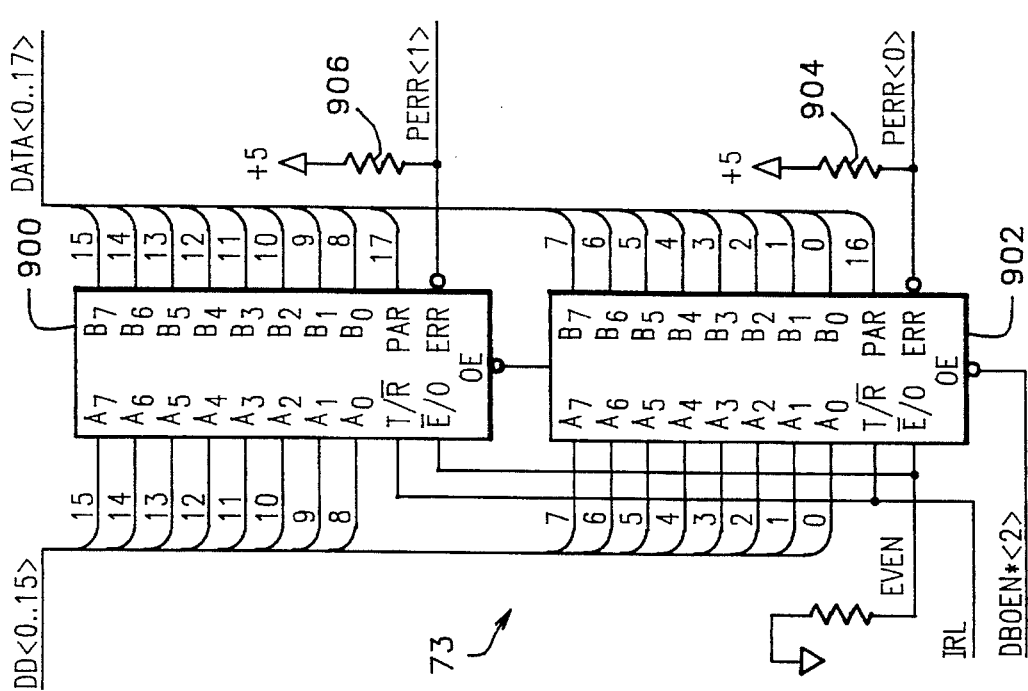

Referring now to FIG. 22, the buffer 73 is shown in more detail. The buffer 73 includes two 8 bit parity generator/checker transceivers 900 and 902. The direction inputs of the parity checkers 900 and 902 provided by the IRL or READ signal on the DAC bus. One port of the transceivers 900 and 902 receives the DD<0..15> signals while the other port receives the DATA<0..17> signals. The DATA bus is an internal data bus used to connect the posted write memory 71 to the DD bus. Preferably the posted write memory 71 is contained on a daughterboard or module which connects to the disk controller D, so that it is available as an option. Bit positions 16 and 17 of the DATA bus are the two particular parity bits utilized in conjunction with this bus. The inverted parity error outputs of the transceivers 900 and 902 are referred to as the PERR<1> and PERR<0> signals, respectively, which are pulled up by resistors 904 and 906. These signals then indicate, when low, that parity errors have developed during read operations over the DATA bus.

FIG. 23 illustrates a six bit D-type flip-flop 908 utilized in the disk controller D to select which of the various disk channels the posted write memory 71 replaces. In the preferred embodiment as shown in FIG. 1 the transfer controller 44 provides 8 disk channels for data transfer. However, this presents a problem when 8 disk drives in an array A are actually utilized in addition to the posted write memory 71, all of which are coupled to the disk channel. To resolve this problem, the posted write memory 71 is designed to replace, on a selective basis, one of the actual disk units in the array A, without requiring the knowledge of this replacement by the transfer controller 44, so that then the local processor 30 need only indicate to the transfer controller 44 to use a particular selected device on the disk channel, with the replacement actually being made on the DAC bus itself. In this manner the transfer controller 44 need not be redesigned. However, if desired, it is of course understood that a ninth channel could be readily added to the transfer controller 44 to provide a specific channel for the posted write memory 71.

The flip-flop 908 is connected to the LD<5..0> signals to receive six bits of data from the local processor 30. The clock input to the flip-flop 908 is provided by the output of a two input OR gate 910, one of whose inputs is the IOW, signal and the other of which is the CACHECF, signal. The IOW, signal goes low to indicate input/output write operations of the local processor 30 and the CACHECF, signal goes low when the flip-flop 908 is addressed. Therefore, when both CACHECF* and IOW* signals go low to indicate an access to the flip-flop 908, on the rising edge the data is latched in. The inverted clear input to the flip-flop 908 is connected to the RST* signal. The outputs of the flip-flop 908 are the CLRERR* signal, which is used to clear parity error indications from the posted write memory 71; the CACHE_FAILED signal, which is used to drive an LED present on the disk controller D to allow the local processor 30 to visually indicate a failure; the CACHE_EN signal, which indicates that the cache or posted write memory 71 system is enabled; and three bits of a bus referred to as the CACHE_ASGN or cache assigned bus which determines which of the particular 8 disk channels the posted write memory 71 is to replace.

Figure 24:
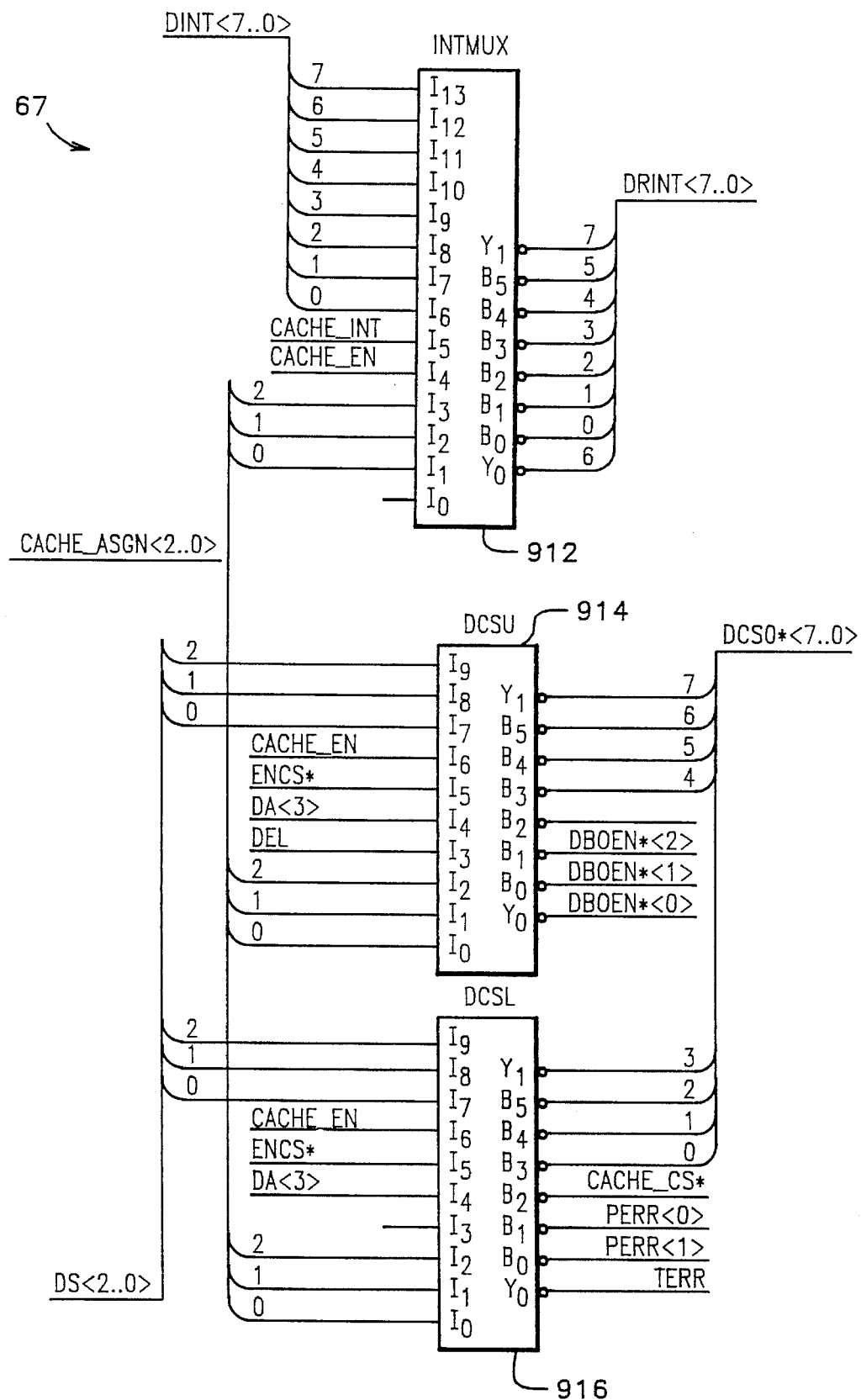

FIG. 24 illustrates three specific PAL devices used to form the PAL block 67 which changes the various control signals in the DAC bus as necessary to allow inclusion of the posted write memory 71 as an extra disk device. A first PAL 912 is used to interleave the interrupt signal received from the posted write memory 71, which indicates completion of an operation, with the various interrupts coming from the disk array A. To this end the DINT<7..0> signals from the disk drives, a signal referred to as the CACHE_INT or posted write memory 71 interrupt signal, the CACHE_EN signal and the CACHE_ASGN<2..0> signals are provided to the PAL 912. The outputs of the PAL 912 are the DRINT*<7..0> signals which are provided to the transfer controller 44 to indicate the actual interrupts for the desired or appropriate channel. The equations of the PAL 912 is as shown below:

```
DRINT<0> =   CACHE_ASGN<2>* · CACHE_ASGN<1>* ·
             CACHE_ASGN<0>* · CACHE_EN ·
             CACHE_INT* + CACHE_EN* ·
             DINT<0>* + CACHE_EN ·
             CACHE_ASGN<0> ·
             DINT<0>* + CACHE_EN ·
             CACHE_ASGN<1> · DINT<0>* +
             CACHE_EN · CACHE_ASGN<2> ·
             DINT<0>* + DINT<0>* · CACHE_INT*
DRINT<1> =   CACHE_ASGN<2>* · CACHE_ASGN<1>* ·
             CACHE_ASGN<0> · CACHE_EN ·
             CACHE_INT* + CACHE_EN* ·
             DINT<1>* + CACHE_EN ·
             CACHE_ASGN<0>* ·
             DINT<1>* + CACHE_EN ·
             CACHE_ASGN<1> ·
             DINT<1>* + CACHE_EN ·
             CACHE_ASGN<2> · DINT<1>* +
             DINT<1>* · CACHE_INT*
DRINT<2> =   CACHE_ASGN<2>* · CACHE_ASGN<1> ·
             CACHE_ASGN<0>* · CACHE_EN ·
             CACHE_INT* + CACHE_EN* ·
             DINT<2>* + CACHE_EN ·
             CACHE_ASGN<0> · DINT<2>* +
             CACHE_EN · CACHE_ASGN<1>* ·
             DINT<2>* + CACHE_EN ·
             CACHE_ASGN<2> · DINT<2>* +
             DINT<2>* · CACHE_INT*
DRINT<3> =   CACHE_ASGN<2>* · CACHE_ASGN<1> ·
             CACHE_ASGN<0> · CACHE_EN ·
             CACHE_INT* + CACHE_EN* ·
             DINT<3>* + CACHE_EN ·
             CACHE_ASGN<0>* · DINT<3>* +
             CACHE_EN · CACHE_ASGN<1>* ·
             DINT<3>* + CACHE_EN ·
             CACHE_ASGN<2> · DINT<3>* +
             DINT<3>* · CACHE_INT*
DRINT<4> =   CACHE_ASGN<2> · CACHE_ASGN<1>* ·
             CACHE_ASGN<0>* · CACHE_EN ·
             CACHE_INT* + CACHE_EN* ·
             DINT<4>* + CACHE_EN ·
             CACHE_ASGN<0> · DINT<4>* +
             CACHE_EN · CACHE_ASGN<1> ·
             DINT<4>* + CACHE_EN ·
             CACHE_ASGN<2>* · DINT<4>* +
             DINT<4>* · CACHE_INT*
DRINT<5> =   CACHE_ASGN<2> · CACHE_ASGN<1>* ·
             CACHE_ASGN<0> · CACHE_EN ·
             CACHE_INT* + CACHE_EN* ·
             DINT<5>* + CACHE_EN ·
             CACHE_ASGN<0>* · DINT<5>* +
             CACHE_EN · CACHE_ASGN<1> ·
             DINT<5>* + CACHE_EN ·
             CACHE_ASGN<2>* · DINT<5>* +
             DINT<5>* · CACHE_INT*
DRINT<6> =   CACHE_ASGN<2> · CACHE_ASGN<1> ·
             CACHE_ASGN<0>* · CACHE_EN ·
             CACHE_INT* + CACHE_EN* ·
             DINT<6>* + CACHE_EN ·
             CACHE_ASGN<0> · DINT<6>* +
             CACHE_EN · CACHE_ASGN<1>* ·
             DINT<6>* + CACHE_EN ·
             CACHE_ASGN<2>* · DINT<6>* +
             DINT<6>* · CACHE_INT*
DRINT<7> =   CACHE_ASGN<2> · CACHE_ASGN<1> ·
             CACHE_ASGN<0> · CACHE_EN ·
             CACHE_INT* + CACHE_EN* ·
             DINT<7>* + CACHE_EN ·
             CACHE_ASGN<0>* · DINT<7>* +
             CACHE_EN · CACHE_ASGN<1>* ·
             DINT<7>* + CACHE_EN ·
             CACHE_ASGN<2>* · DINT<7>* +
             DINT<7>* · CACHE_INT*
```

TWO other PALs 914 and 916 are used to interleave the posted write memory 71 to the appropriate drive select signals, to develop the various output enable signals for the buffers 48, 50 and 73 and to develop the posted write memory read parity error signal. A first PAL 914 receives the CACHE ASGN<2..0> signals; the CACHE_EN signal;

the ENCS* signal, which indicates that the device select signals are active; the DA<3> signal, which when high indicates a high order command type in the IDE protocol; the DEL signal which indicates that a data transfer over the DD bus is occurring; and the DS<2..0> or 3 bits of the drive select signals from the transfer controller 44. The PAL 914 then Provides the DCSO*<7..4> signals or the top four device signals and the DBOEN*<2..0> or output enable signals for the buffers 73, 50 and 48, respectively. The equations of the PAL 914 are shown below:

DCSO<7> =  DS<2> · DS<1> · DS<0> · CACHE_EN* · ENCS · DA3* +
           DS<2> · DS<1> · DS<0> · CACHE_EN · CACHE_ASGN<2>* · ENCS · DA3* +
           DS<2> · DS<1> · DS<0> · CACHE_EN · CACHE_ASGN<1>* · ENCS · DA3* +
           DS<2> · DS<1> · DS<0> · CACHE_EN · CACHE_ASGN<0>* · ENCS · DA3*

DCSO<6> =  DS<2> · DS<1> · DS<0>* · CACHE_EN* · ENCS · DA3* +
           DS<2> · DS<1> · DS<0>* · CACHE_EN · CACHE_ASGN<2>* · ENCS · DA3* +
           DS<2> · DS<1> · DS<0>* · CACHE_EN · CACHE_ASGN<1>* · ENCS · DA3* +
           DS<2> · DS<1> · DS<0>* · CACHE_EN · CACHE_ASGN<0> · ENCS · DA3*

DSCO<5> =  DS<2> · DS<1>* · DS<0> · CACHE_EN* · ENCS · DA3* +
           DS<2> · DS<1>* · DS<0> · CACHE_EN · CACHE_ASGN<2>* · ENCS · DA3* +
           DS<2> · DS<1>* · DS<0> · CACHE_EN · CACHE_ASGN<1> · ENCS · DA3* +
           DS<2> · DS<1>* · DS<0> · CACHE_EN · CACHE_ASGN<0>* · ENCS · DA3*

DSCO<4> =  DS<2> · DS<1>* · DS<0>* · CACHE_EN* · ENCS · DA3* +
           DS<2> · DS<1>* · DS<0>* · CACHE_EN · CACHE_ASGN<2>* · ENCS · DA3* +
           DS<2> · DS<1>* · DS<0>* · CACHE_EN · CACHE_ASGN<1> · ENCS · DA3* +
           DS<2> · DS<1>* · DS<0>* · CACHE_EN · CACHE_ASGN<0> · ENCS · DA3*

DBOEN<2> = DS<2>* · DS<1>* · DS<0> · CACHE_EN · CACHE_ASGN<2>* · CACHE_ASGN<1>* · CACHE_ASGN<0> · DEL · ENCS +
           DS<2>* · DS<1> · DS<0>* · CACHE_EN · CACHE_ASGN<2>* · CACHE_ASGN<1> · CACHE_ASGN<0>* · DEL · ENCS +
           DS<2>* · DS<1> · DS<0> · CACHE_EN · CACHE_ASGN<2>* · CACHE_ASGN<1> · CACHE_ASGN<0> · DEL · ENCS +
           DS<2> · DS<1>* · DS<0>* · CACHE_EN · CACHE_ASGN<2> · CACHE_ASGN<1>* · CACHE_ASGN<0>* · DEL · ENCS +
           DS<2> · DS<1>* · DS<0> · CACHE_EN · CACHE_ASGN<2> · CACHE_ASGN<1>* · CACHE_ASGN<0> · DEL · ENCS +
           DS<2> · DS<1> · DS<0>* · CACHE_EN · CACHE_ASGN<2> · CACHE_ASGN<1> · CACHE_ASGN<0>* · DEL · ENCS +
           DS<2> · DS<1> · DS<0> · CACHE_EN · CACHE_ASGN<2> · CACHE_ASGN<1> · CACHE_ASGN<0> · DEL · ENCS

DBOEN<1> = DS<2> · CACHE_EN* · DEL · ENCS +
           DS<2> · CACHE_EN · CACHE_ASGN<2>* · DEL · ENCS +
           DS<2> · DS<1> · CACHE_EN · CACHE_ASGN<1>* · DEL · ENCS +
           DS<2> · DS<0> · CACHE_EN · CACHE_ASGN<0>* · DEL · ENCS +
           DS<2> · DS<1>* · CACHE_EN · CACHE_ASGN<1> · DEL · ENCS +
           DS<2> · DS<0>* · CACHE_EN · CACHE_ASGN<0> · DEL · ENCS

DBOEN<0> = DS<2>* · CACHE_EN* · DEL · ENCS +
           DS<2>* · CACHE_EN · CACHE_ASGN<2> · DEL · ENCS +
           DS<2>* · DS<1> · CACHE_EN · CACHE_ASGN<1>* · DEL · ENCS +
           DS<2>* · DS<0> · CACHE_EN · CACHE_ASGN<0>* · DEL · ENCS +
           DS<2>* · DS<1>* · CACHE_EN · CACHE_ASGN<1> · DEL · ENCS +
           DS<2>* · DS<0>* · CACHE_EN · CACHE_ASGN<0> · DEL · ENCS

The second PAL 916 also receives the CACHE_ASGN<2 .. 0>, DS<2 .. 0>, CACHE_EN, ENCS* and DA<3> signals. From these signals, the PAL 916 produces the DCSO*<3 .. 0> signals and the CACHE_CS, or cache select signal. Further, the PAL 916 receives the PERR<1 .. 0> signals and produces the TERR or read parity error signal which is provided to the local processor 30 interrupt inputs. The equations the PAL 916 are shown below:

DCSO<3> = DS<2>* · DS<1> · DS<0> · CACHE_EN* · ENCS · DA3* +
DS<2>* · DS<1> · DS<0> · CACHE_EN · CACHE_ASGN<2> · ENCS · DA3* +
DS<2>* · DS<1> · DS<0> · CACHE_EN · CACHE_ASGN<1>* · ENCS · DA3* +
DS<2>* · DS<1> · DS<0> · CACHE_EN · CACHE_ASGN<0>* · ENCS · DA3*

DCSO<2> = DS<2>* · DS<1> · DS<0>* · CACHE_EN* · ENCS · DA3* +
DS<2>* · DS<1> · DS<0>* · CACHE_EN · CACHE_ASGN<2> · ENCS · DA3* +
DS<2>* · DS<1> · DS<0>* · CACHE_EN · CACHE_ASGN<1>* · ENCS · DA3* +
DS<2>* · DS<1> · DS<0>* · CACHE_EN · CACHE_ASGN<0> · ENCS · DA3*

DCSO<1> = DS<2>* · DS<1>* · DS<0> · CACHE_EN* · ENCS · DA3* +
DS<2>* · DS<1>* · DS<0> · CACHE_EN · CACHE_ASGN<2> · ENCS · DA3* +
DS<2>* · DS<1>* · DS<0> · CACHE_EN · CACHE_ASGN<1> · ENCS · DA3* +
DS<2>* · DS<1>* · DS<0> · CACHE_EN · CACHE_ASGN<0>* · ENCS · DA3*

DCSO<0> = DS<2>* · DS<1>* · DS<0>* · CACHE_EN* · ENCS · DA3* +
DS<2>* · DS<1>* · DS<0>* · CACHE_EN · CACHE_ASGN<2> · ENCS · DA3* +
DS<2>* · DS<1>* · DS<0>* · CACHE_EN · CACHE_ASGN<1> · ENCS · DA3* +
DS<2>* · DS<1>* · DS<0>* · CACHE_EN · CACHE_ASGN<0> · ENCS · DA3*

CACHE_CS = DS<2>* · DS<1>* · DS<0> · CACHE_EN · CACHE_ASGN<2>* · CACHE_ASGN<1>* · CACHE_ASGN<0> · ENCS · DA3* +
DS<2>* · DS<1> · DS<0>* · CACHE_EN · CACHE_ASGN<2>* · CACHE_ASGN<1> · CACHE_ASGN<0>* · ENCS · DA3* +
DS<2>* · DS<1> · DS<0> · CACHE_EN · CACHE_ASGN<2>* · CACHE_ASGN<1> · CACHE_ASGN<0> · ENCS · DA3* +
DS<2> · DS<1>* · DS<0>* · CACHE_EN · CACHE_ASGN<2> · CACHE_ASGN<1>* · CACHE_ASGN<0>* · ENCS · DA3* +
DS<2> · DS<1>* · DS<0> · CACHE_EN · CACHE_ASGN<2> · CACHE_ASGN<1>* · CACHE_ASGN<0> · ENCS · DA3* +
DS<2> · DS<1> · DS<0>* · CACHE_EN · CACHE_ASGN<2> · CACHE_ASGN<1> · CACHE_ASGN<0>* · ENCS · DA3* +
DS<2> · DS<1> · DS<0> · CACHE_EN · CACHE_ASGN<2> · CACHE_ASGN<1> · CACHE_ASGN<0> · ENCS · DA3*

TERR = PERR<1>* · PERR<0>*

Therefore, reviewing the PAL equations, it can be seen how the local processor 30 properly sets the posted write memory assigned disk channel so that it replaces that particular disk drive in the array A for both the interrupts and the select signals.

Figure 25:
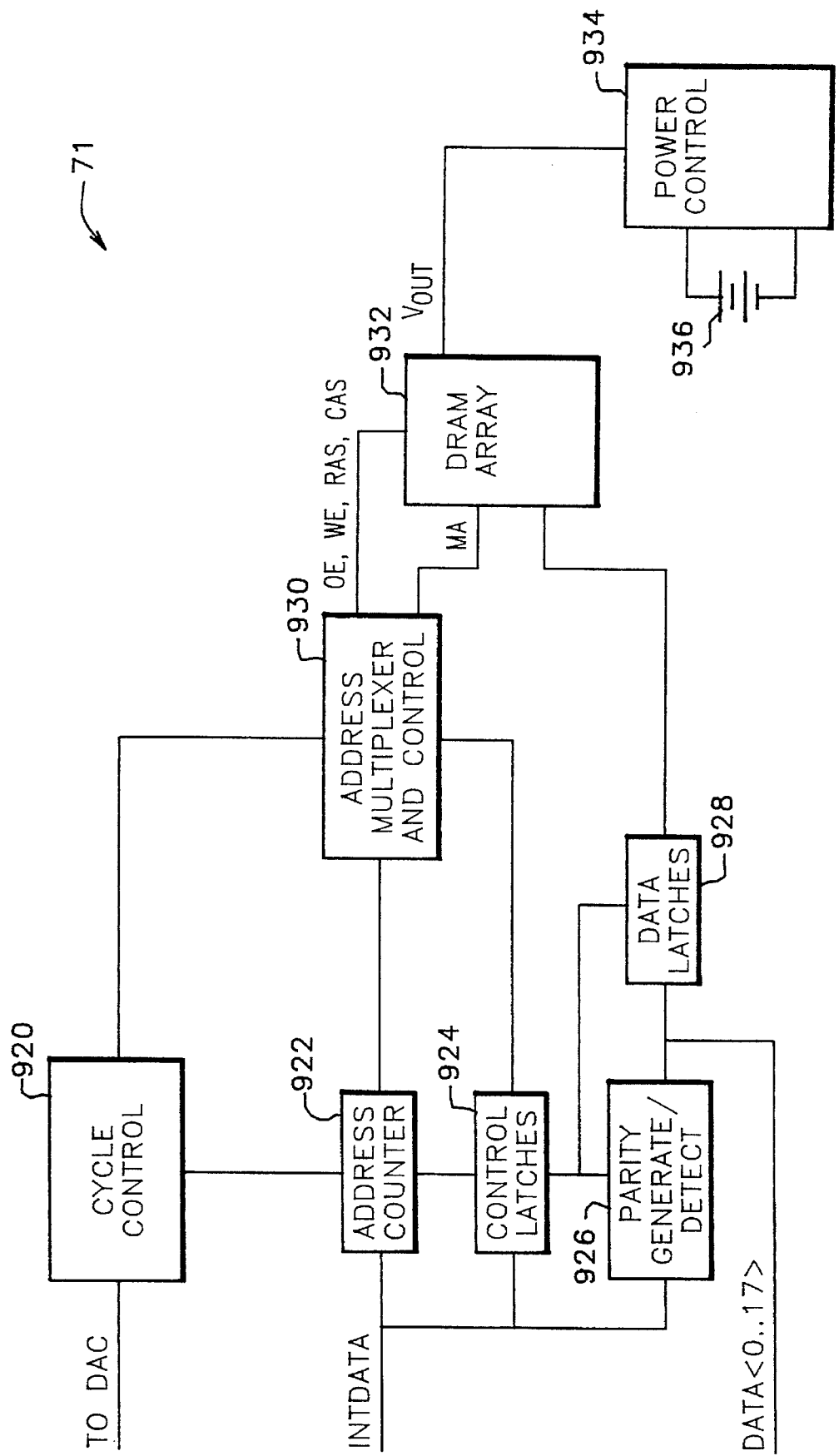
FIG. 25 is a block diagram of the posted write memory of FIG. 1.

Referring now to FIG. 25, a block diagram of the posted write memory 71 is shown. A cycle control block 920 receives the various signals from the buffer 75 which are provided from the DAC bus. These are the signals sufficient to determine if particular cycles, such as the data or command read/write cycles, are occurring and to return the various error, interrupt and other signals. The cycle control 920 provides outputs to an address counter 922, various control latches 924, a parity generator/detector transceiver 926 and to data latches 928. The address counter 922 is provided to allow latching and autoincrementing capabilities to allow DMA operations with the transfer controller 44 to occur easily. The control latches 924 are provided to allow the local processor 30 to set various states and conditions of the posted write memory 71. The parity generator/detector transceiver 926 is used to provide the parity detection for write operations and to develop an internal data bus in the posted write memory 71 referred to as the INTDATA bus.

The devices address counter 922, control latches 924, and the parity generator/detector transceiver 926 are connected to the INTDATA bus. The outputs of the address counter 922 and of the control latches 924 are provided to an address multiplexer and control block 930. The address multiplexer and control block 930 also receives outputs from the cycle control 920. The address multiplexer and control block 930 provides the output enable (OE*), write enable (WE*), row address select (RAS) and column address select (CAS) signals to a dynamic random access memory (DRAM) array 932 and provides the memory addresses to the DRAM array 932 over an MA bus. The data latches 928 provide the data to and from the DRAM array 932. The DRAM array 932 preferably is comprised of a mirrored bank of dynamic random access semiconductor memories which also include sufficient capacity for parity checking. More details on the DRAM array 932 will be provided below.

A power control block 934 is connected to a series of batteries 936 to provide battery power and determines whether the batteries 936 or the power provided by the computer system is provided to the DRAM array 932.

Figure 26:
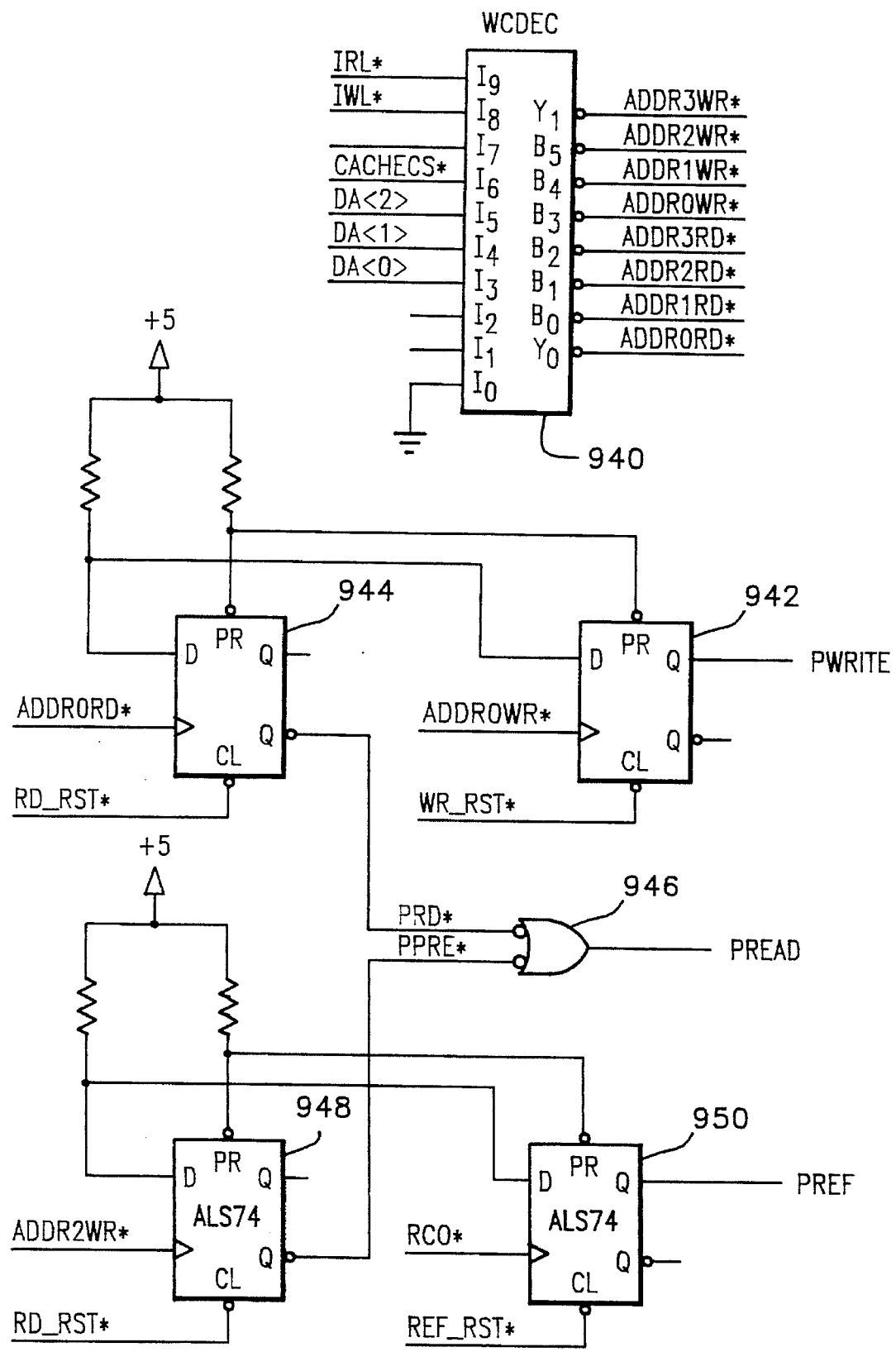
FIGS. 26–33 are schematic diagrams of portions of the posted write memory of FIG. 25.
Figure 27B:
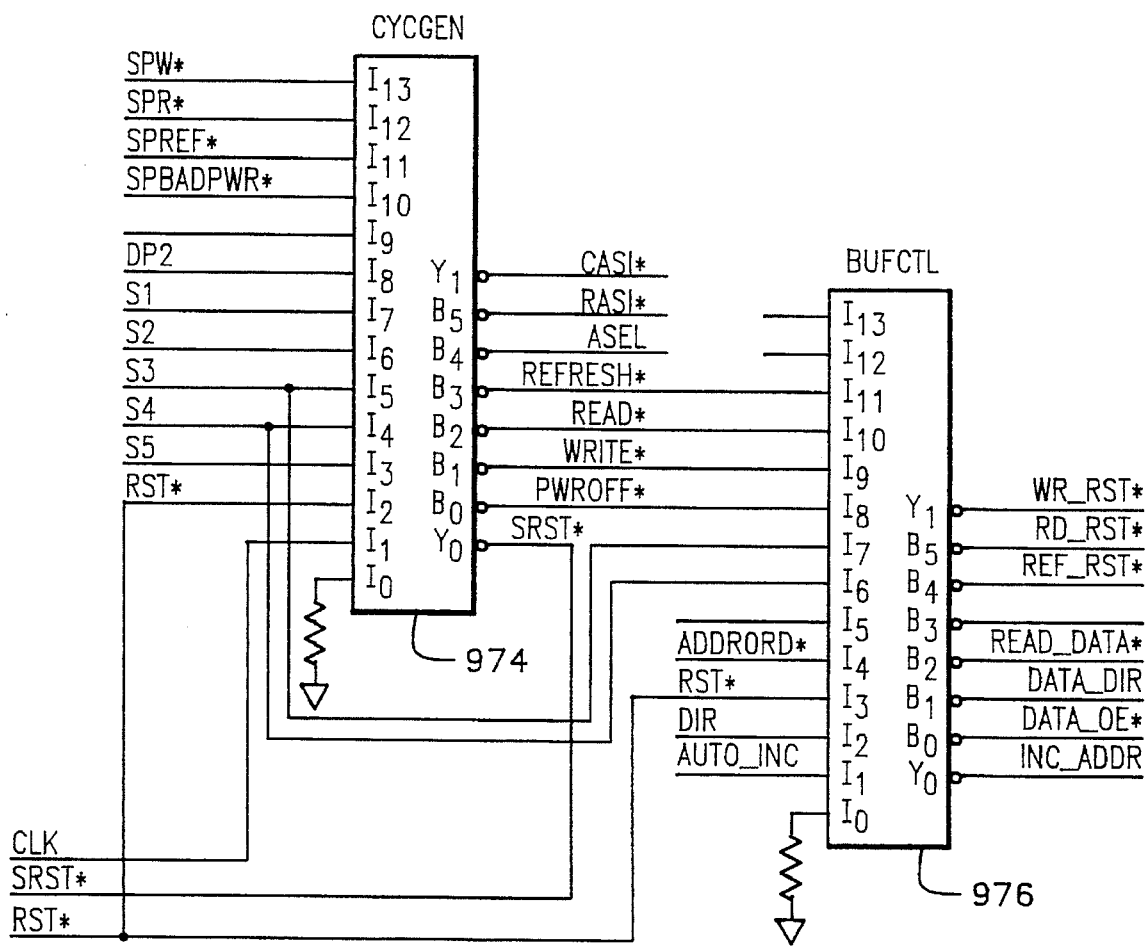
Figure 28:
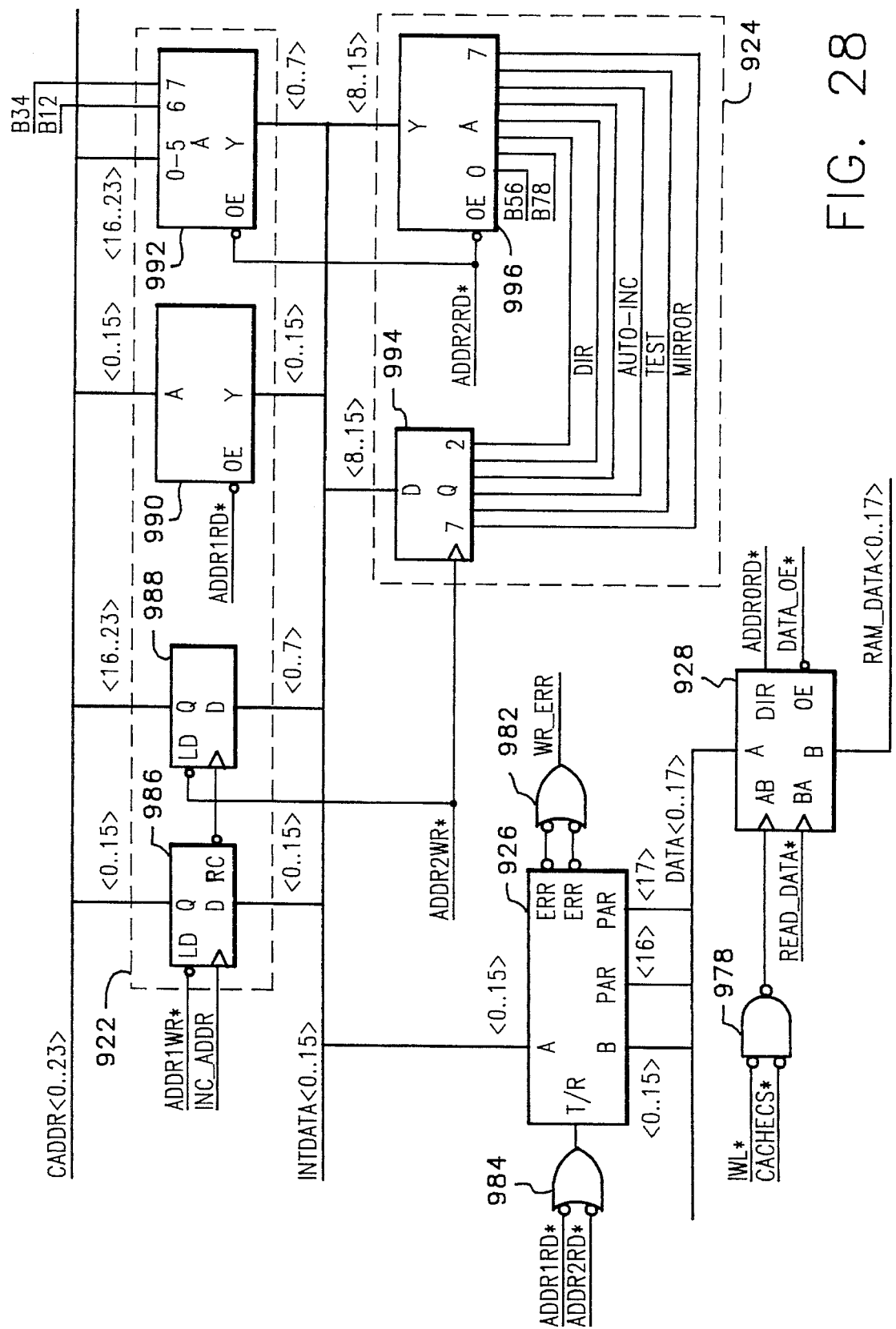

Portions of the cycle control 920 are shown in FIGS. 26 and 27. Referring first to FIG. 26, a PAL 940 receives the IRL* signal, which indicates a read operation on the disk channel; the IWL* signal, which indicates a write operation on the disk channel; the CACHECS* signal, which indicates that an operation to the posted write memory 71 is being performed; and the DA<2 .. 0> signals or device addresses to address the particular registers being simulated in the posted write memory 71. The PAL 940 provides 8 output signals corresponding to read/write pulses to the four addresses associated with the posted write memory 71. For example, address 0 is the data port, while address 1 provides the lower 16 bits of the address to the address counter 922, address 2 provides the upper 8 bits of the address for the address counter 922 and miscellaneous control bits in an 8 bit latch, and address 3 is used to place the backup batteries 936 in standby.

The ADDROWR* signal is provided to the clock input of a D-type flip-flop 942. The D and inverted preset inputs are connected to a logic high level and the non-inverted output provides the PWRITE signal. The inverted clear input is connected to the WR_RST* signal. The ADDRORD* signal is provided as the clock input to a D-type flip-flop 944, whose D and inverted preset inputs are connected to a logic high level and whose inverted clear input is connected to the RD_RST* signal. The inverted output of the flip-flop 944 is the PRD* signal and is provided as one input to a 2 input NAND gate 946. The ADDR2WR, signal is provided to the clock input of a D-type flip-flop 948, whose D and inverted preset inputs are connected to a logic high level and whose inverted clear input is connected to the RD_RST* signal. The inverted output of the flip-flop 948 is the PPRE* signal, which is provided as the second input to the NAND gate 946, whose output is the PREAD signal, which indicates that a read of the posted write RAM 71 has been posted.

A signal referred to as RCO* is provided to the clocking input of a D-type flip-flop 950. The RCO* signal is a refresh counter signal which appears or pulses when it is appropriate for the dynamic memories in the DRAM array 932 to receive the next refresh cycle. The D and inverted preset inputs of the flip-flop 950 are connected to a logic high level and the inverted clear input is connected to the REF_RST* signal. The non-inverted output is the PREF signal, which indicates that a refresh is pending or needs to be performed.

Referring now to FIG. 27, the PWRITE and PREAD signals are provided as the two inputs to a 2 input OR gate 952, whose output is provided to an inverter 954, whose output in turn is the CACHE_INT signal which indicates that an operation is being performed on the posted write memory 71 and which is provided to the PAL 912. The PWRITE signal is provided to one input of an 8 input D-type flip-flop 956. The clocking signal to the flip-flop 956 is provided by the CLK or local processor clock signal, while the inverted clear input receives the RST* signal. The output of the flip-flop 956 associated with the PWRITE signal input provides the WR1 signal, which is connected to a second input of the flip-flop 956. The second associated output of the flip-flop 956 provides the WR2 signal. The WR1 and WR2 signals are provided as the two inputs to a 2 input NAND gate 958, whose output is the SPW* signal which provides a signal to indicate that a write request has been synchronized to the local clock.

The PREAD signal is provided as one input to the flip-flop 956, the associated output being the RD1 signal and being connected to a second input on the flip-flop 956. The associated output of the second input is the RD2 signal, with the RD2 and RD1 signals being provided as the two inputs to a 2 input NAND gate 960, whose output is the SPR* signal. In this manner a similar signal is provided during read operations. The PREF signal is provided as one input to the flip-flop 956, the associated output being the REF1 signal and being connected to a second input of the flip-flop 956. The second associated output is the REF2 signal, which along with the REF1 signal is provided as the two inputs to a 2 input NAND gate 962. The output of the NAND gate 962 is the SPREF, signal.

A signal referred to as POWER_GOOD*, which when active low indicates that the power being supplied to the disk controller D by the computer system is satisfactory, is provided as one input to the flip-flop 956. The associated output is the NOPWR1 signal, which is provided to the final input to the flip-flop 956. The associated output is the NOPWR2 signal and along with the NOPWR1 signal are provided as the two inputs to a 2 input NAND gate 954, whose output is the SPBADPWR* signal. These SPW*, SPR,, SPREF, and SPBADPWR* signals are used to provide synchronized signals for the particular operations in a state machine used to control the posted write memory 71.

Five main signals are used to indicate the particular state of the cycles of the posted write memory 71. The five signals are referred to as the S1, S2, S3, S4 and S5 signals and are provided as five of the outputs of an 8 bit D-type flip-flop 966. The S1 signal output is related to an input which receives SRST* or state machine reset signal. The S2 output is provided from an input which receives a signal which is the output of a 2 input AND gate 968, whose inputs are SRST* and S1 signals. The S3 signal is provided at an output whose input receives the output of a 2 input AND gate 970, whose inputs are the S2 signal and the SRST* signal. The S4 signal is provided by an output whose associated input receives the output of a two input AND gate 972, whose inputs are the S3 signal and SRST* signal. The S5 signal is provided by an output whose related input receives the S4 signal. Thus in this manner once the state machine has started it proceeds to count S1, S2, S3, S4 and S5 and then to continuously cycle through that phase as long as the SRST* signal is not in an active low state.

The flip-flop 966 is used to produce two additional signals referred to as the DP1 and DP2 signals. The POWER GOOD signal is provided to one input of the flip-flop 966, whose associated output is provided in return to another input of the flip-flop 966. This associated output is the DP1 signal, which is again provided to an input of the flip-flop 966. The associated output is the DP2 signal. The DP1, DP2, S1–S5, SPW*, SPR*, SPREF* and SPBADPWR, signals are provided to a cycle generation PAL 974. The PAL 974 produces signals referred to as CASI*, the basic CAS signal for the DRAM array 932; the RASI, signal, which is the basic RAS signal for the DRAM array 932; the ASEL or address select signal used to select RAS or CAS addresses; the REFRESH, signal to indicate that a refresh operation is occurring; the READ* signal, which indicates that a read operation is occurring; the WRITE* signal which indicates that a write operation is occurring; the POWEROFF, signal which indicates that read, write and refresh operations are completed, the power is not good and those operations will be blocked until good power is returned; and the SRST* signal. The equations for the PAL 974 are shown below.

```
RASI =    S1 · S4* · READ +
          S1 · S4* · WRITE +
          S1 · CLK* · S4* · REFRESH +
          RASI · S4* · REFRESH +
          S2 · PWROFF

CASI =    S3 · READ +
          S3 · WRITE +
          S1 · S3* · REFRESH +
          SPREF · SPW* · SPR* · S1 · READ* ·
          WRITE* · PWROFF* · RST* +
          S1 · PWROFF

ASEL =    READ · S2 · S4* +
          WRITE · S2 · S4*

READ =    SPR · S1 · PWROFF* · WRITE* · REFRESH* ·
          RST* +
          READ · S5* · RST*

WRITE =   SPW · SPR* · S1 · PWROFF* · READ* ·
          REFRESH* · RST* +
          WRITE · S5* · RST*

REFRESH = SPREF · SPW* · SPR* · S1 · READ* ·
          WRITE* · PWROFF* · RST* +
          REFRESH · S5* · RST*

PWROFF =  SPBADPWR · SPREF* · SPW* · SPR* · S1 ·
          REFRESH* · WRITE* · READ* · RST* +
          PWROFF · S5* · RST* +
          PWROFF · DP1* · RST* +
          PWROFF · DP2* · RST*

SRST =    SPR* · SPW* · SPBADPWR* · SPREF* ·
          PWROFF* +
          REFRESH · S4 +
          PWROFF · S4 · DP1 · DP2 +
          WRITE · S4 +
          READ · S4 +
          RST*
```

Therefore it can be seen that the state machine stays with the S1–S5 signals in a low state after reset and until one of the start signals is received. At that time it cycles through the five states and returns to the zero state until the next signal is received to initiate an operation.

A PAL 976 is used to provide the various reset pulses for the particular cycle types, to control the counting of the address counter 922, to control which direction the data is going, to drive the output enable input of the parity generator/detector transceiver 926 and to provide a DMA request (DREQ) signal to indicate that data is available. The PAL 976 receives the REFRESH*, READ*, WRITE* and POWEROFF* signals, the S3 and S4 signals, the ADDRORD, signal, the RST* signal, the DIR signal and the AUTO_INC signal to indicate that the address counter 922 is to auto increment. The PAL 976 provides the WR_RST*, RD_RST* and REF_RST* signals, the READ_DATA, signal, the DATA_DIR signal, the DATA_OE* signal and the INC_ADDR signal. The equations for the PAL 976 are shown below.

WR_RST=WRITE ·S3 ·S4* +TEST_RST
RD_RST=READ ·S3 ·S4* +TEST_RST
REF_RST=REFRESH ·S3·S4, +PWROFF +TEST$_{13}$RST
READ DATA=READ ·S4
DATA DIR=ADDRORD, ·DIR*
DATA OE=WRITE ·DIR +ADDRORD ·DIR*
INC_ADDR=AUTO_INC ·READ ·DIR* +AUTO_INC ·WRITE

FIG. 27 provides details on the address counter 922, the control latches 924, the parity generator/detector 926 and the data latches 928. The DATA<0 . . 17> signals are provided from the buffer 73 to the B port of the parity generator/detector 926 and to the A port of data latches 928. The direction signal for the data latches 928 is provided by the ADDRORD* signal, while the output enable signal is provided by the DATA_OE, signal. The clocking signal for the A to B direction of the bi-directional latching transceiver 928 is provided by the output of a 2 input OR gate 978. One input of the OR gate 978 receives the IWL* signal which is an indication of a write operation. The second input to the OR gate 978 is provided by the CACHECS* signal to indicate that operations directed to the posted write memory 71 are occurring. The clocking signal for the B to A direction of the latches 928 is provided by the READ_DATA, signal. The B port of the data latches 928 develop the RAM DATA<0 . . 17> bus which is provided to the DRAM array 932.

The parity generator/detector 926 has its two error outputs, one for each particular byte received at its B input, provided to the two inputs of a 2 input NAND gate 982. The output of the NAND gate 982 is the WR_ERR signal, which is provided to logic which generates an interrupt to the local processor 30 to allow prompt response to write parity errors. The parity generator/detector 926 has its direction input connected to the output of a 2 input NAND gate 984 whose inputs receive the ADDR1RD* and ADDR2RD* signals so that when command or address information is being received the data is transferred from the DATA<0 . . 17> signals to the INTDATA<0 . . 15> signals. The data is transferred to the DATA<0 . . 17> signals during read operations.

The INTDATA<0 . . 15> signals are provided to the address counter 922 and the control latches 924. The address counter 922 is developed using a 16 bit loadable counter 986 chained to a 8 bit loadable counter 988. The load signal for the counter 986 is connected to the ADDR1WR, signal, while the load signal for the 8 bit counter 988 is connected to the ADDR2WR* signal. A signal referred to as the INC_ADDR signal developed by the PAL 976 is provided to the clocking input of the counter 986. The ripple carry output of the counter 986 is provided to the clocking input of the count owner 988 so that a 24 bit counter develops. Thus each time a data read or write operation occurs and the autoincrement feature is enabled, the INC_ADDR signal pulses and the address counter 922 advances. The count outputs of the counters 986 and 988 form the CADDR<0 . . 23> signals or cache address bus.

As it may be desirable for the local processor 30 to at times determine the address actually present in the counter 922, a 16 bit buffer 990 and an 8 bit buffer 992 are connected between the CADDR and INTDATA buses. The counter 990 has its output enable input connected to the ADDR1RD* signal, while the buffer 992 has its output enable signal connected to the ADDR2RD* signal. In addition, the two most significant bits of the buffer 992 are connected to signals referred to as B12 and B34, which indicate the status of some of the batteries 936 as will be described below. The outputs of the buffer 990 are connected to the 16 bits of the INTDATA bus while the outputs of the buffer 992 are connected to the lower byte of the INTDATA bus.

Control latches 924 are developed by an 8 bit D-type flip-flop 994. The clocking input to the flip-flop 994 is provided by the ADDR2WR* signal and the upper byte of the INTDATA bus is connected to the D inputs. The most significant bit of the flip-flop 994 is the MIRROR signal, so that the second half or mirrored half of the DRAM array 932 can be forced to provide duplicate storage of data during write operations. The next most significant bit is the TEST signal for testing functions. The next less significant bit is the AUTO_INC bit, while bit positions 4 and 2 are unused and bit position 3 is the DIR signal. These signals are also provided to six inputs of an 8 bit buffer 996. The two least significant bits of the buffer 996 receive the B56 and B78 signals, which are the remaining two battery indication signals. The outputs of the buffer 996 are connected to upper byte of the INTDATA bus. The ADDR2RD* signal is provided to the inverted output enable input of the buffer 996.

Figure 29A:
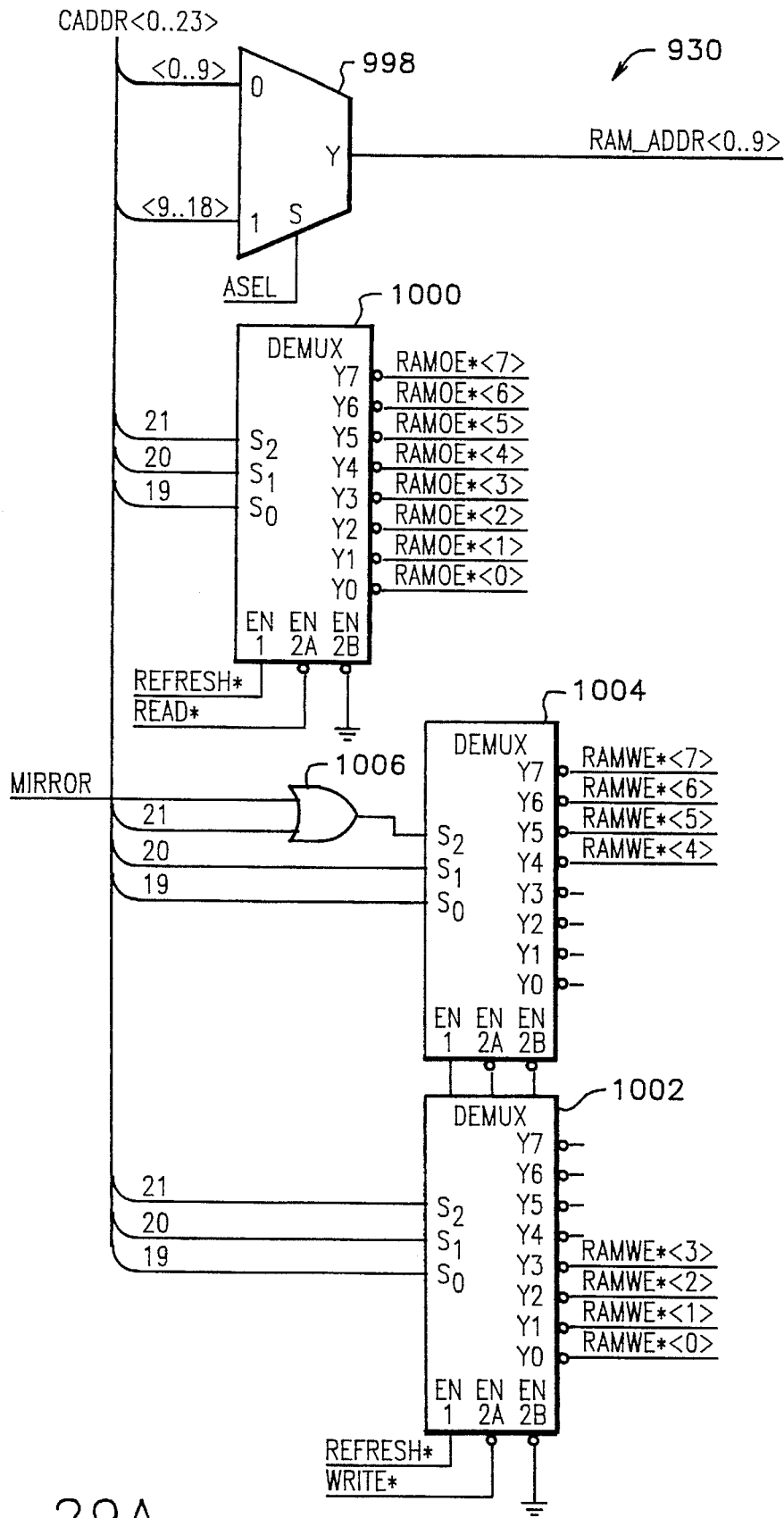
Figure 29B:
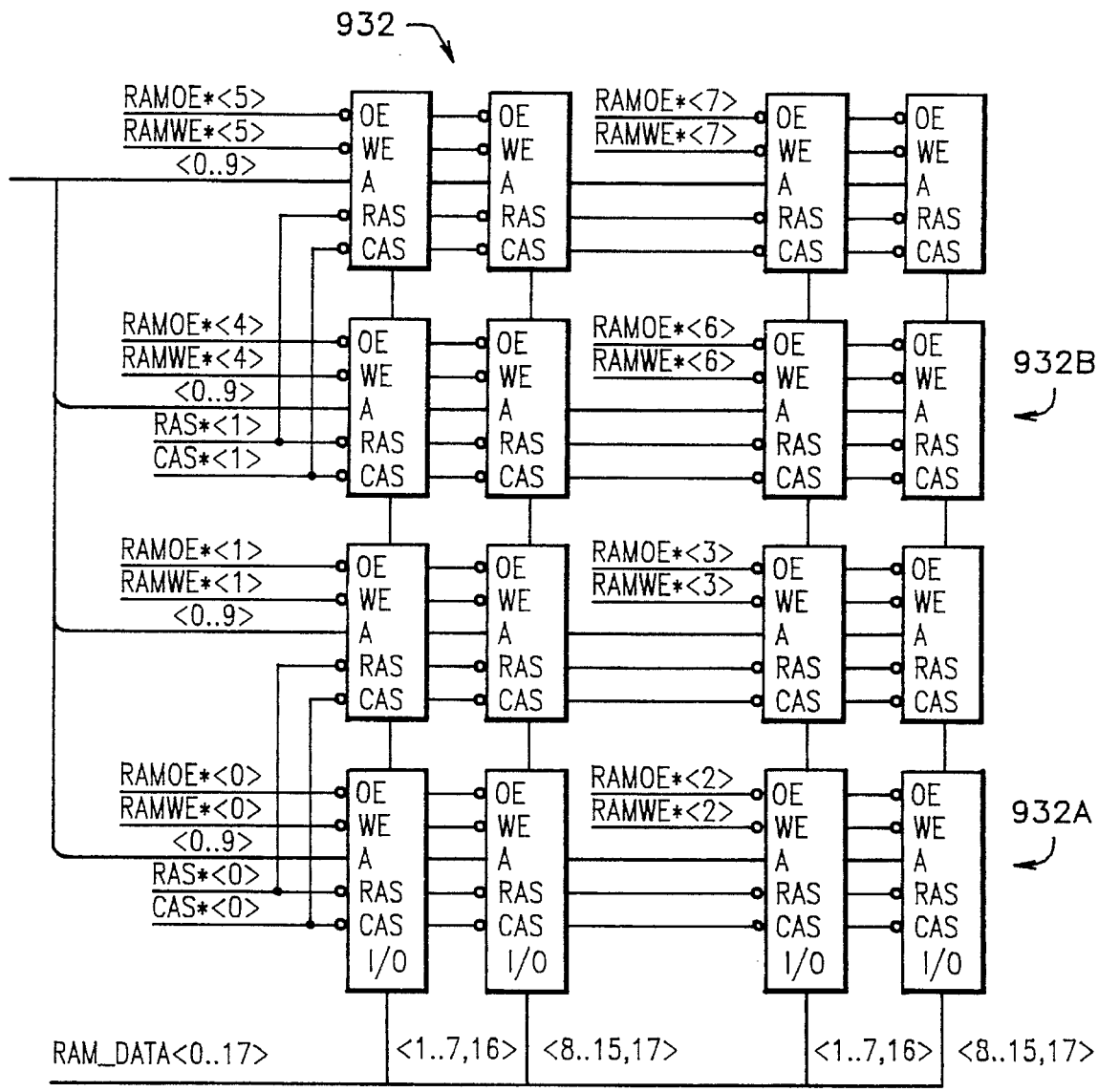

FIG. 29 illustrates in more detail the address multiplexer and control circuitry 930 and the DRAM array 932. A 10 bit 2:1 multiplexer 998 receives at its 0 inputs bits 0-9 of the CADDR bus and as its 1 input bits 9-18 of the CADDR bus. The ASEL signal is connected to the select input and the output of the multiplexer 998 is the RAM_ADDR<0 .. 9> signals which are provided to the address inputs of the DRAM modules in the DRAM array 932. A 3:8 decoder 1000 receives at its three select inputs bits 19, 20 and 21 of the CADDR bus, at its positive enable input the REFRESH* signal and at its inverted enable input the READ* signal. The 8 outputs of the decoder 1000 are the RAMOE,<0 .. 7> signals which are then active only during read operations and not during refresh operations or write operations.

The mirror bit is used to force writes to the mirror portion of the DRAM array 932 to allow enhanced data protection. A 3:8 decoder 1002 receives at its three select inputs bits 19-21 of the CADDR bus, at its positive enable input the REFRESH* signal and at its inverted enable input the WRITE* signal. The four least significant decoded outputs, that is, Y0 .. Y3, produce the RAMWE*<0 .. 3> signals. A second 3:8 decoder 1004 receives at its two low select inputs the 19 and 20 bits of the CADDR signal and at its most significant select bit the output of a two input OR gate 1006. The two inputs to the OR gate 1006 are the MIRROR signal and bit 21 of the CADDR bus. The enable input receives the REFRESH* signal, while the inverted enable input receives the WRITE* signal. For the decoder 1004 the four most significant outputs are utilized to develop the RAMWE*<4 .. 7> signals. By this arrangement, if the mirror bit is set by the local processor 30, data is automatically copied to both banks or halves of the DRAM array 932 during write operations, thus simply allowing mirroring of the data.

The DRAM array 932 has two banks, 932A and 932B. Bank 932B is considered as the mirror bank, while bank 932A is considered to be the original bank. The power for both banks is provided by a signal referred to as VOUT, whose generation is described below. Preferably the DRAM array 932 is formed using 16 512K×9 bit memory chips, preferably the Toshiba TC514900-AJLL-100 devices which are self-refreshing. The ninth bit allows parity information to be stored to allow detection of many memory errors. Thus two of these chips are used to develop the 16 data and 2 parity bits for each address value. The use of the 16 chips provides 8 Mbytes of total memory or 4 Mbytes of mirrored memory. The memory devices of bank 932A receive the RAS*<0> and CAS*<0> signals, while the memory devices of bank 932B receive the RAS,<1> and CAS*<1> signals. The RAMOE,<0 .. 3> and RAMWE,<0 .. 3> signals are provided to the four chip pairs in bank 932A, while the RAMOE*<4 .. 7> and RAMWE*<4 .. 7> signals are provided to the four chip pairs in bank 932B; to allow selection of the proper chip. Therefore the arrangement of the DRAM array 932 provides mirrored, parity checked, battery backed up memory to hold posted write data. This triple combination provides security of the posted write data during most, if not all, problem cases, particularly temporary loss of power, so that posted write operations can be used comfortably and confidently in critical applications such as file servers.

When a parity error is detected during a read operation, the local processor 30 is interrupted. The local processor 30 can then load the mirror address into the address counter 922 and access the data from the mirror bank 932B. The block of data can then be retrieved from the mirror bank 932B, the error condition can be noted and diagnostics can be performed if desired.

Figure 30:
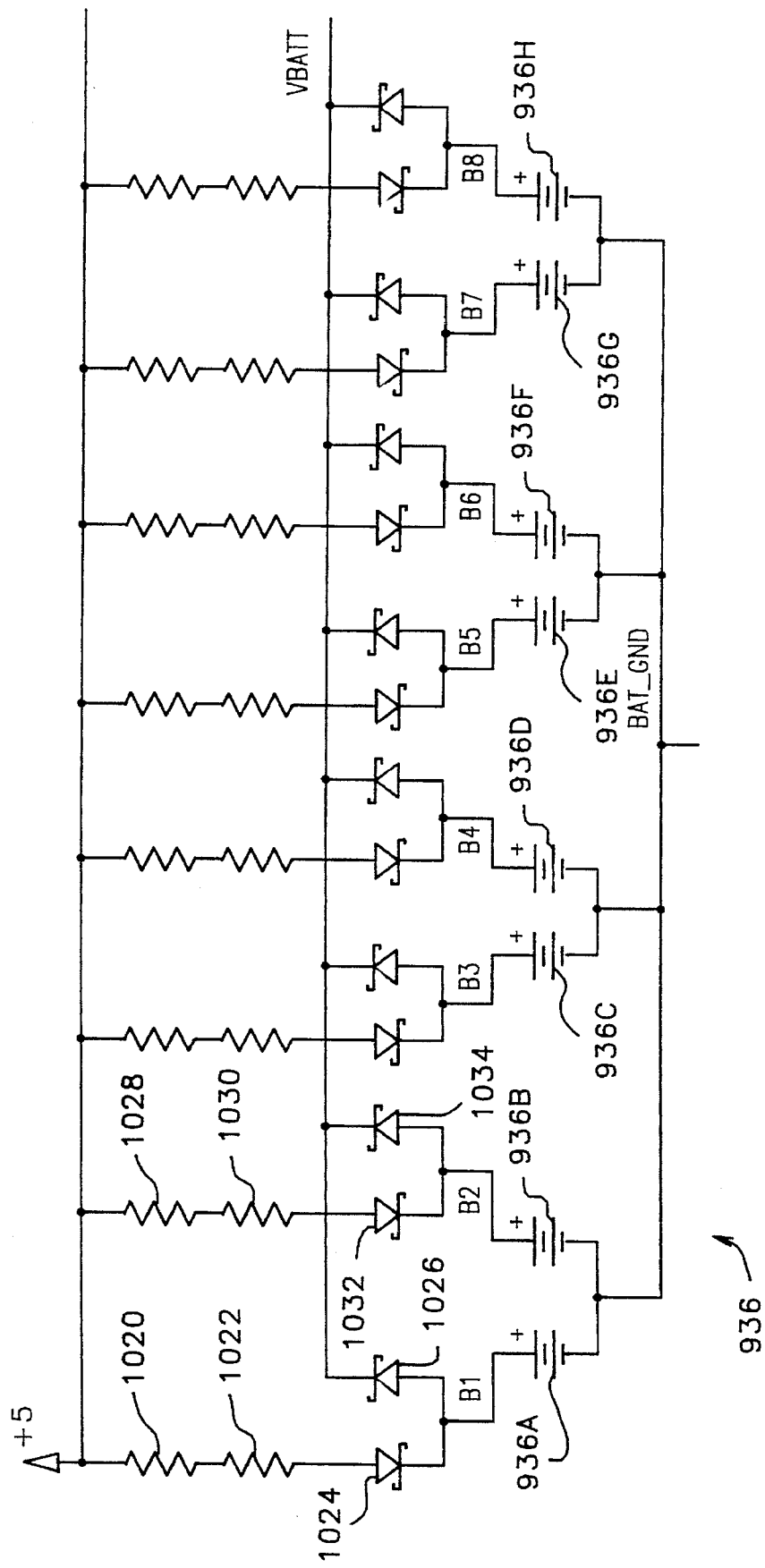

FIG. 30 shows the arrangement of the batteries 936. Preferably eight individual three volt lithium cells 936A–936H are utilized to form the battery 936. The ground or negative connections of the batteries 936A–936H are connected together to produce and develop a signal referred to as BAT_GND. Each of the positive terminals of the batteries 936A–936H is independent. Charge limiting resistors 1020 and 1022 are connected in series between the 5 volts supply and the anode of a Schottky diode 1024. The cathode of the diode 1024 is connected to the positive terminal of the battery 936A, this signal being referred to as the B1 signal. This path allows charging of the battery 936A. The anode of a Schottky diode 1026 is connected to the B1 signal and has its cathode connected to a signal referred to as VBATT. Similarly, charge limiting resistors 1028 and 1030 are connected between the 5 volts supply and the anode of a schottky diode 1032, whose cathode is connected to the positive terminal of the battery 936B, which connection is referred to as the B2 signal. The B2 signal is connected to the anode of a Schottky diode 1034, whose cathode is connected to the VBATT signal. A similar arrangement of resistors and Schottky diodes is provided for the batteries 936C–936H, with the signals at the positive terminals of the batteries 936C–938H being the B3, B4, B5, B6, B7 and B8 signals.

Figure 31:
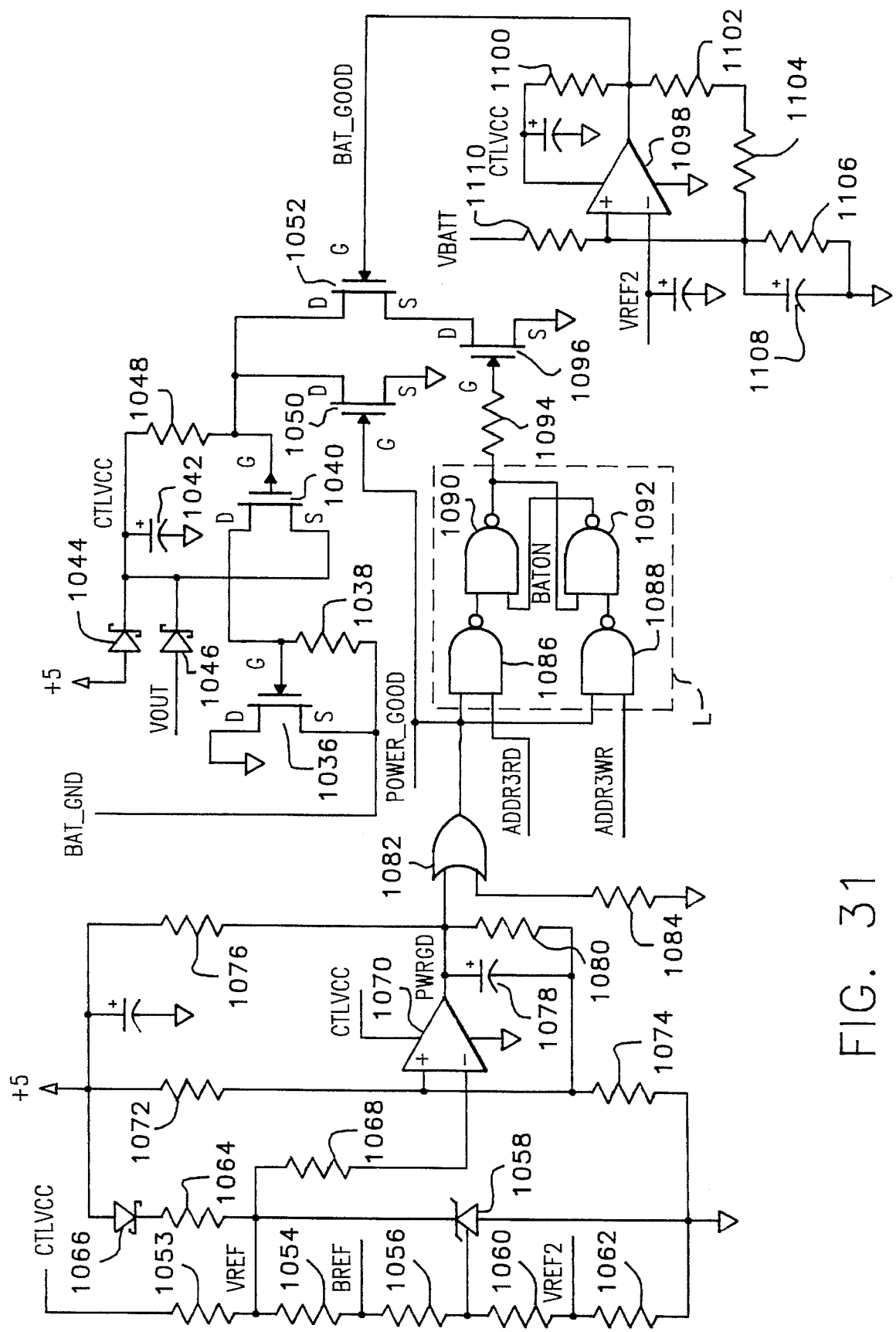

Referring now to FIG. 31, the BAT_GND signal is provided to the source of an N-channel enhancement MOSFET 1036 and to one terminal of a resistor 1038. The drain of the MOSFET 1036 is connected to ground, while the gate is connected to the second terminal of the resistor 1038 and to the drain of a P-channel enhancement MOSFET 1040. The source of the MOSFET 1040 is connected to a signal referred to as the CTLVCC or control logic VCC signal. The CTLVCC signal is connected to one terminal of a capacitor 1042, whose other terminal is connected to ground. The CTLVCC signal is connected to the cathodes of Schottky diodes 1044 and 1046. The anode of the diode 1044 is connected to the +5 signal, while the anode of the diode 1046 is connected to the VOUT signal. In this manner the CTLVCC signal is provided in any event to allow power up of the system. The CTLVCC signal is connected to one terminal of a resistor 1048 whose second terminal is connected to the gate of the MOSFET 1040 and the drains of N-channel enhancement MOSFETs 1050 and 1052. The source of the MOSFET 1050 is connected to ground, while the gate receives a signal referred to as POWER_GOOD which, when high, indicates that the +5 volts being received by the disk controller D is satisfactory. In this manner when the POWER_GOOD signal is present, the MOSFET 1050 is activated, the MOSFET 1040 is activated and then the MOSFET 1036 is activated, so that the BAT_GND signal is effectively coupled to ground through the MOSFET 1036. This allows charging of the batteries 936 when the power is good.

The CTLVCC signal is provided to one terminal of a resistor 1053, whose second terminal produces the VREF signal and is connected to one terminal of a resistor 1054. The other terminal of the resistor 1054 produces the BREF signal and is connected to one terminal of a resistor 1056. The second terminal of the resistor 1056 is connected to the control input of a reference diode 1058 and to one terminal of a resistor 1060. The second terminal of the resistor 1060 produces the VREF2 signal and is connected to one terminal of a resistor 1062, whose second terminal is connected to ground. The anode of the diode 1058 is connected to ground while the cathode is connected to the VREF signal. One terminal of a resistor 1064 is connected to the VREF signal and the other terminal is connected to the cathode of a Schottky diode 1066, whose anode is connected to the +5 signal. A resistor 1068 receives at one terminal the VREF signal and has its second terminal connected to the inverting input of a comparator 1070. The non-inverting input of the comparator 1070 is connected between resistors 1072 and 1074, the resistor 1072 connected to the +5 signal and the resistor 1074 connected to ground. Thus the resistors 1072 and 1074 provide a voltage divider, while the resistor 1068 provides a reference voltage to the comparator 1070. A resistor 1076 is connected between the +5 supply and the output of the comparator 1070 to act as a pull-up. The output of the comparator 1070 is also connected to the parallel combination of a capacitor 1078 and a resistor 1080, which act as a hysteresis feedback for the comparator 1070. The output of the comparator 1070 is further connected to one input of a two input OR gate 1082 whose second input is connected through a resistor 1084 to ground. The output of the OR gate 1082 is the POWER_GOOD signal. Thus when the +5 supply reaches a level so that the divider signal provided to the comparator 1070 exceeds the reference voltage provided by the diode 1058, the power is considered good.

The POWER_GOOD signal is also provided as one input to a two input NAND gate 1086. The second input of the NAND gate 1086 receives the ADDR3RD signal. The POWER_GOOD signal is further connected to one input of a two input NAND gate 1088 whose second input is receives the ADDR3WR signal. The output of the NAND gate 1086 is provided as one input to a two input NAND gate 1090, while the output of the NAND gate 1088 is provided as one input to a two input NAND gate 1092. The output of the NAND gate 1090 is connected to the second input of the NAND gate 1092 and is referred to as the BATON signal, while the output of the NAND gate 1092 is connected to the second input of the NAND gate 1090. Thus in this manner the NAND gates 1086, 1088, 1090 and 1092 form a simple latch circuit which is set by a pulse to the ADDR3RD signal and cleared by a pulse to the ADDR3WR signal. In this way the local processor 30 need only provide a command to the transfer controller 44 to read the address 3 register to set the BATON signal and provide a write operation to the address 3 register to clear the BATON signal.

The BATON signal is used to provide a turn on circuit and grounding circuit to allow the batteries 936 to remain connected to ground and power the DRAM array 932 during times when power is not being received to the disk controller D. The output of the NAND gate 1090 is provided to one terminal of a resistor 1094, whose second terminal is connected to the gate of an N-channel enhancement MOSFET 1096. The source of the MOSFET 1096 is connected to ground while the drain is connected to the source of the MOSFET 1052. The gate of the MOSFET 1052 receives a signal referred to as the BAT_GOOD signal, which is provided by the output of a comparator 1098. When positive or high, the BAT_GOOD signal indicates that the battery voltage provided by the battery 936 is sufficient to enable the operation of the DRAM array 932. A resistor 1100 is connected between the output of the comparator 1098 and the CTLVCC signal to act as pull-up, while resistors 1102 and 1104 are connected in series between the output and the non-inverted input of the comparator 1098. A resistor 1106 is connected between the non-inverted input of the comparator 1098 and ground and is in parallel with a capacitor 1108. A resistor 1110 is connected between the non-inverted input of the comparator 1098 and the VBATT signal. The VREF2 signal is provided to the negative input of the comparator 1098. In this manner the comparator 1098 performs a determination as to whether the battery voltage being provided by the battery 936 is sufficient to power the DRAM array 932. If so, the BAT_GOOD signal is high, so that the MOSFET 1052 is activated. Therefore if the latch L is activated, then should power be removed and the POWER_GOOD signal no longer be true, because the BAT_GOOD signal is active and the latch L has the BATON signal activated, then the voltage provided at the gate of the MOSFET 1040 is still ground and therefore the batteries are still grounded through MOSFET 1036. Should, however, either the battery voltage be too low or the battery status be turned off, as indicated by the BATON signal being low, then one of the MOSFETs 1096 or 1052 is not active and therefore the MOSFET 1040 is also not active. This in turn results in the MOSFET 1036 being turned off, so that the batteries 936 do not receive system ground and thus can not provide power to the DRAM array 932. This case is desirable to prevent the batteries 936 from discharging too deeply and to reduce discharging during certain power off conditions, particularly when valid data is not present in the DRAM array 932 and it can be safely powered off.

Figure 32:
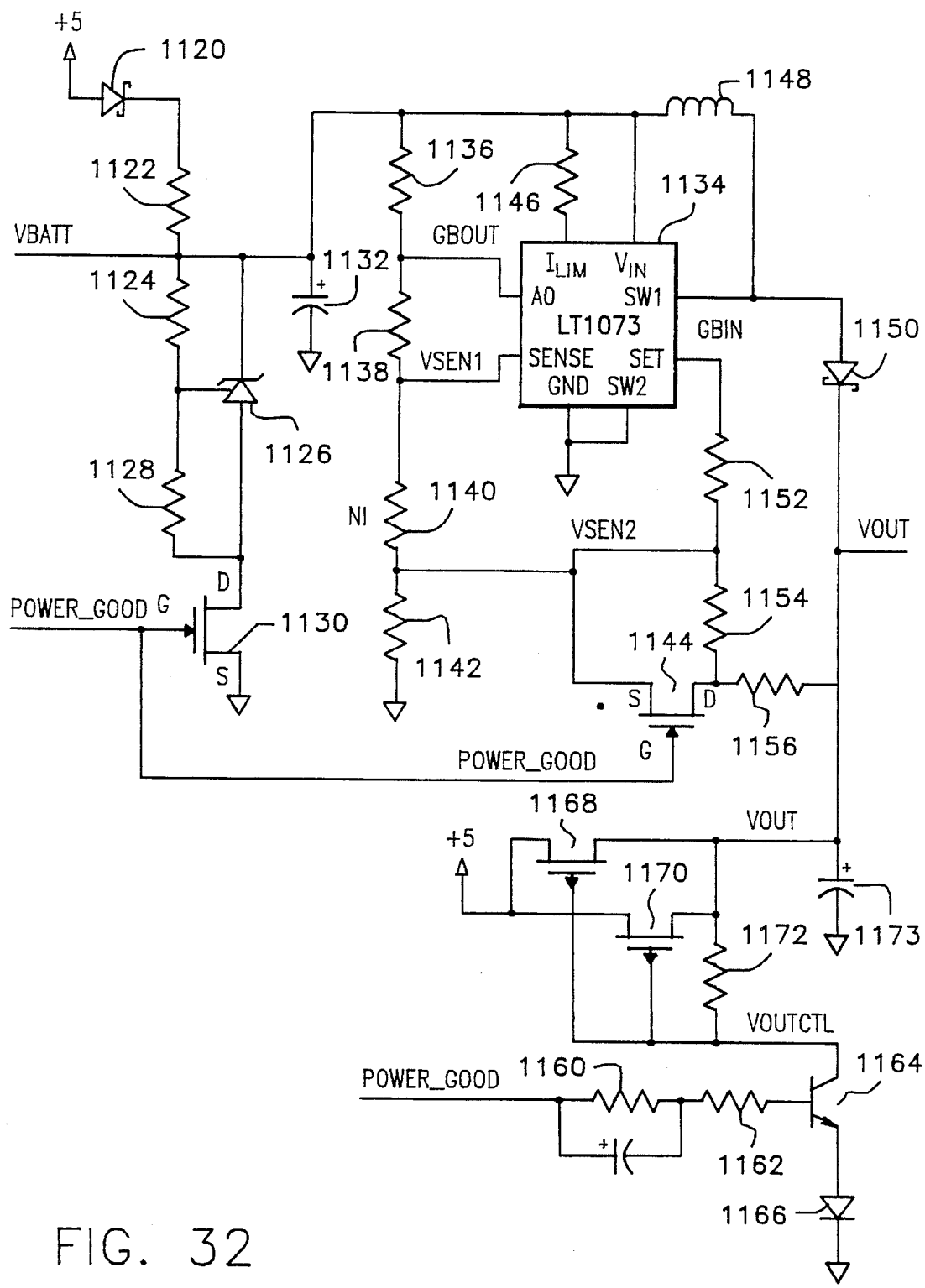

It is also necessary to develop the VOUT signal which is provided to the DRAM array 932 to power the memory cells. The development of this VOUT signal is shown in FIG. 32. A Schottky diode 1120 has its anode connected to the +5 volt line and its cathode connected to one terminal of a resistor 1122. The second terminal of the resistor 1122 is connected the VBATT signal and to one terminal of a resistor 1124. The second terminal of the resistor 1124 is connected to the control input of a voltage reference diode 1126 and to one terminal of a resistor 1128. The anode of the diode 1126 and the second terminal of the resistor 1128 are connected to the drain of an N-channel enhancement MOSFET 1130, whose source is connected to ground and whose gate receives the POWER_GOOD signal. The cathode of the diode 1126 is connected to the VBATT signal. Therefore if the power is considered good, then the reference diode 1126 is active, limiting the voltage provided to the batteries 936A–H to prevent overcharging and to provide a stable voltage reference.

A switching voltage regulator 1134, preferably a Linear Technologies LT1073, is used to allow development of the VOUT signal from the VBATT signal if the power is not good. A capacitor 1132 is connected between the VBATT signal and ground. The VBATT signal is connected to a resistor 1136, whose second terminal is connected to the auxiliary gain block output of the switching regulator 1134 and to one terminal of a resistor 1138. The second terminal of the resistor 1138 is connected to the sense input of the switching regulator 1134 and to one terminal of a resistor 1140. The second terminal of the resistor 1140 is connected to a resistor 1142, which is connected to ground, and to the source of an N-channel enhancement MOSFET 1144. A resistor 1146 is connected between the VBATT signal and the current limit input of the switching regulator 1134. An inductor 1148 is connected between the voltage input of the switching regulator 1134 and the switched output of the switching regulator 1134. The VBATT signal is also connected to the voltage input of the switching regulator 1134. The switched output of the switching regulator 1134 is also connected to the anode of a Schottky diode 1150, whose cathode is connected to the VOUT signal. A resistor 1152 has one terminal connected to the set input of the switching regulator 1134 and a second terminal connected to the source of the MOSFET 1144 and a first terminal of a resistor 1154. The second terminal of the resistor 1154 is connected to the drain of the MOSFET 1144 and one terminal of a resistor 1156. The second terminal of the resistor 1156 is connected to the VOUT signal to provide voltage feedback. The gate of the MOSFET 1144 is connected to the POWER_GOOD signal. Therefore the resistor 1154 is removed from the feedback circuitry if the +5 supply is good, but utilized if battery power is being used. Therefore if the POWER_GOOD signal is present, the switching regulator 1134 has its effective output voltage limited to a value less than 5 volts, preferably 4.7 volts, so that the diode 1150 is reverse biased and the switching regulator 1134 is effectively out of circuit. If the power is not good, the MOSFET 1144 opens and the voltage is regulated at VOUT to 5 volts. Further, the reference diode 1126 is disconnected to reduce power drain on the batteries 936A–H.

The VOUT signal can also be developed more directly from the +5 signal. The POWER_GOOD signal is provided to one terminal of the resistor 1160. The second terminal of the resistor 1160 is connected to the first terminal of a resistor 1162, whose second terminal is connected to the base of an NPN transistor 1164. The emitter of the transistor 1164 is connected to the anode of a diode 1166 whose cathode is connected to ground. The collector of the transistor 1164 is connected to the gates of two P-channel enhancement mode MOSFETs 1168 and 1170 and to one terminal of a resistor 1172. The second terminal of the resistor 1172 is connected to the VOUT signal and to the sources of the MOSFETs 1168 and 1170, whose drains are connected to the +5 signal. The sources of the MOSFETs 1168 and 1170 are also connected to the VOUT signal. In this manner, if the POWER_GOOD signal is true or active, the transistor 1164 is turned on so that a low voltage is applied to the gates of the MOSFETs 1168 and 1170, which then are turned on so that the +5 volt signal is transmitted directly to the VOUT signal to power the DRAM array 932, and the switching regulator 1134 output is not utilized.

Figure 33:
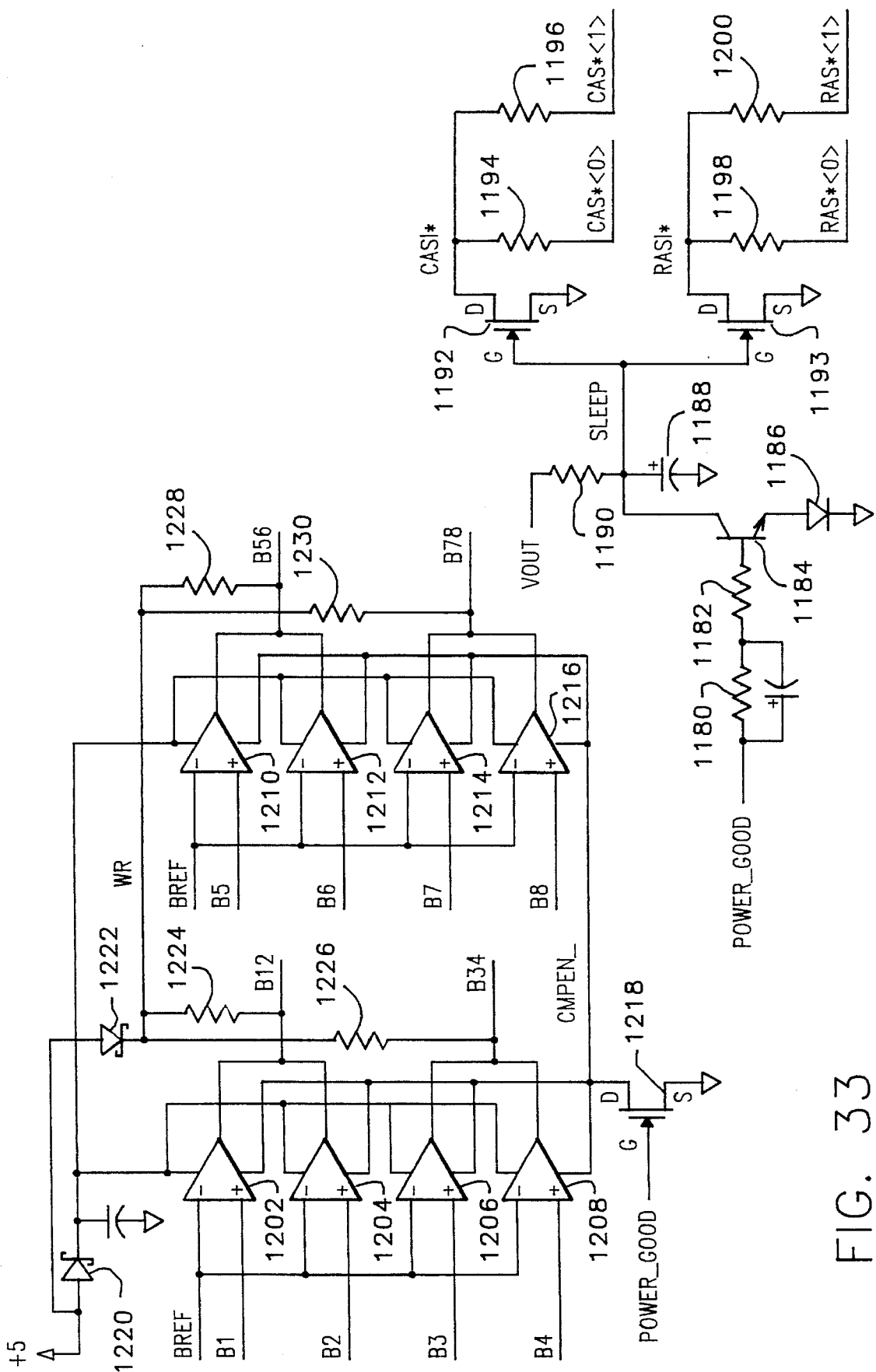
Figure 34:
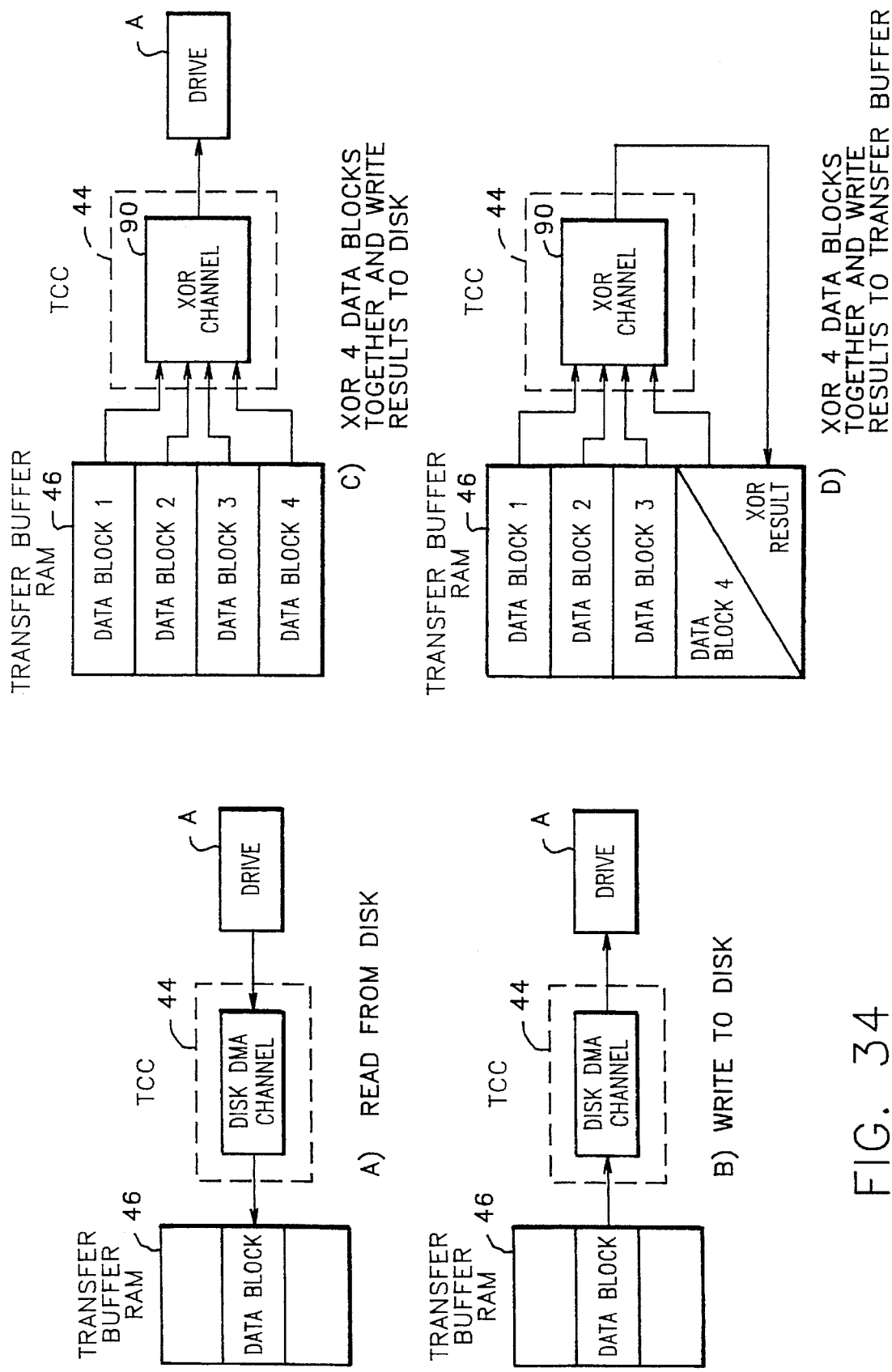
FIGS. 34–37 are schematic illustrations of data flow in the disk array controller of FIG. 1.
Figure 35:
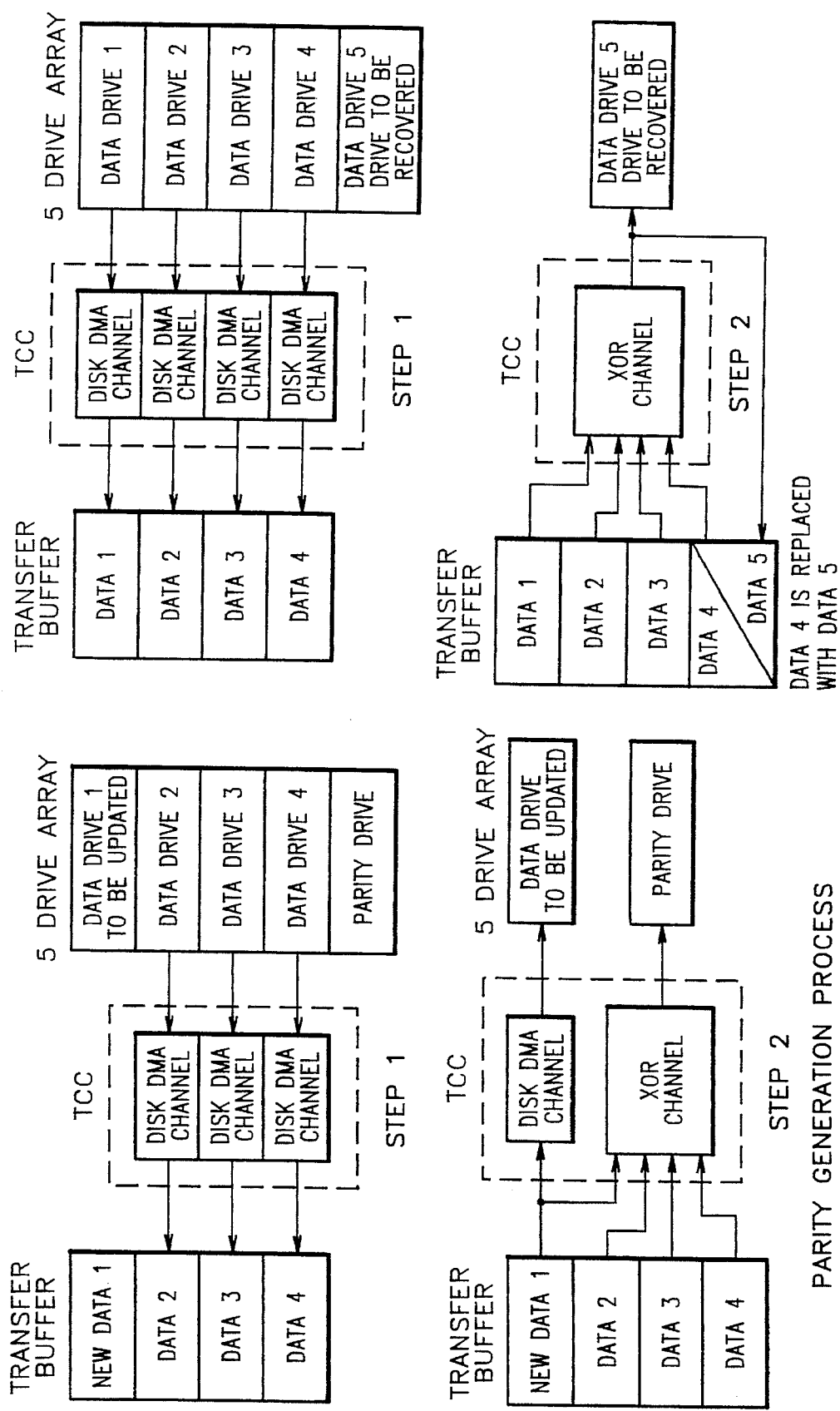
Figure 36:
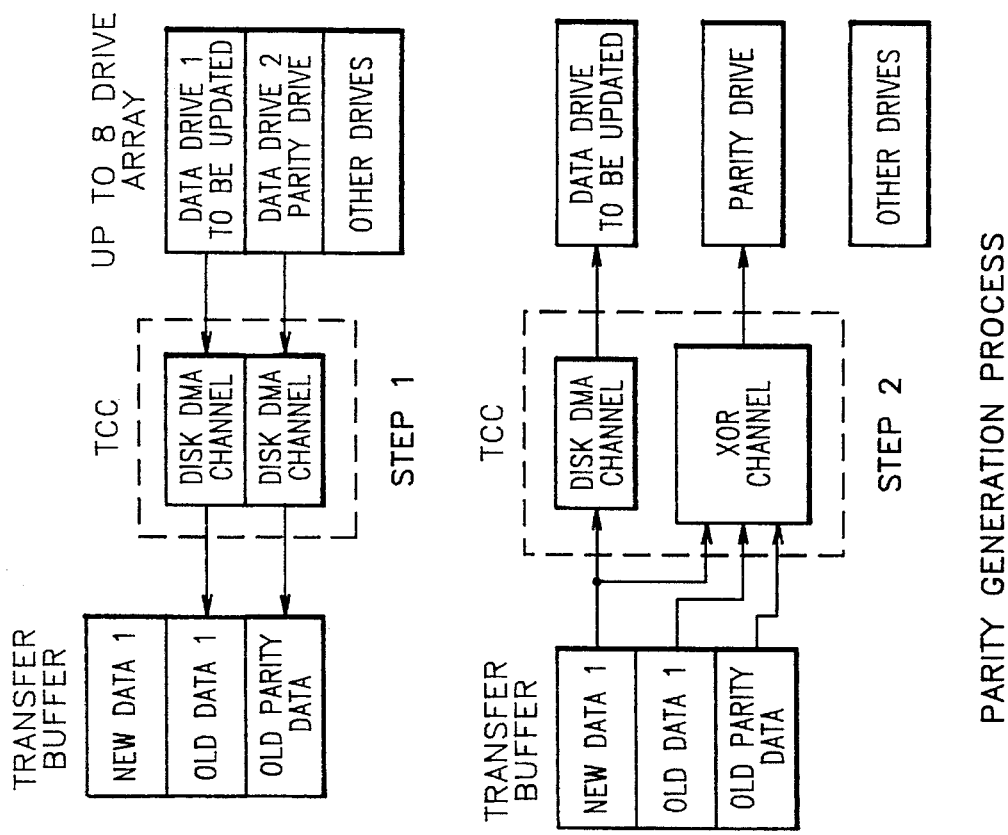
Figure 37:
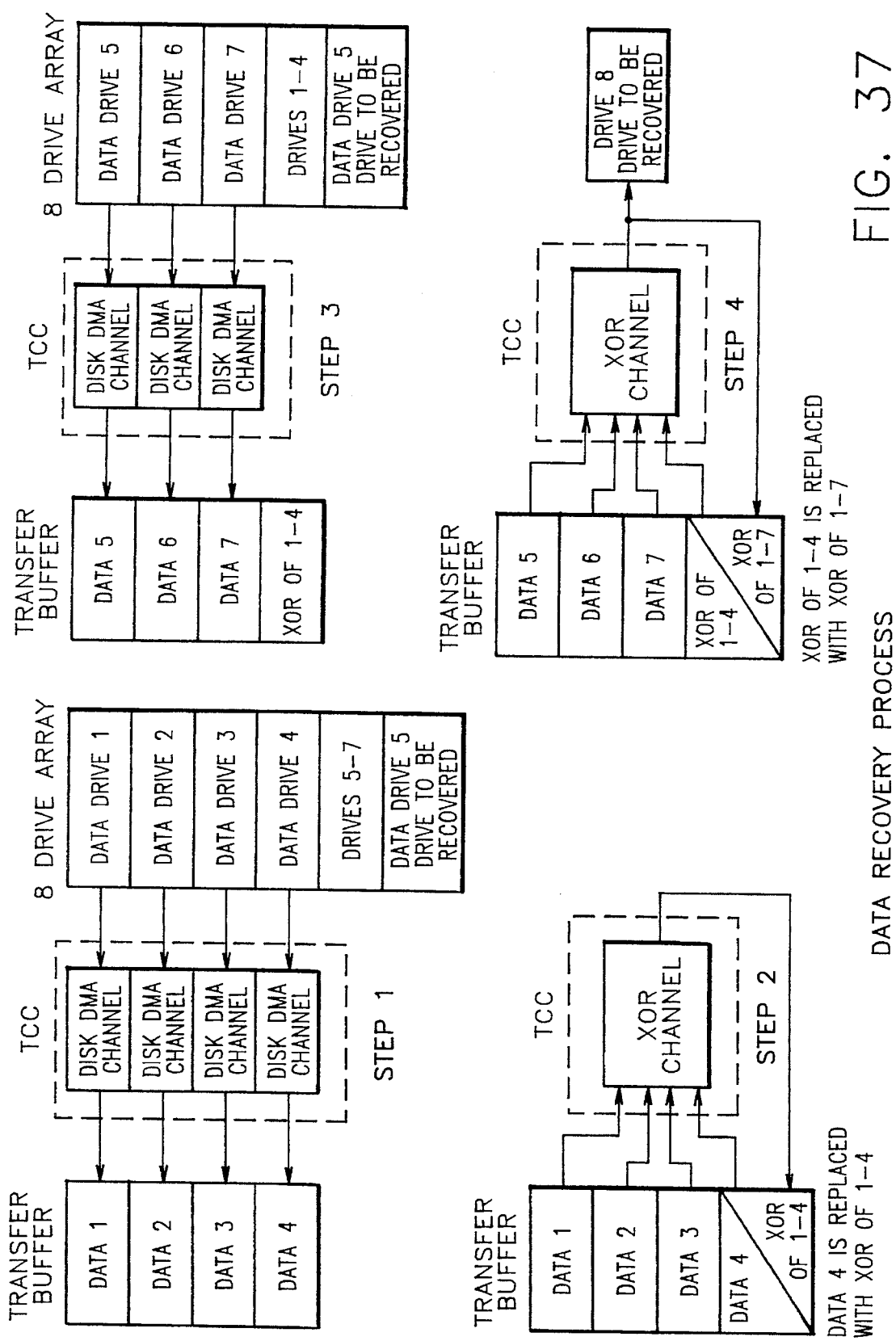

If the power is not good then, it is appropriate to continuously ground the column and row address strobes from the DRAM array 932 so that the memory devices enter self-refresh mode. This is done as shown in FIG. 33. The POWER_GOOD signal is provided to one terminal of a resistor 1180, whose second terminal is connected to one terminal of a resistor 1182. The second terminal of the resistor 1182 is connected to a base of an a NPN transistor 1184, whose emitter is connected to the anode of a diode 1186, whose cathode is connected to ground. The collector of the transistor 1184 is connected to one terminal of a capacitor 1188 whose second terminal is connected to ground. The collector of the transistor 1184 is also connected to one terminal of a resistor 1190 whose second terminal is connected to the VOUT signal. Further, the collector of the transistor 1184 is connected to the gates of two N-channel enhancement MOSFETs 1192 and 1194. The sources of the MOSFETs 1192 and 1194 are connected to ground. The drain of the MOSFET 1192 is connected to the CASI, signal, to a resistor 1194 whose other terminal is connected to the CAS*<0> signal and to one terminal of a resistor 1196 whose second terminal is connected to the CAS,<1> signal. In a similar manner the drain of the MOSFET 1193 is connected to the RASI, signal one terminal of a resistor 1198 whose second terminal is connected to the RAS*<0> signal and to one terminal of a resistor 1200 whose second terminal is connected to the RAS*<1> signal. In this manner when the power is not good the MOSFETs 1192 and 1193 are activated so that the CASI* signal and RASI* signal are clamped to ground. When the power is good, the MOSFETs 1192 and 1193 are turned off and the RASI* and CASI* signals can normally be provided to the DRAM array 932.

It is also desirable to monitor the status of the batteries 936 so that the local processor 30 can determine if and when the battery cells 936A–936H go bad. The circuit is shown in FIG. 33. The BREF signal is provided to the inverting inputs of a series of comparators 1202, 1204, 1206, 1208, 1210, 1212, 1214 and 1216. The ground terminals of the comparators 1202–1216 are connected to the drain of an N-channel enhancement MOSFET 1218, whose source is connected to ground and whose gate receives the POWER_GOOD signal. The power terminals to the comparators 1202–1216 are connected to the cathode of a Schottky diode 1220 whose anode is connected to the +5 signal. The +5 signal is also provided to the anode of a Schottky diode 1222 whose output cathode is used to develop a pull up signal for the outputs of the comparators 1202–1216. The non-inverting input of the comparator 1202 receives the B1 signal, while the non-inverting input of the comparator 1204 receives the B2 signal. In a similar fashion the comparators 1206–1216 receive at their positive or non-inverting inputs the B3, B4, B5, B6, B7 and B8 signals. In this manner the comparators 1202–1216 are used to compare each of the individual batteries 936A–936H with a reference voltage to determine if any of them are going bad. The outputs of the comparators 1202 and 1204 are connected together and to one terminal of a resistor 1224 and provide the B12 signal to the buffer 992. Similarly, the outputs of the comparators 1206 and 1208 are connected together and are pulled up to the diode 1222 by a resister 1226 and are referred to as the B34 signal, which is also provided to the buffer 992. Similarly the outputs of the comparators 1210 and 1212 are connected together to produce the B56 signal, which is pulled up by a resistor 1228 to the diode 1222. Finally, the comparators 1214 and 1216 have their outputs connected together to produce the B78 signal, which is pulled up by a resistor 1230 to the voltage of the diode 1222. The B56 and B78 signals are provided to the buffer 996 for possible reading by the local processor 30.

Basic operation of the posted write memory 71 is as follows. Assume the power is good, the battery 936 is being charged and turned on and all portions are enabled. The local processor 30 directs the transfer controller 44 to write the desired address information and control settings, including mirroring and auto incrementing to address registers 1 and 2. The transfer controller 44 activates the DA<2 . . 0> signals, provides the data and provides the proper DS<2 . . 0> signals as programmed. The data is then latched into the address counter 922 and the control latches 924. The local microprocessor 30 then instructs the transfer controller 44 to transmit a block of data to the posted write memory 71. The transfer controller initiates the series of operations, each having a DA<2 . . 0> signal value of 0, the proper DS<2 . . 0> signal value and providing IWL signal pulses on each operation. The data is transferred to the data latches 928 and the state machine proceeds through a WRITE sequence, appropriately driving the proper RAS*, CAS*, OE* and WE* signals, with the address counter 922 incrementing with each transfer. Because mirroring was selected, the data is written into both DRAM banks 932A and 932B. Assume now that power is lost. As the BATON signal was high and assuming a proper battery level, the DRAM array 932 remains powered by the batteries 936 and enters self-refresh mode. Eventually power returns, with the DRAM array 932 now being powered by the +5 supply again and the batteries 936 recharging. The local microprocessor 30 again instructs the transfer controller 44 to load values into the address counter 922 and control latches 924, this time for a read operation. This is performed and then the transfer controller 44 is instructed to read a block of data from the DRAM array 932, for purposes of this example, the final active data. The local microprocessor 30 then instructs the transfer controller 44 to write to the address 3 register. The write operation turns off the BATON signal. Now if the power is lost, the DRAM array 932 is not powered, but as no data was present, no data is lost and a discharge cycle of the batteries 936 is saved.

Assuming the read operation produced a parity error, as indicated on the TERR signal, the local microprocessor 30 then instructs the transfer controller 44 to write a new address to the address counter 922, so that the mirror bank can be accessed. The block read operation is repeated. If no errors occur, the data has been successfully retrieved, even though power failed momentarily and a portion of the DRAM array 932 failed. Thus even under these conditions data has not been lost.

Other general operations can be requested and the exact signals present can be developed based on the above detailed description.

Thus the disk array controller D of the present invention provides both a very efficient and high speed method of transferring data between the disk array A and the host computer system under control of the local processor 30, allowing efficient parity operations which do not require large amounts of processor time, either by the local processor 30 or the host system, and allowing secure posted write cache operations.

The foregoing disclosure and description of the invention are illustrative and explanatory thereof, and various changes in the size, shape, materials, components, circuit elements, wiring connections and contacts, as well as in the details of the illustrated circuitry and construction may be made without departing from the spirit of the invention.

APPENDIX A

Integrated Disk Drive Interface

COPYRIGHT 1985, 1986 COMPAQ COMPUTER CORPORATION

SPECIFICATION, COMPAQ 16 BIT INTEGRATED DISK DRIVE INTERFACE

THIS DOCUMENT CONTAINS INFORMATION PROPRIETARY TO COMPAQ COMPUTER CORP.

1.1 SIGNAL CONVENTIONS

Signal names are shown in all upper case letters. Signals can be active in either a high or low state. A dash (−) at the beginning or end of a signal name indicates that it is active low. No dash or a plus (+) at the beginning or end of a signal name indicates that it is active high. Control signals which are active in either the high or low state, (having one function when high and another when low) are named with the active high function followed by slash (/), the active low function, and a dash (−). For example BITENA/BITCLR-, enables a bit when high and clears a bit when low. All signals are TTL compatible unless otherwise noted.

1.2 DISK DRIVE INTERFACE

Table 1 defines the signals used for the interface.

TABLE 1

| PIN | SIGNAL NAME | SIGNAL DESCRIPTION |
|---|---|---|
| 1 | RESET- | Signal that forces the drive to its initial power up condition. Activation of the RESET- line must not initiate a selftest or diagnostic operation. |
| 17 | D0 | 16 bit bidirectional data bus between the |
| 15 | D1 | host and the drive. The lower 8 bits are |
| 13 | D2 | used for register and ECC byte access. All |
| 11 | D3 | 16 bits are used for data word transfers. |
| 9 | D4 | |
| 7 | D5 | |
| 5 | D6 | |
| 3 | D7 | |
| 4 | D8 | |
| 6 | D9 | |
| 8 | D10 | |
| 10 | D11 | |
| 12 | D12 | |
| 14 | D13 | |
| 16 | D14 | |

TABLE 1-continued

I/O interface signals.

| PIN | SIGNAL NAME | SIGNAL DESCRIPTION |
|---|---|---|
| 18 | D15 | |
| 23 | IOW- | I/O write signal, active when the host writes a control byte or data word to the drive. |
| 25 | IOR- | I/O read signal, active when the host reads a status byte or data word from the drive. |
| 28 | ALE | Address latch enable, which signals that a host address is stable and valid. |
| 31 | IRQ | Interrupt request, asserted by the drive to interrupt the processor upon completion of a disk operation. This signal must be driven by a tri-state device, the output control for which is in the Digital Output Register, described in section 2.1.11. |
| 32 | IO16- | Status line used to signal the processor that the currently addressed I/O port is a 16 bit port capable of fast, single wait state access. This signal shall be activated on any 16 bit access of the Data Register (1F0 hex) and must be driven with an open collector device. |
| 35 | A0 | Least significant 3 bits of the 10 bit I/O |
| 33 | A1 | address from the host. The upper 7 bits of |
| 36 | A2 | the address are decoded and supplied to the drive in the form the 2 chip selects defined below. These lower 3 bits are used in conjunction with the chip selects to address one of the drive registers. |
| 34 | PDIAG- | Passed diagnostic. Signal generated by a slave drive and received by the master drive to allow the master to communicate diagnostic status status for both drives. This line should be pulled low by the slave immediately upon receipt of a diagnostic command and only released when the command has been successfully completed. If, when the master has completed its diagnostic, this line is still low, the master will wait, up to a timeout period |

TABLE 1-continued

I/O interface signals.

| PIN | SIGNAL NAME | SIGNAL DESCRIPTION |
|---|---|---|
| | | for the slave to return good status and for reporting diagnostic completion status. If the master times out waiting for the slave, the error is reported in the completion status. |

TABLE 1-continued

I/O interface signals.

| PIN | SIGNAL NAME | SIGNAL DESCRIPTION |
|---|---|---|
| 37 | CS0- | Chip select decoded from the address bus and gated with AEN to select the drive registers in the command block at addresses 1F0 through 1FF hex. |
| 38 | CS1- | Chip select decoded from the address bus and gated with AEN to select the drive registers at addresses 3F6 and 3F7. |
| 39 | ACTIVE- | Signal from the drive indicating that it is being accessed. This line, which is used as the driver for an LED, shall be active whenever the drive is selected or being accessed. This signal must be driven by an open collector device capable of sinking 20mA. |
| 20,21, 27,29 | RESERVED | |
| 2,19 22,24, 26,30, 40 | GROUND | Signal ground returns for the drive. |

2.0 PROGRAMMING REQUIREMENTS
2.1 I/O PORT DESCRIPTIONS

The drive interface shall be configured as a contiguous block of eight I/O addresses, called the Command block. In addition to the Command block, 2 additional ports shall be included on the drive, allowing access to status and control bits. The following I/O map defines the port addresses and functions.

| Address | | | | | | |
|---|---|---|---|---|---|---|
| CS0- | CS1- | A2 | A1 | A0 | Read function | Write function |
| 1 | 1 | x | x | x | No operation | No operation |
| 0 | 0 | x | x | x | Invalid addressing | Invalid addressing |
| 0 | 1 | 0 | 0 | 0 | Data register | Data register |
| 0 | 1 | 0 | 0 | 1 | Error register | Precomp Cylinder |
| 0 | 1 | 0 | 1 | 0 | Sector Count | Sector Count |
| 0 | 1 | 0 | 1 | 1 | Sector Number | Sector Number |
| 0 | 1 | 1 | 0 | 0 | Cylinder Low | Cylinder Low |
| 0 | 1 | 1 | 0 | 1 | Cylinder High | Cylinder High |
| 0 | 1 | 1 | 1 | 0 | Drive/Head | Drive/Head |
| 0 | 1 | 1 | 1 | 1 | Status register | Command register |
| 1 | 0 | 1 | 1 | 0 | Alternate Status register | Digital Output register |
| 1 | 0 | 1 | 1 | 1 | Drive Address register | Not decoded or used | where x is a don't care

2.1.1 DATA REGISTER (CS0- address 0 read/write)

The data register is the port through which all data is passed on read and write commands. It is also the port to which the interleave table is transferred during format commands. All transfers are high speed 16 bit I/O operations except for ECC bytes transferred during read/write long commands, which are 8 bits.

2.1.2 ERROR REGISTER (CS0- address 1 read only)

This register contains error status from the last command executed by the drive. The contents of this register are only valid when the error bit (ER) is set in the status register, unless the drive has just completed execution of a diagnostic command. The bits in the error register are defined below

| b7 | | | | | | | b0 |
|---|---|---|---|---|---|---|---|
| BB | UD | — | ID | — | AC | TO | AM | where BB indicates that a bad block mark was detected in the requested sector's ID field.

UD indicates that an uncorrectable data error has been encountered.

ID indicates that the requested sector's ID field could not be found.

AC indicates that the requested command has been aborted due to a drive status error (not ready, write fault, etc.) or because the command code is invalid.

TO indicates that track 0 has not been found during a recalibrate command.

AM indicates that the data address mark has not been found after finding the correct ID field.

—not used. These bits must be set to zero.

2.1.3 WRITE PRECOMPENSATION CYLINDER (CS0- address 1 write only)

This command block register is defined as containing the cylinder on which write precompensation begins, however, this parameter shall be controlled by the drive and the contents of this register ignored. However, attempts to write this register must not cause any errors.

2.1.4 SECTOR COUNT (CS0- address 2 read/write)

The sector count defines the number of sectors of data to be read or written. If the value in this register is zero, a count of 256 sectors is specified. This count is decremented as each sector is read such that the register contains the number of sectors left to access in the event of an error in a multi-sector operation. The contents of this register are ignored on format commands, with the drive always formatting 17 sectors per track.

2.1.5 SECTOR NUMBER (CS0- address 3 read/write)

This register contains the starting sector number for any disk access. At the completion of a command, this register is updated to reflect the current position of the heads.

2.1.6 CYLINDER LOW AND CYLINDER HIGH (CS0- addresses 4 and 5 read/write)

The cylinder number registers contain the starting cylinder number for any disk access. The cylinder low register is for the least significant 8 bits of the 10 bit cylinder number. The 2 most significant bits of the cylinder number should be loaded into the cylinder high register, bits 0, and 1. Bit 1 of cylinder high should be the most significant bit of the 10 bit cylinder address. At the completion of a command, these registers are updated to reflect the current position of the heads.

2.1.7 DRIVE/HEAD REGISTER (CS0- address 6 read/write)

This register contains the drive and head numbers, as defined below:

| b7 | | | | | | | b0 |
|---|---|---|---|---|---|---|---|
| — | — | — | DR | HD | HD | HD | HD | where DR is the binary encoded drive select number

HD is the binary encoded head select number

—these bits shall be ignored

At the completion of a command, this register is updated to reflect the current position of the heads.

2.1.8 STATUS REGISTER (CS0- address 7 read only)

This register contains the drive/controller status. The contents of this register are updated at the completion of each command. If the busy bit is set, no other bits are valid. Reading this register clears the hardware interrupt, IRQ.

| b7 | | | | | | | b0 |
|---|---|---|---|---|---|---|---|
| BY | RY | WF | SC | DQ | CD | IX | ER | where

BY is the busy bit, which is set whenever the drive is executing a command. If this bit is set, information in the other command block registers need not be valid. This bit should be set at power up and remain set until the drive is up to speed and ready to accept a command.

RY is the ready indication from the drive. When there is an error, the state of this bit is latched until read by the host, at which time the bit again indicates the current readiness of the drive. This bit should be reset at power up and remain reset until the drive is up to speed and ready to accept a command.

WF is the write fault bit. When there is a write error, this bit is latched until read by the host, at which time the bit again indicates the current write fault status.

SC is the seek complete bit. This bit is set when the heads have settled over the track requested by the previous command. When there is an error, this bit is latched until read by the host, at which time the bit again indicates the current seek complete status.

DQ is the data request bit, which indicates that the drive is ready for transfer of a word or byte of data from the data register. All data transfers should be qualified by this bit being high prior to the transfer.

CD is the corrected data bit, which is set when a correctable data error has been encountered and the data has been corrected. This condition will not terminate a multi-sector read operation.

IX is the index bit which is set high for 150 us minimum, once per disk revolution.

ER is the error bit, which indicates that the previous command ended in some sort of error. The other bits in the status register, and the bits in the error register will have additional information as to the cause of the error.

2.1.9 COMMAND REGISTER (CS0- address 7 write only)

A list of executable commands with the command codes and necessary parameters for each command follows. Step rates for seek, recalibrate, and implied seeks shall be determined by the drive for optimum performance. This performance must meet the access time requirements in section 1.1.

| COMMAND NAME | COMMAND CODE b7       b0 |
|---|---|
| RECALIBRATE | 0 0 0 1 \| D D D D |
| READ DESIRED SECTORS | 0 0 1 0 \| 0 0 L R |
| WRITE DESIRED SECTORS | 0 0 1 1 \| 0 0 L R |
| VERIFY DESIRED SECTORS | 0 1 0 0 \| 0 0 0 R |
| FORMAT DESIRED TRACK | 0 1 0 1 \| 0 0 0 0 |
| SEEK | 0 1 1 1 \| D D D D |
| EXECUTE DRIVE DIAGNOSTIC | 1 0 0 1 \| 0 0 0 0 |
| INITIALIZE DRIVE PARAMETERS | 1 0 0 1 \| 0 0 0 1 |
| READ SECTOR BUFFER | 1 1 1 0 \| 0 1 0 0 |
| WRITE SECTOR BUFFER | 1 1 1 0 \| 1 0 0 0 |
| IDENTIFY DRIVE | 1 1 1 1 \| 1 1 0 0 | where

L is the long bit, if 1, read/write long commands are executed, if 0, normal read/write commands are performed.

R is the retry bit, if 0, retries are enabled, if 1, retries are disabled.

D is a don't care.

2.1.10 ALTERNATE STATUS REGISTER (CS1- address 6 read only)

This register contains the same information as the status register in the command block. The only difference being that reading this register does not clear any hardware conditions.

| b7 | | | | | | | b0 |
|---|---|---|---|---|---|---|---|
| BY | RY | WF | SC | DQ | CD | IX | ER |

See section 2.1.8 for definitions of the bits in this register.

2.1.11 DIGITAL OUTPUT REGISTER (CS1- address 6 write only)

This register contains two control bits as follows:

| b7 | | | | | | | b0 |
|---|---|---|---|---|---|---|---|
| — | — | — | — | — | RS | IE- | — |

Where

IE- is the hard disk interrupt enable bit. Interrupts are enabled when this bit is reset to zero, and disabled when set to one. When IE- is one, the IRQ line at the host interface shall be tri-stated.

RS is the drive reset bit. The drive is held reset when this bit is active and the drive is enabled when this bit is inactive. The drive must recognize a reset pulse of 500 ns minimum.

—these bits should be ignored.

2.1.12 DRIVE ADDRESS REGISTER (CS1- address 7 read only)

This port loops back the drive select and head select bits from the drive. Note that all bits in this port are active low. The bits in this port are as follows:

| b7 | | | | | | | b0 |
|---|---|---|---|---|---|---|---|
| RR | WG- | H3- | H2- | H1- | H0- | D1- | D0- | where

RR is reserved and undriven by the drive.

WG- is the write gate bit, which is zero when writing is in progress.

H3- through H0- are the binary coded address of the currently selected head, with H3- being the most significant bit.

D1- is not used and should always be set to one.

D0- is the drive select bit for drive 0, and should be zero when the drive is selected and active.

2.2 COMMAND DESCRIPTIONS

Commands are issued to the drive by loading the pertinent registers in the command block with the needed parameters, enabling the drive interrupt, and then writing the command code to the Command register. Execution begins as soon as the Command register is written.

2.2.1 INITIALIZE DRIVE PARAMETERS

This command enables the host to configure the controller to work with drives that have different numbers of heads and cylinders. The parameters loaded into the command block prior to issuance of the command define the drive configuration in terms of the number of sectors per track, and the number of heads per cylinder. Upon receipt of the command, the controller sets BY, saves the parameters, resets BY, and generates an interrupt.

2.2.2 SEEK

This command initiates a seek to the track and selects the head specified in the command block. The drive need not be formatted for a seek to execute properly. When the command is issued, the controller sets BY in the status register, initiates the seek, resets BY, and generates an interrupt. The controller does not wait for the seek to complete before returning the interrupt. If a new command is issued to a drive while a seek is being executed, the controller will wait, with BY active for the seek to complete before executing the new command.

2.2.3 RECALIBRATE

This command will move the read/write heads from anywhere on the disk to cylinder 0. Upon receipt of the command, the controller sets BY and issues a seek to cylinder zero. The controller then waits for the seek to complete before updating status, resetting BY and generating an interrupt. If the drive reports any error in attempting to reach cylinder 0, the error bit is set in the status register, and the track 0 bit set in the error register.

2.2.4 READ DESIRED SECTORS

This command will read from 1 to 256 sectors as specified in the command block (sector count equal to 0 requests 256 sectors), beginning at the specified sector. As soon as the command register is written, the controller sets the BY bit and begins execution of the command. If the drive is not already on the desired track, an implied seek is performed. Once at the desired track, the controller begins searching for the appropriate ID field. If retries are disabled and two index pulses have occurred without error free reading of the requested ID, an ID not found error will be posted in the error register. If retries are enabled, up to 80 attempts may be made to try and read the requested ID before reporting an error. These retries will include strobe and track offsets if the attached drive supports these options. If the ID is read correctly, the data address mark must be recognized in 20 bytes, or the data address mark not found error will be reported. Once the data address mark is found, the data field is read into the sector buffer, error bits are set if an error was encountered, the DQ bit is set, and an interrupt is generated. Upon command completion, the command block registers contain the cylinder, head, and sector number of the last sector read.

Multiple sector reads set DQ and generate an interrupt when the sector buffer is filled at the completion of each sector, and the controller is ready for the data to be read by the host. DQ is reset and BY is set immediately when the host empties the sector buffer. If any error other than a corrected data error occurs during a multiple sector read, the read will terminate at the sector where the error occurs. The command block registers will contain the cylinder, head, and sector number of the sector where the error occurred. The host may then read the command block to determine what error has occurred, and on which sector. If the error was either a corrected data error or an uncorrectable data error, the flawed data is loaded into the sector buffer. Corrected data errors do not terminate multiple sector reads.

A read long may be executed by setting the long bit in the command code. The read long command returns the data and the ECC bytes contained in the data field of the desired sector. During a read long, the controller does not check the ECC bytes to determine if there has been any type of data error.

2.2.5 WRITE DESIRED SECTORS

This command will write from 1 to 256 sectors as specified in the command block (sector count equal to 0 requests 256 sectors), beginning at the specified sector. As soon as the command register is written, the controller sets the DQ bit and waits for the host to fill the sector buffer with the data to be written. No interrupt is generated to start the first buffer fill operation. Once the buffer is full, the controller resets DQ, sets BY and begins command execution. If the drive is not already on the desired track, an implied seek is performed. Once at the desired track, the controller begins searching for the appropriate ID field. If retries are disabled and two index pulses have occurred without error free reading of the requested ID, an ID not found error will be posted in the error register. If retries are enabled, up to 80 attempts may be made to try and read the requested ID before reporting an error. These retries will include strobe and track offsets if the attached drive supports these options. If the ID is read correctly, the data loaded in the buffer is written to the data field of the sector, followed by the ECC bytes. Upon command completion, the command block registers contain the cylinder, head, and sector number of the last sector read.

Multiple sector writes set DQ and generate an interrupt each time the buffer is ready to be filled. DQ is reset and BY is set immediately when the host fills the sector buffer. If an error occurs during a multiple sector write, it will terminate at the sector where the error occurs. The command block registers will contain the cylinder, head, and sector number of the sector where the error occurred. The host may then read the command block to determine what error has occurred, and on which sector.

A write long may be executed by setting the long bit in the command code. The write long command writes the data and the ECC bytes directly from the sector buffer; the controller does not generate the ECC bytes itself.

2.2.6 VERIFY DESIRED SECTORS

This command is identical to the read sectors command, except that no data is transferred back to the host and no read long operations are permitted. The controller sets BY as soon as the command register is written and resets BY and generates an interrupt when the requested sectors have been verified. Upon command completion, the command block registers contain the cylinder, head, and sector number of the last sector verified.

If any error other than a corrected data error occurs during a multiple sector verify, the command will terminate at the sector where the error occurs. The command block registers will contain the cylinder, head, and sector number of the sector where the error occurred. Corrected data errors will not terminate multiple sector verify operations.

2.2.7 FORMAT DESIRED TRACK

This command formats the track specified in the command block, with the number of sectors specified in the sector count register during the most recent initialize drive parameters command. As soon as the command register is written, the controller sets the DQ bit and waits for the host to fill the sector buffer with the interleave table. When the buffer is full, the controller resets DQ, sets BY and begins command execution. If the drive is not already on the desired track, an implied seek is performed. Once at the desired track, the ID and data fields are written using the interleave table in the sector buffer. Formatting begins as soon as the controller senses the index pulse from the drive, by writing the first physical sector with the logical sector number in the first entry of the interleave table. Subsequent physical sectors are formatted in turn from the table. The order of the table entries corresponds to the interleave of the track. Media defects may be marked bad on a sector level, allowing the remainder of the track to be used. When the specified number of sectors have been formatted, the controller fills the remainder of the track to index with gap bytes. At the completion of the track, the controller resets BY and generates an interrupt.

The interleave table is made up of two bytes per sector on the track. The first byte is 00 if the sector is to be formatted normally, or 80h if the sector is to be formatted bad. The second byte is the logical sector number of the sector. After writing the interleave table, additional bytes should be loaded into the buffer until it is full (512 bytes). The contents of a typical interleave table are shown below, for a 34 sector track with an interleave of 3 and sector 3 marked bad.

```
00 01 00 0D 00 19 00 02 00 0E 00 1A 80 03 00 0F
00 1B 00 04 00 10 00 1C 00 05 00 11 00 1D 00 06
00 12 00 1E 00 07 00 13 00 1F 00 08 00 14 00 20
00 09 00 15 00 21 00 0A 00 16 00 22 00 0B 00 17
00 23 00 0C 00 18 dd dd dd dd dd dd dd dd dd dd
dd dd dd dd dd dd dd dd dd dd dd dd dd dd dd dd
                          .
                          .
dd dd dd dd dd dd dd dd dd dd dd dd dd dd dd dd
``` where dd is a don't care byte used to make up a total of 512 bytes

2.2.8 EXECUTE CONTROLLER DIAGNOSTIC

This command performs the internal diagnostic tests implemented by the controller. The diagnostic tests shall only be executed upon receipt of this command. They shall not be executed automatically at power up or after a reset. The controller sets BY immediately upon receipt of the command, performs the tests, resets BY, and generates an interrupt. The results of the test are reported in the error register of the command block immediately after execution of the command. The value in the error register should be viewed as a unique 8 bit code and not as the single bit flags defined in section 6.1.2. The table below details the codes and the corresponding explanation:

| Error code | Description |
|---|---|
| 01 | no error detected |
| 02 | formatter device error |
| 03 | sector buffer error |
| 04 | ECC circuitry error |
| 05 | controller microprocessor error |

2.2.9 IDENTIFY COMMAND

The identify command allows the host to receive parameter information from the drive and controller. When the command is issued, the controller sets BY, gets the parameters from the drive, stores them in the sector buffer, sets the DQ bit, and generates an interrupt. The host may then read the information out of the sector buffer. The parameter words in the buffer are arranged as follows:

| | |
|---|---|
| Word 0 | General configuration |
| Word 1 | Number of fixed cylinders |
| Word 2 | Reserved |
| Word 3 | Number of heads |
| Word 4 | Number of unformatted bytes per physical track |
| Word 5 | Number of unformatted bytes per sector |
| Word 6 | Number of physical sectors per track |
| Word 7 | Number of bytes in the inter-sector gaps |
| Word 8 | Number of bytes in the sync fields |
| Word 9 | |
| . | |
| . | Reserved |
| . | |
| Word 255 | |

The bits in the general configuration word have the following definitions:

| | |
|---|---|
| Bit 0 | Reserved |
| Bit 1 | 1=hard sectored |
| Bit 2 | 1=soft sectored |
| Bit 3 | 1=not MFM encoded |
| Bit 4 | 1=head switch time greater than 15 us |
| Bit 5 | 1=spindle motor control option implemented |
| Bit 6 | 1=fixed drive |
| Bit 7 | 1=removable cartridge drive |
| Bit 8 | 1=transfer rate less than or equal to 5Mb/s |
| Bit 9 | 1=transfer rate greater than 5Mb/s bus less than or equal to 10Mb/s |
| Bit 10 | 1=transfer rate greater than 10Mb/s |
| Bit 11 | 1=rotational speed tolerance is greater than .5% |
| Bit 12 | 1=data strobe offset option implemented |
| Bit 13 | 1=track offset option implemented |
| Bit 14 | 1=format speed tolerance gap required |
| Bit 15 | 0=magnetic disk drive, 1=non-magnetic disk drive |

2.2.10 READ BUFFER COMMAND

The read buffer command allows the host to read the current contents of the controller's sector buffer. When this command is issued, the controller will set BY, set up the sector buffer for a read operation, set DQ, reset BY, and generate an interrupt. The host may then read up to 512 bytes of data from the buffer.

2.2.11 WRITE BUFFER COMMAND

The write buffer command allows the host to overwrite the contents of the controller's sector buffer with any data pattern desired. When this command is issued, the controller will set BY, set up the sector buffer for a write operation, set DQ, reset BY, and generate an interrupt. The host may then write up to 512 bytes of data to the buffer.

We claim:

1. A disk drive controller for transferring information between a host computer and at least one disk drive, power to the controller being provided from an external source, the controller comprising:

means for receiving data from the host computer to be written to a disk drive;

semiconductor memory means for storing said received data prior to transfer to a disk drive, wherein said semiconductor memory means is organized in a mirror configuration and said received data is stored in both portions of said mirror configuration;

battery means;

means connected to said battery means and said semiconductor memory means for providing power to said semiconductor memory means from said battery means when power is not being provided to the controller;

means for transferring said received data to said semiconductor memory means;

means for transferring said received data from said semiconductor memory means to a disk drive;

means coupled to said battery power providing means to disable providing of power to said semiconductor memory means when power is not being provided to the controller and data is not present in said semiconductor memory means; and wherein said disabling providing power means selectively disables providing power.

2. The controller of claim 1, wherein said semiconductor memory means further contains parity information and wherein said means for transferring from said memory means to a disk drive includes means for indicating the presence of a parity error when transferring data from said semiconductor memory means and transferring data from said mirror portion after receiving said parity error indication.

3. The controller of claim 1, wherein said semiconductor memory means has an interface similar to the interface of the disk drives.

4. The controller of claim 3, wherein the disk drives are arranged in a disk drive array, and are connected to a disk drive bus, said semiconductor memory means additionally being connected to said disk drive bus.

5. The controller of claim 4, further comprising:

buffer memory for storing data to be transferred to or transferred from said disk drive bus;

means coupled to said buffer memory for transferring data between said disk drive bus and other locations, and wherein said means for transferring said received data to said semiconductor memory means and said means for transferring said received data from said semiconductor memory means to a disk drive utilize said buffer memory and said buffer memory data transfer means in performing transfers.

6. The controller of claim 1, wherein said disabling providing power means is connected to said battery means and disables providing power when said battery means voltage is below a predetermined level.

7. The controller of claim 6, wherein said disabling providing power means further selectively disables providing power.

* * * * *